US011693625B2

(12) United States Patent
Ware et al.

(10) Patent No.: US 11,693,625 B2
(45) Date of Patent: Jul. 4, 2023

(54) LOGARITHMIC ADDITION-ACCUMULATOR CIRCUITRY, PROCESSING PIPELINE INCLUDING SAME, AND METHODS OF OPERATION

(71) Applicant: Flex Logix Technologies, Inc., Mountain View, CA (US)

(72) Inventors: Frederick A. Ware, Los Altos Hills, CA (US); Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 4 days.

(21) Appl. No.: 17/092,175

(22) Filed: Nov. 6, 2020

(65) Prior Publication Data

US 2021/0173617 A1 Jun. 10, 2021

Related U.S. Application Data

(60) Provisional application No. 62/943,336, filed on Dec. 4, 2019.

(51) Int. Cl.
*G06F 7/483* (2006.01)
*G06F 7/523* (2006.01)
(Continued)

(52) U.S. Cl.
CPC ............ *G06F 7/485* (2013.01); *G06F 7/4833* (2013.01); *G06F 7/5057* (2013.01);
(Continued)

(58) Field of Classification Search
CPC ..... G06F 7/4833; G06F 7/5235; G06F 7/5443
See application file for complete search history.

(56) References Cited

U.S. PATENT DOCUMENTS 4,958,312 A 9/1990 Ang et al.
5,197,024 A 3/1993 Pickett
(Continued)

FOREIGN PATENT DOCUMENTS

EP 0405726 3/1999
EP 2280341 6/2013
WO WO 2018/126073 7/2018

OTHER PUBLICATIONS

Agrawal et al., "A 7nm 4-Core AI Chip with 25.6TFLOPS Hybrid FP8 Training, 102.4TOPS INT4 Inference and Workload-Aware Throttling", ISSCC, pp. 144-145, 2021.
(Continued)

*Primary Examiner* — Matthew D Sandifer
(74) *Attorney, Agent, or Firm* — Charles Shemwell

(57) ABSTRACT

An integrated circuit including a plurality of logarithmic addition-accumulator circuits, connected in series, to, in operation, perform logarithmic addition and accumulate operations, wherein each logarithmic addition-accumulator circuit includes: (i) a logarithmic addition circuit to add a first input data and a filter weight data, each having the logarithmic data format, and to generate and output first sum data having a logarithmic data format, and (ii) an accumulator, coupled to the logarithmic addition circuit of the associated logarithmic addition-accumulator circuit, to add a second input data and the first sum data output by the associated logarithmic addition circuit to generate first accumulation data. The integrated circuit may further include first data format conversion circuitry, coupled to the output of each logarithmic addition circuit, to convert the data format of the first sum data to a floating point data format wherein the accumulator may be a floating point type.

21 Claims, 34 Drawing Sheets

(51) Int. Cl.
  *G06F 7/544* (2006.01)
  *G06F 7/485* (2006.01)
  *H03M 7/24* (2006.01)
  *G06F 7/505* (2006.01)

(52) U.S. Cl.
  CPC .......... *G06F 7/5235* (2013.01); *G06F 7/5443* (2013.01); *H03M 7/24* (2013.01)

(56) References Cited

U.S. PATENT DOCUMENTS

| | | | |
|---|---|---|---|
| 5,337,266 A | | 8/1994 | Arnold |
| 5,933,360 A | * | 8/1999 | Larson .................. G06F 7/4833 708/512 |
| 6,115,729 A | | 9/2000 | Matheny et al. |
| 6,148,101 A | | 11/2000 | Tanaka et al. |
| 6,298,366 B1 | | 10/2001 | Gatherer et al. |
| 7,107,305 B2 | | 9/2006 | Deng et al. |
| 7,299,342 B2 | | 11/2007 | Nilsson et al. |
| 7,346,644 B1 | | 3/2008 | Langhammer et al. |
| 7,698,358 B1 | | 4/2010 | Langhammer et al. |
| 8,051,124 B2 | | 11/2011 | Salama et al. |
| 8,645,450 B1 | | 2/2014 | Choe et al. |
| 8,751,551 B2 | | 6/2014 | Streicher et al. |
| 8,788,562 B2 | | 7/2014 | Langhammer et al. |
| 11,169,782 B2 | * | 11/2021 | Lopich .................. G06F 7/4833 |
| 2003/0172101 A1 | | 9/2003 | Liao et al. |
| 2005/0273483 A1 | | 12/2005 | Dent |
| 2007/0239967 A1 | | 10/2007 | Dally et al. |
| 2008/0211827 A1 | | 9/2008 | Donovan et al. |
| 2009/0094303 A1 | | 4/2009 | Katayama |
| 2014/0019727 A1 | | 1/2014 | Zhu et al. |
| 2017/0011288 A1 | | 1/2017 | Brothers et al. |
| 2017/0115958 A1 | | 4/2017 | Langhammer |
| 2017/0116693 A1 | | 4/2017 | Rae et al. |
| 2017/0180178 A1 | | 6/2017 | Gollakota et al. |
| 2017/0214929 A1 | | 7/2017 | Susnow et al. |
| 2017/0322813 A1 | | 11/2017 | Langhammer |
| 2017/0344876 A1 | | 11/2017 | Brothers |
| 2018/0052661 A1 | | 2/2018 | Langhammer |
| 2018/0081632 A1 | | 3/2018 | Langhammer |
| 2018/0081633 A1 | | 3/2018 | Langhammer |
| 2018/0189651 A1 | | 7/2018 | Henry |
| 2018/0300105 A1 | | 10/2018 | Langhammer |
| 2018/0321909 A1 | | 11/2018 | Langhammer |
| 2018/0321910 A1 | | 11/2018 | Langhammer et al. |
| 2018/0341460 A1 | | 11/2018 | Langhammer |
| 2018/0341461 A1 | | 11/2018 | Langhammer |
| 2019/0042191 A1 | | 2/2019 | Langhammer |
| 2019/0079728 A1 | | 3/2019 | Langhammer et al. |
| 2019/0196786 A1 | | 6/2019 | Langhammer |
| 2019/0243610 A1 | | 8/2019 | Lin et al. |
| 2019/0250886 A1 | | 8/2019 | Langhammer |
| 2019/0286417 A1 | | 9/2019 | Langhammer |
| 2019/0310828 A1 | | 10/2019 | Langhammer et al. |
| 2019/0324722 A1 | | 10/2019 | Langhammer |
| 2020/0004506 A1 | | 1/2020 | Langhammer et al. |
| 2020/0026493 A1 | | 1/2020 | Streicher et al. |
| 2020/0125330 A1 | * | 4/2020 | Johnson ................ G06F 7/5443 |
| 2020/0174750 A1 | | 6/2020 | Langhammer |
| 2020/0326948 A1 | | 10/2020 | Langhammer |

OTHER PUBLICATIONS

Linley Gwennap, "IBM Demonstrates New AI Data Types", Microprocessor Report, Apr. 2021.

Choi et al., "Accurate and Efficient 2-Bit Quantized Neural Networks", Proceedings of $2^{nd}$ SysML Conf, 2019, 12 pages.

Sun et al., "Hybrid 8-bit Floating Point (HFP8) Training and Inference for Deep Neural Networks", NeurIPS 2019, 10 pages.

"nVidia A100 Tensor Core GPU Architecture", v1.0, 2020, 82 pages.

Papadantonakis et al., "Pipelining Saturated Accumulation", IEEE, vol. 58, No. 2, pp. 208-219, Feb. 2009.

Priyanka Nain, "Multiplier-Accumulator (MAC) Unit", IJDACR, vol. 5, Issue 3, Oct. 2016, 4 pages.

Jebashini et al., "A Survey and Comparative Analysis of Multiply-Accumulate (MAC) Block for Digital Signal Processing Application on ASIC and FPGA", Journal of Applied Science, vol. 15, Issue 7, pp. 934-946, Jul. 2015.

International Search Report and Written Opinion of International Searching Authority re: re: PCT/US2020/061689, dated Mar. 30, 2021, 10 pages.

* cited by examiner

FIG. 1C
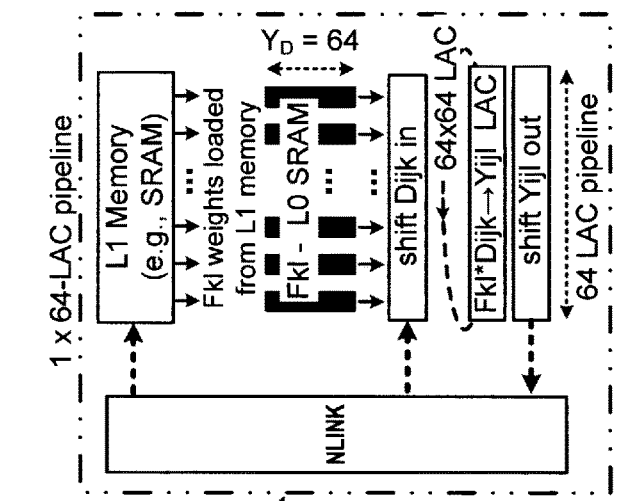
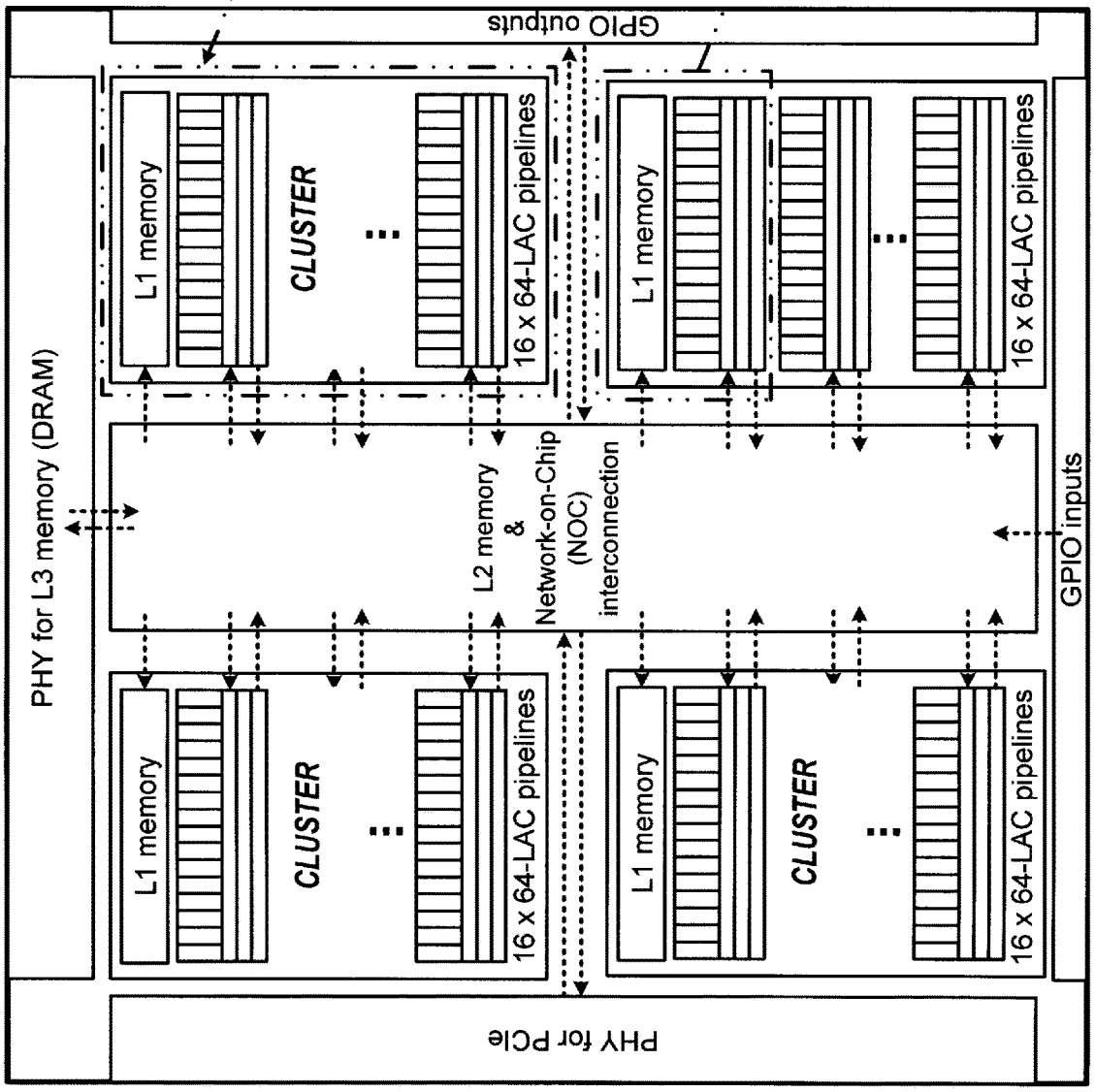

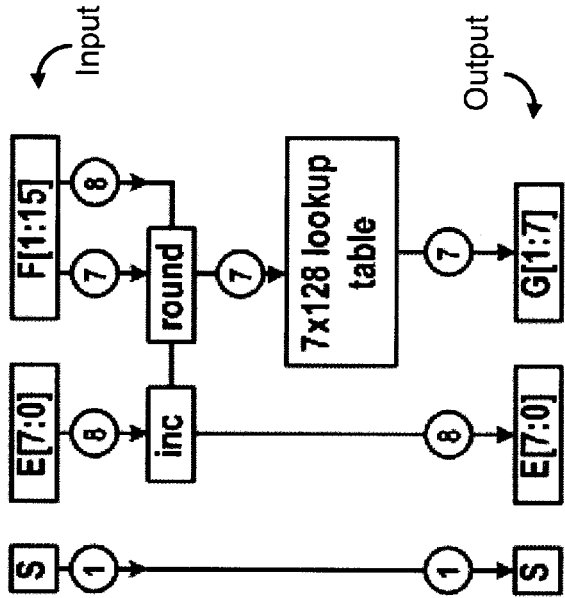
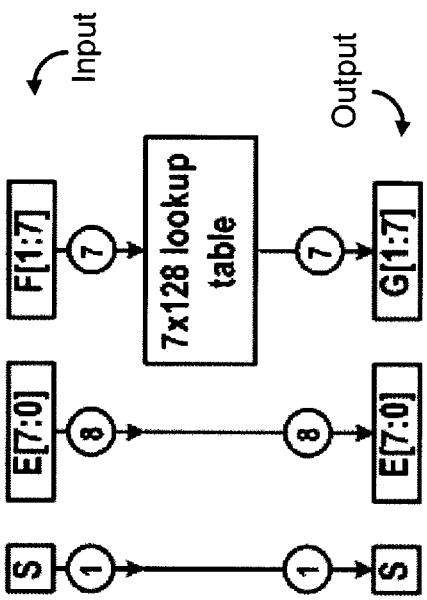
FIG. 2B
FIG. 2A

FIG. 5C

Check-EA-EB – Logic 1

EAMIN = NOR (EA[7], EA[6], EA[5], EA[4], EA[3], EA[2], EA[1], EA[0])
EAMAX = AND (EA[7], EA[6], EA[5], EA[4], EA[3], EA[2], EA[1], EA[0])
EBMIN = NOR (EB[7], EB[6], EB[5], EB[4], EB[3], EB[2], EB[1], EB[0])
EBMAX = AND (EB[7], EB[6], EB[5], EB[4], EB[3], EB[2], EB[1], EB[0])

Check-MA-MB – Logic 2

GAMIN = NOR (GA[1], GA[2], GA[3], GA[4], GA[5], GA[7])
GBMIN = NOR (GB[1], GB[2], GB[3], GB[4], GB[5], GB[7])

Logic 3

AZRO = AND(EAMIN,GAMIN)               BZRO = AND(EBMIN,GBMIN)                DNAN1 = AND ( ANAN, NOT(BNAN) )
ANRM = NOR(AZRO,EAMAX)                BNRM = NOR(BZRO,EBMAX)                 DNAN2 = AND ( BNAN, NOT(ANAN) )
AINF = AND(EAMAX,GAMIN)               BINF = AND(EBMAX,GBMIN)                DNAN3 = OR ( AND( AINF, BZRO), AND( BINF, AZRO) )
ANAN = AND(EAMAX,NOT(GAMIN))          BNAN = AND(EBMAX,NOT(GBMIN))           DNAN4 = AND ( ANAN, BNAN)

DZRO = OR( AND(AZRO, BZRO), AND(AZRO, BNRM), AND(ANRM, BZRO), AND(ANRM, BNRM, EUNFL))
DINF = OR ( AND( AINF, BNRM), AND( BINF, ANRM), AND( AINF, BINF),   AND( ANRM, BNRM, EOVFL) )
DNAN = OR ( DNAN1, DNAN2, DNAN3, DNAN4 )
DNRM = NOR( DZRO, DINF, DNAN)

MABS  = DNAN2                          SK  = OR ( AND( SA, DNAN1),
EK  = OR( DINF, DNAN)                 MK    = OR( DNAN3, DNAN4)                          AND( SB, DNAN2) )
EKS = OR( DZRO, DINF, DNAN)           MKS   = OR( DZRO, DINF, DNAN3, DNAN4)  SKS = OR( DNAN1, DNAN2, DNAN4)
                                      MABKS = OR( DZRO, DINF, DNAN )

EMIN   = NOR (ES0[7], ES0[6], ES0[5], ES0[4], ES0[3], ES0[2], ES0[1], ES0[0])
EMAXM1 = AND (ES0[7], ES0[6], ES0[5], ES0[3], ES0[2], ES0[1], NOT(ES0[0]))

EOVFL = OR ( AND( COUTB, COUT0),
             AND( XOR( COUTB, COUT0), COUT1),
             AND( XOR( COUTB, COUT0), EMAXM1, GQQge2) )

EUNFL = OR ( NOR( COUTB, COUT0),
             AND( XOR( COUTB, COUT0), EMIN, NOT(GQQge2)) )

Note – may adjust EUNFL threshold to include extra binade

Logarithmic format number space – LL16 example

Positive space

| S | E[7:0] | G[1:7] | | Value |
|---|---|---|---|---|
| 0 | 1111 1111 | not 0000000 | NAN (not-a-number) | |
| 0 | 1111 1111 | 0000000 | INF (+ infinity) | |
| 0 | 1111 1110 | 1111111 | NRM (+ max) | $+2^{(127/128)} * 2^{254-127}$ |
| 0 | 1111 1110 | 1111110 | NRM | $+2^{(126/128)} * 2^{254-127}$ |
| 0 | ... | ... | ... | ... |
| 0 | 0111 1111 | 0000001 | NRM | $+2^{(001/128)} * 2^{127-127}$ |
| 0 | 0111 1111 | 0000000 | NRM (+ 1.0) | $+2^{(000/128)} * 2^{127-127}$ |
| 0 | 0111 1110 | 1111111 | NRM | $+2^{(127/128)} * 2^{126-127}$ |
| 0 | ... | ... | ... | ... |
| 0 | 0000 0001 | 0000001 | NRM | $+2^{(001/128)} * 2^{001-127}$ |
| 0 | 0000 0001 | 0000000 | NRM | $+2^{(000/128)} * 2^{001-127}$ |
| 0 | 0000 0000 | 1111111 | NRM | $+2^{(127/128)} * 2^{000-127}$ |
| 0 | 0000 0000 | ... | ... | ... |
| 0 | 0000 0000 | 0000010 | NRM | $+2^{(002/128)} * 2^{000-127}$ |
| 0 | 0000 0000 | 0000001 | NRM (+ min) | $+2^{(001/128)} * 2^{000-127}$ |
| 0 | 0000 0000 | 0000000 | ZRO (+ 0.0) | |

Negative space

| S | E[7:0] | G[1:7] | | Value |
|---|---|---|---|---|
| 1 | 0000 0000 | 0000000 | ZRO (- 0.0) | |
| 1 | 0000 0000 | 0000001 | NRM (- min) | $(-1) * 2^{(001/128)} * 2^{000-127}$ |
| 1 | 0000 0000 | 0000010 | NRM | $(-1) * 2^{(002/128)} * 2^{000-127}$ |
| 1 | ... | ... | ... | ... |
| 1 | 0000 0000 | 1111110 | NRM | $(-1) * 2^{(126/128)} * 2^{000-127}$ |
| 1 | 0000 0000 | 1111111 | NRM | $(-1) * 2^{(127/128)} * 2^{000-127}$ |
| 1 | 0000 0001 | 0000000 | NRM | $(-1) * 2^{(000/128)} * 2^{001-127}$ |
| 1 | 0000 0001 | 0000001 | NRM | $(-1) * 2^{(001/128)} * 2^{001-127}$ |
| 1 | ... | ... | ... | ... |
| 1 | 0111 1110 | 1111111 | NRM | $(-1) * 2^{(127/128)} * 2^{126-127}$ |
| 1 | 0111 1111 | 0000000 | NRM (- 1.0) | $(-1) * 2^{(000/128)} * 2^{127-127}$ |
| 1 | 0111 1111 | 0000001 | NRM | $(-1) * 2^{(001/128)} * 2^{127-127}$ |
| 1 | ... | ... | ... | ... |
| 1 | 1111 1110 | 1111110 | NRM | $(-1) * 2^{(126/128)} * 2^{254-127}$ |
| 1 | 1111 1110 | 1111111 | NRM (- max) | $(-1) * 2^{(127/128)} * 2^{254-127}$ |
| 1 | 1111 1111 | 0000000 | INF (- infinity) | |
| 1 | 1111 1111 | not 0000000 | NAN (not-a-number) | |

| example numeric format | sign | exponent E E E | fraction G G G G | $(-1)^S * 2^{(E-Ek)} * 2^{(F/16)}$ | special value | $(-1)^S * 2^{(E-4)} * 2^{(G/16)}$ | |
|---|---|---|---|---|---|---|---|
| ZERO | 0 | 0 0 0 | 0 0 0 0 | | ZERO | | |
| $(-1)^S * 2^{(E-12)}$ | 0 | 0 0 0 | 0 0 0 1 | 0.000488 | | 0 1 0 0 0 0 0 0 | 0.250000 |
| same as above | 0 | 0 0 0 | 0 0 1 0 | 0.000977 | | 0 1 0 0 0 0 0 1 | 0.261068 |
| same as above | 0 | 0 0 0 | 0 0 1 1 | 0.001953 | | 0 1 0 0 0 0 1 0 | 0.272627 |
| $(-1)^S * 2^{(E-10)} * 2^{(G/2)}$ | 0 | 0 0 0 | 0 1 0 0 | 0.003906 | | 0 1 0 0 0 0 1 1 | 0.284697 |
| same as above | 0 | 0 0 0 | 0 1 0 1 | 0.005524 | | 0 1 0 0 0 1 0 0 | 0.297302 |
| same as above | 0 | 0 0 0 | 0 1 1 0 | 0.007813 | | 0 1 0 0 0 1 0 1 | 0.310464 |
| same as above | 0 | 0 0 0 | 0 1 1 1 | 0.011049 | | 0 1 0 0 0 1 1 0 | 0.324210 |
| $(-1)^S * 2^{(E-8)} * 2^{(G/4)}$ | 0 | 0 0 0 | 1 0 0 0 | 0.015625 | | 0 1 0 0 0 1 1 1 | 0.338564 |
| same as above | 0 | 0 0 0 | 1 0 0 1 | 0.018581 | | 0 1 0 0 1 0 0 0 | 0.353553 |
| same as above | 0 | 0 0 0 | 1 0 1 0 | 0.022097 | | 0 1 0 0 1 0 0 1 | 0.369207 |
| same as above | 0 | 0 0 0 | 1 0 1 1 | 0.026278 | | 0 1 0 0 1 0 1 0 | 0.385553 |
| same as above | 0 | 0 0 0 | 1 1 0 0 | 0.031250 | | 0 1 0 0 1 0 1 1 | 0.402623 |
| same as above | 0 | 0 0 0 | 1 1 0 1 | 0.037163 | | 0 1 0 0 1 1 0 0 | 0.420448 |
| same as above | 0 | 0 0 0 | 1 1 1 0 | 0.044194 | | 0 1 0 0 1 1 0 1 | 0.439063 |
| same as above | 0 | 0 0 0 | 1 1 1 1 | 0.052556 | | 0 1 0 0 1 1 1 0 | 0.458502 |
| $(-1)^S * 2^{(E-6)} * 2^{(G/8)}$ | 0 | 0 0 1 | 0 0 0 0 | 0.062500 | | 0 1 0 0 1 1 1 1 | 0.478802 |
| same as above | 0 | 0 0 1 | 0 0 0 1 | 0.068157 | | 0 1 0 1 0 0 0 0 | 0.500000 |
| same as above | 0 | 0 0 1 | 0 0 1 0 | 0.074325 | | 0 1 0 1 0 0 0 1 | 0.522137 |
| same as above | 0 | 0 0 1 | 0 0 1 1 | 0.081052 | | 0 1 0 1 0 0 1 0 | 0.545254 |
| same as above | 0 | 0 0 1 | 0 1 0 0 | 0.088388 | | 0 1 0 1 0 0 1 1 | 0.569394 |
| same as above | 0 | 0 0 1 | 0 1 0 1 | 0.096388 | | 0 1 0 1 0 1 0 0 | 0.594604 |
| same as above | 0 | 0 0 1 | 0 1 1 0 | 0.105112 | | 0 1 0 1 0 1 0 1 | 0.620929 |
| same as above | 0 | 0 0 1 | 0 1 1 1 | 0.114628 | | 0 1 0 1 0 1 1 0 | 0.648420 |
| same as above | 0 | 0 0 1 | 1 0 0 0 | 0.125000 | | 0 1 0 1 0 1 1 1 | 0.677128 |
| same as above | 0 | 0 0 1 | 1 0 0 1 | 0.136313 | | 0 1 0 1 1 0 0 0 | 0.707107 |
| same as above | 0 | 0 0 1 | 1 0 1 0 | 0.148651 | | 0 1 0 1 1 0 0 1 | 0.738413 |
| same as above | 0 | 0 0 1 | 1 0 1 1 | 0.162105 | | 0 1 0 1 1 0 1 0 | 0.771105 |
| same as above | 0 | 0 0 1 | 1 1 0 0 | 0.176777 | | 0 1 0 1 1 0 1 1 | 0.805245 |
| same as above | 0 | 0 0 1 | 1 1 0 1 | 0.192776 | | 0 1 0 1 1 1 0 0 | 0.840896 |
| same as above | 0 | 0 0 1 | 1 1 1 0 | 0.210224 | | 0 1 0 1 1 1 0 1 | 0.878126 |
| same as above | 0 | 0 0 1 | 1 1 1 1 | 0.229251 | | 0 1 0 1 1 1 1 0 | 0.917004 |
| | | | | | | 0 1 0 1 1 1 1 1 | 0.957603 | example numeric format
21 binades of range
4b precision (max)

| special value | | | | (-1)^S * 2^(E-4) * 2^(G/16) | NAN | special value | | | | (-1)^S * 2^(E-10) * 2^(G/8) | ±INF |
|---|---|---|---|---|---|---|---|---|---|---|---|
| 1 | 0 | 0 | 0 | | 1.000000 | 1 | 0 | 0 | 0 | 4.000000 | (-1)^S * 2^(E-10) * 2^(G/8) |
| 1 | 0 | 0 | 1 | | 1.044274 | 1 | 0 | 0 | 1 | 4.362031 | same as above |
| 1 | 0 | 1 | 0 | | 1.090508 | 1 | 0 | 1 | 0 | 4.756828 | same as above |
| 1 | 0 | 1 | 1 | | 1.138789 | 1 | 0 | 1 | 1 | 5.187358 | same as above |
| 1 | 1 | 0 | 0 | | 1.189207 | 1 | 1 | 0 | 0 | 5.656854 | same as above |
| 1 | 1 | 0 | 1 | | 1.241858 | 1 | 1 | 0 | 1 | 6.168843 | same as above |
| 1 | 1 | 1 | 0 | | 1.296840 | 1 | 1 | 1 | 0 | 6.727171 | same as above |
| 1 | 1 | 1 | 1 | | 1.354256 | 1 | 1 | 1 | 1 | 7.336032 | same as above |
| 1 | 0 | 0 | 0 | | 1.414214 | 1 | 0 | 0 | 0 | 8.000000 | same as above |
| 1 | 0 | 0 | 1 | | 1.476826 | 1 | 0 | 0 | 1 | 8.724062 | same as above |
| 1 | 0 | 1 | 0 | | 1.542211 | 1 | 0 | 1 | 0 | 9.513657 | same as above |
| 1 | 0 | 1 | 1 | | 1.610490 | 1 | 0 | 1 | 1 | 10.374716 | same as above |
| 1 | 1 | 0 | 0 | | 1.681793 | 1 | 1 | 0 | 0 | 11.313708 | same as above |
| 1 | 1 | 0 | 1 | | 1.756252 | 1 | 1 | 0 | 1 | 12.337687 | same as above |
| 1 | 1 | 1 | 0 | | 1.834008 | 1 | 1 | 1 | 0 | 13.454343 | same as above |
| 1 | 1 | 1 | 1 | | 1.915207 | 1 | 1 | 1 | 1 | 14.672065 | same as above |
| 1 | 0 | 0 | 0 | | 2.000000 | 1 | 0 | 0 | 0 | 16.0000 | (-1)^S * 2^(E-24) * 2^(G/4) |
| 1 | 0 | 0 | 1 | | 2.088548 | 1 | 0 | 0 | 1 | 19.0273 | same as above |
| 1 | 0 | 1 | 0 | | 2.181015 | 1 | 0 | 1 | 0 | 22.6274 | same as above |
| 1 | 0 | 1 | 1 | | 2.277577 | 1 | 0 | 1 | 1 | 26.9087 | same as above |
| 1 | 1 | 0 | 0 | | 2.378414 | 1 | 1 | 0 | 0 | 32.0000 | same as above |
| 1 | 1 | 0 | 1 | | 2.483716 | 1 | 1 | 0 | 1 | 38.0546 | same as above |
| 1 | 1 | 1 | 0 | | 2.593679 | 1 | 1 | 1 | 0 | 45.2548 | same as above |
| 1 | 1 | 1 | 1 | | 2.708511 | 1 | 1 | 1 | 1 | 53.8174 | same as above |
| 1 | 0 | 0 | 0 | | 2.828427 | 1 | 0 | 0 | 0 | 64.0000 | (-1)^S * 2^(E-54) * 2^(G/2) |
| 1 | 0 | 0 | 1 | | 2.953652 | 1 | 0 | 0 | 1 | 90.5097 | same as above |
| 1 | 0 | 1 | 0 | | 3.084422 | 1 | 0 | 1 | 0 | 128.0000 | same as above |
| 1 | 0 | 1 | 1 | | 3.220961 | 1 | 0 | 1 | 1 | 181.0193 | same as above |
| 1 | 1 | 0 | 0 | | 3.363586 | 1 | 1 | 0 | 0 | 256.0000 | (-1)^S * 2^(E-116) |
| 1 | 1 | 0 | 1 | | 3.512504 | 1 | 1 | 0 | 1 | 512.0000 | same as above |
| 1 | 1 | 1 | 0 | | 3.668016 | 1 | 1 | 1 | 0 | 1024.0000 | same as above |
| 1 | 1 | 1 | 1 | | 3.830413 | 1 | 1 | 1 | 1 | | ±INF |

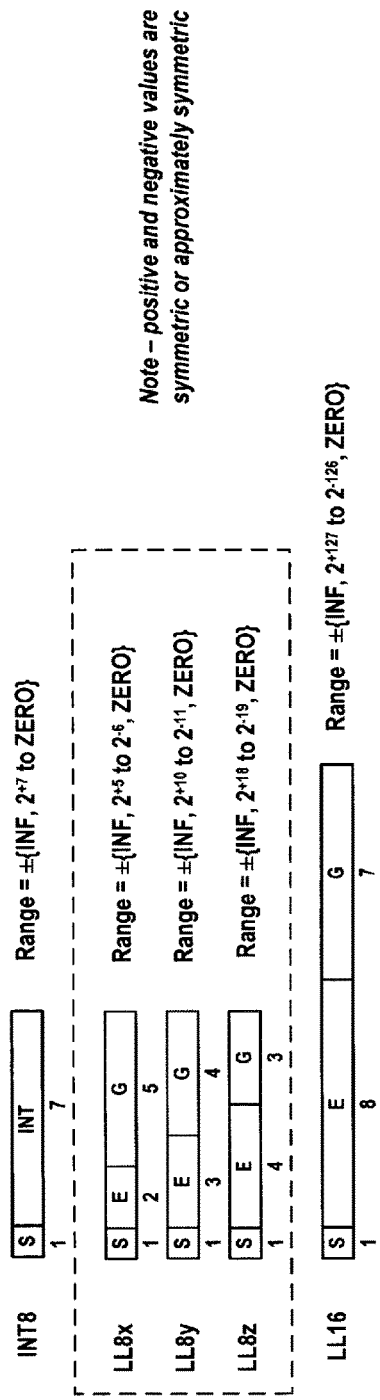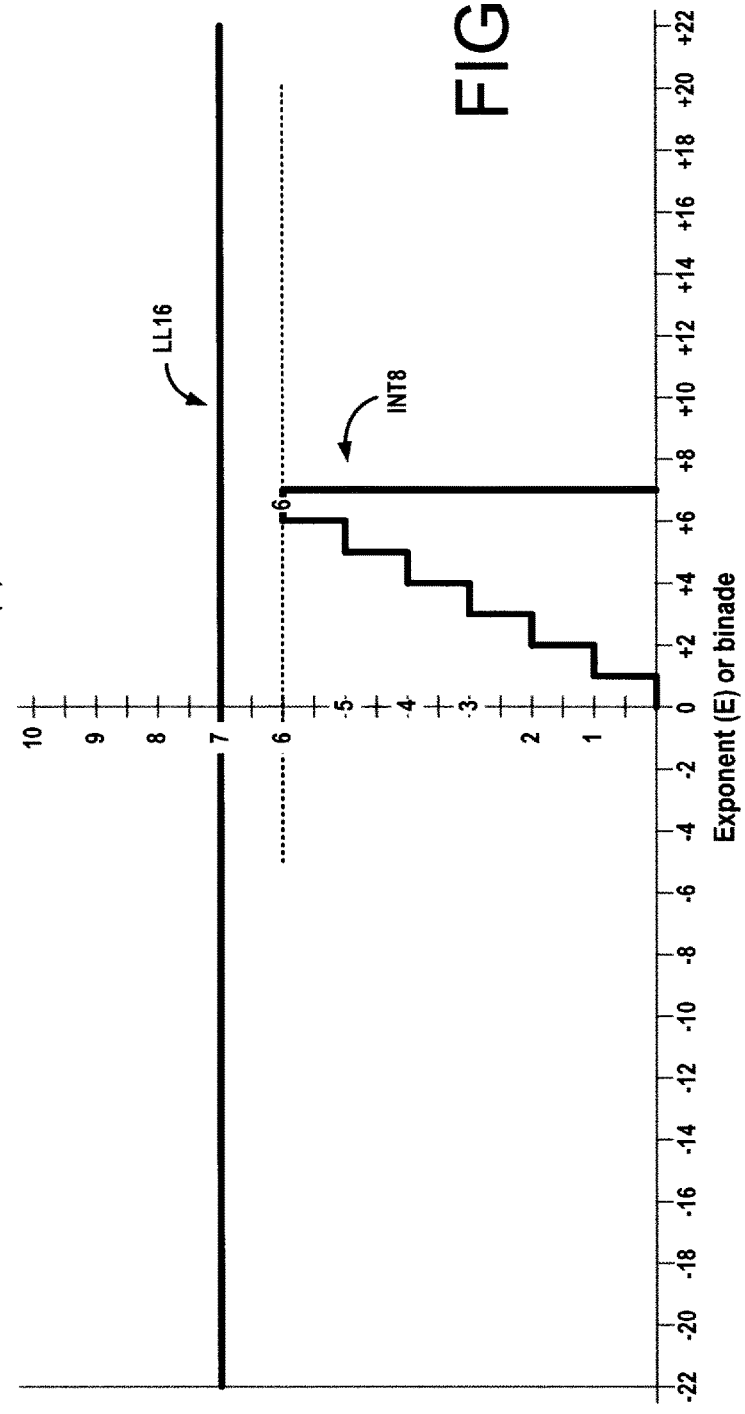
FIG. 10B

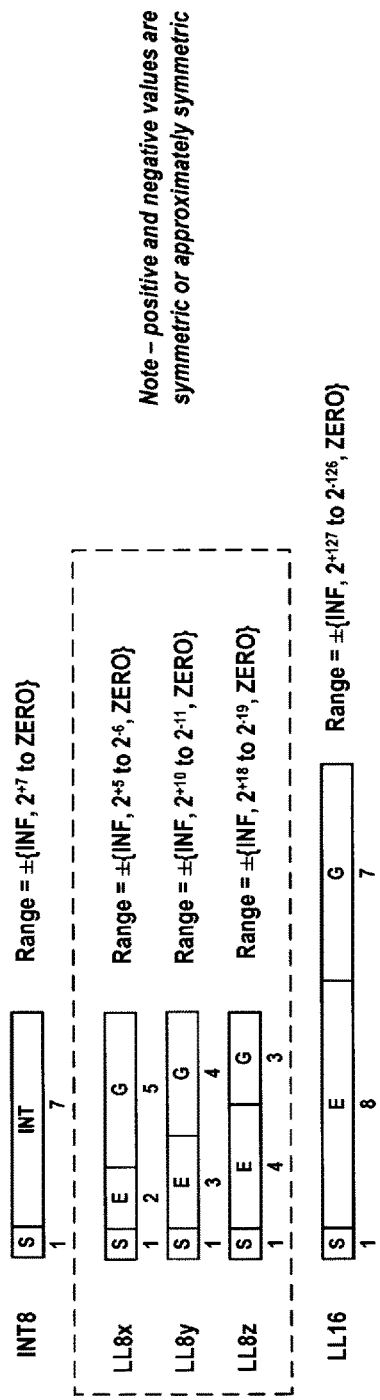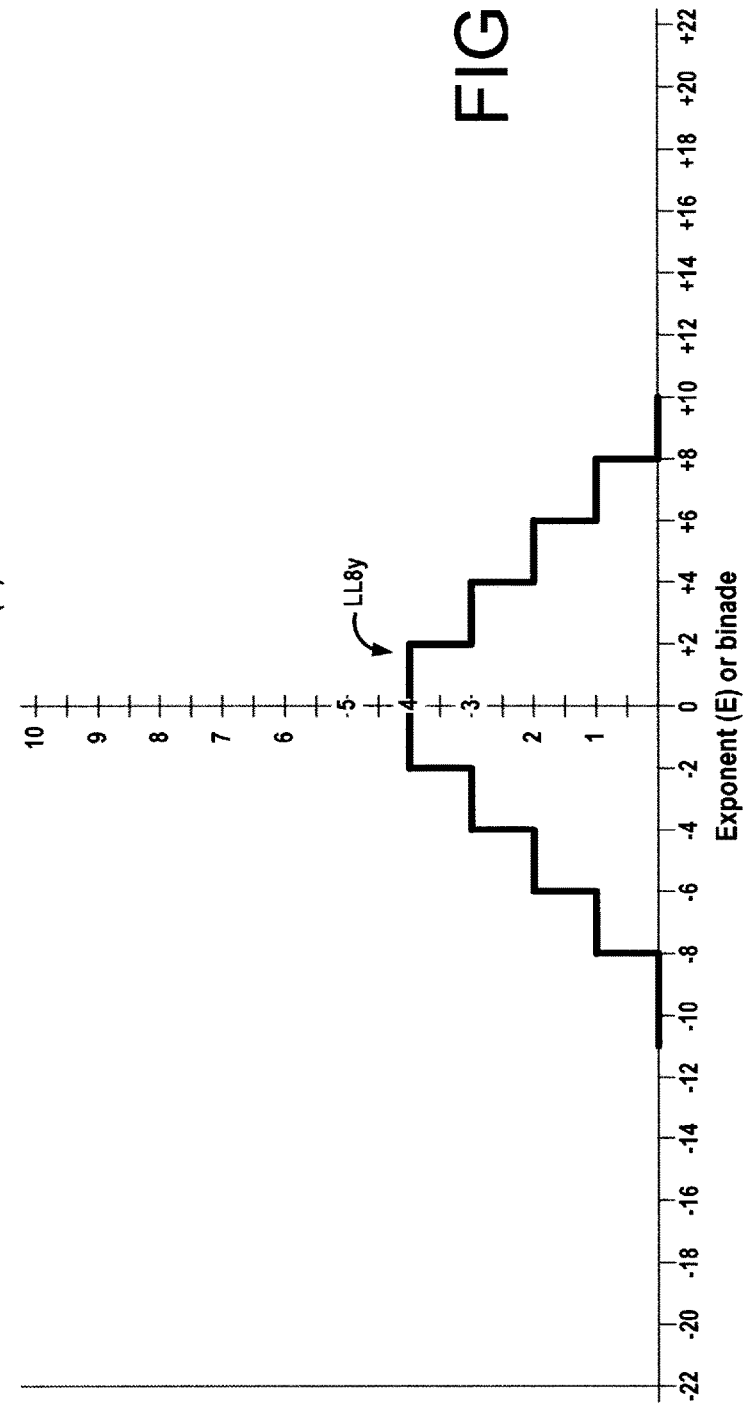
FIG. 10D

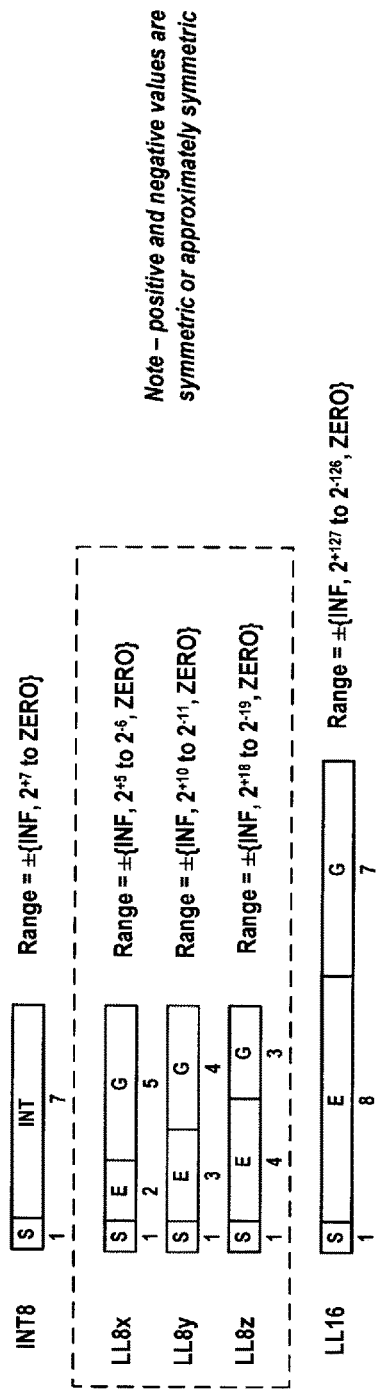
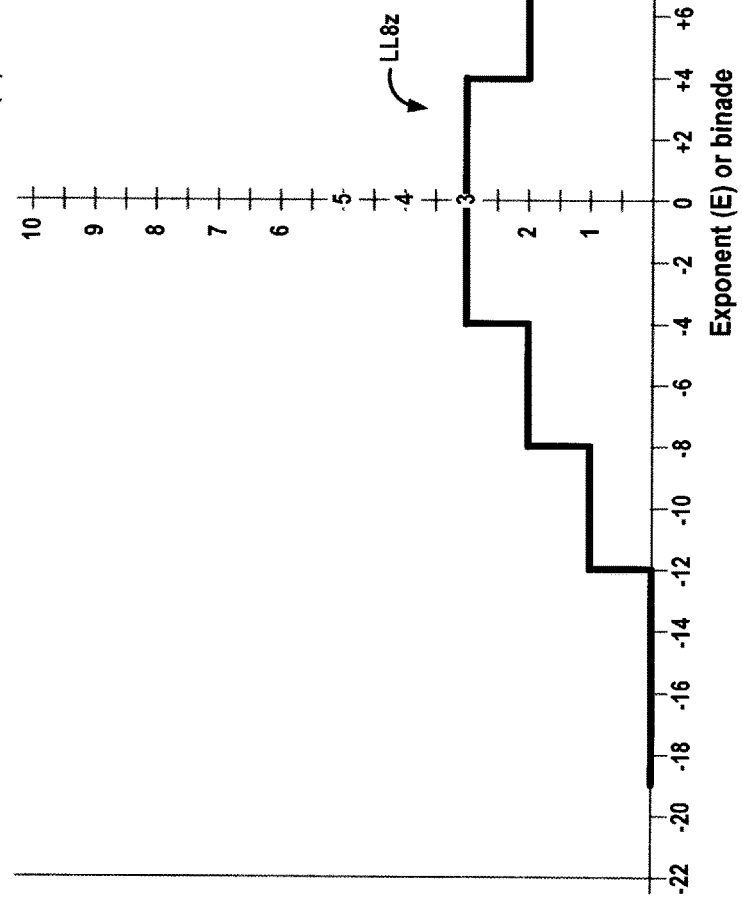
FIG. 10E

LOGARITHMIC ADDITION-ACCUMULATOR CIRCUITRY, PROCESSING PIPELINE INCLUDING SAME, AND METHODS OF OPERATION

RELATED APPLICATION

This non-provisional application claims priority to and the benefit of U.S. Provisional Patent Application No. 62/943,336, entitled "Logarithmic Addition-Accumulator Circuitry, Processing Pipeline including Same and Method of Operating Same", filed Dec. 4, 2019. The '336 provisional application is hereby incorporated herein by reference in its entirety.

INTRODUCTION

There are many inventions described and illustrated herein. The present inventions are neither limited to any single aspect nor embodiment thereof, nor to any combinations and/or permutations of such aspects and/or embodiments. Importantly, each of the aspects of the present inventions, and/or embodiments thereof, may be employed alone or in combination with one or more of the other aspects of the present inventions and/or embodiments thereof. All combinations and permutations thereof are intended to fall within the scope of the present inventions.

In one aspect, the present inventions are directed to one or more integrated circuits having logarithmic addition-accumulator circuitry (and methods of operating such circuitry) wherein data (e.g., image data) is processed, at least partially, based a logarithmic data format, for example, in connection with inferencing operations. In one embodiment, the present inventions include a plurality of logarithmic addition-accumulator circuits (referred to herein, at times, as "LACs" or LAC circuits", and singly/individually as "LAC" or "LAC circuit") interconnected, for example, in series, to pipeline logarithmic addition and accumulate operations. In one embodiment, the present inventions include circuitry to convert or transform the input data/vales having a first or initial data format, for example, a floating point data format or a fixed point data format, to logarithmic data format (e.g., having a base 2), and partially processes the data, having the logarithmic data format, via logarithmic addition. In one embodiment, the conversion circuitry changes, transforms and/or converts the data format of the input data/values by remapping the value of the fraction field of each input data/value from floating point data format into the logarithm of the value thereof.

For example, in operation, the input data/values, in the logarithmic data format, are added to the image filter weights or coefficients, which are also in a logarithmic data format (e.g., having a base 2). The filter weights or coefficients, employed in the image data processing, may be stored in memory in a logarithmic data format or a format that is different from the logarithmic data format and converted or transformed to a logarithmic data format before processing (e.g., immediately before processing). In one embodiment, the conversion circuitry changes, transforms and/or converts the data format of the filter weights by remapping the value of the fraction field of each filter weight from floating point data format into the logarithm of the value of the faction field.

After logarithmic addition, the sum data may be converted or transformed to another/different data format (e.g., a floating point format or fixed point format—for example, back to the data format of the input data—however, the length of the value may be the same or different) for additional/subsequent processing. For example, the processed image data, in the logarithmic data format, may be converted or transformed to a floating point data format (i.e., a data format that is the same as the data format of the input data). Thereafter, the partially processed data, having a floating point data format, may be processed further to implement accumulate operations, for example, of image data processing in connection with inferencing operations. Notably, in one embodiment, the conversion circuitry changes, transforms and/or converts the data format of the sum data by remapping the value of the fraction field of each data/value from logarithmic data format to a floating point data format.

In another aspect, the present inventions are directed to one or more integrated circuits (and methods of operating such circuits) including a plurality of execution or processing pipelines, having logarithmic addition-accumulator circuitry (referred to, at times, as "logarithmic addition-accumulate circuitry"), that process data, based on a logarithmic data format to, for example, generate processed image data. For example, each execution or processing pipeline includes a plurality of logarithmic addition-accumulator circuits to process data, for example, as discussed above. In one embodiment, in operation, the image data (which may be in a floating point data format) is provided to plurality of execution or processing pipelines, each pipeline including a plurality of logarithmic addition-accumulator circuits. Here, the data (e.g., image data having a floating point or fixed point data format) are initially converted or transformed to a logarithmic data format (via format conversion circuitry), and thereafter the data are added to associated image filter weights or coefficients (which are in or have been transformed/converted into a logarithmic data format) via logarithmic addition/adder circuitry of plurality of logarithmic addition-accumulator circuitry. In one embodiment, the output of the logarithmic addition/adder circuitry (i.e., sum data) are applied or provided to format conversion circuitry to convert or transform the logarithmic data format of the sum/output from the logarithmic addition/adder circuitry to a different data format—for example, a data format that facilitates or is consistent with subsequent processing (e.g., floating point data format) of the processing circuitry. In this regard, the sum/output of the logarithmic addition-accumulator circuitry, in, for example, a floating point data format, may thereafter be further processed, via accumulator circuitry of plurality of logarithmic addition-accumulator circuitry, to implement accumulation operations of the processing circuitry. The accumulator circuitry accumulates a plurality of associated partially processed image data, for example, in connection with inferencing operations. Notably, plurality of execution or processing pipelines may function or operate concurrently.

The plurality of logarithmic addition-accumulator circuits may include a plurality of registers (including a plurality of shadow registers) to implement or facilitate the pipelining of the multiply and accumulate operations performed by the logarithmic addition-accumulator circuits to increase throughput of the logarithmic addition-accumulator execution or processing pipelines in connection with processing the input data (e.g., image data). Notably, the present inventions may employ one or more of the circuit architectures are described and illustrated in U.S. patent application Ser. No. 16/545,345 wherein the logarithmic addition circuit is a substitute for the multiplication circuits, or in addition thereto, in order to implement logarithmic addition circuitry as set forth herein. Implementing the logarithmic addition circuit as described and illustrated herein into such circuit architecture (including the plurality of registers (e.g., the shadow registers) facilitate concatenating the logarithmic addition and accumulate operations consistent with the present inventions. In this way, a plurality of logarithmic addition-accumulator circuits may be configured and/or re-configured to process data (e.g., image data) in a manner whereby the processing and operations are performed more rapidly and/or efficiently. The '345 application is incorporated by reference herein in their entirety.

In yet another aspect, the present inventions are directed to one or more integrated circuits having circuitry to implement logarithmic addition and accumulate operations as well as multiply and accumulate operations. Here, the one or more integrated circuits include logarithmic addition-accumulator circuitry to perform logarithmic addition and accumulate operations (e.g., as discussed herein) and multiplier-accumulator circuitry to perform multiply and accumulate operations (e.g., as discussed in detail below). One or more of the integrated circuits may include mode select circuitry to control (i.e., enable and/or disable) the operability and/or operation of the logarithmic addition-accumulator circuitry and the multiplier-accumulator circuitry to select the circuitry employed to processes the image data, for example, in connection with inferencing operations. In this regard, the mode select circuitry controls or determines the data processing, and circuitry employed therein, including logarithmic addition-accumulator circuitry or the multiplier-accumulator circuitry.

In one embodiment, mode select circuitry may be one-time programmable; in another embodiment, the mode select circuitry is a more than one-time programmable (i.e., multiple times). The mode select circuitry may be programmed, for example, in situ (i.e., during operation of the integrated circuit), at manufacture, and/or at or during power-up, start-up, initialization, re-initialization, configuration, re-configuration or the like. For example, the mode select circuitry may receive mode select signals from internal or external circuitry (i.e., external to the one or more integrated circuits—for example, a host computer/processor) including one or more data storage circuits (e.g., one or more memory cells, register, flip-flop, latch, block/array of memory), one or more input pins/conductors, a look-up table LUT (of any kind), a processor or controller and/or discrete control logic. The mode select circuitry, in response thereto, may employ such signal(s) to enable or disable selected processing circuitry (as the case may be) and thereby implement (e.g., in situ and/or at or during power-up, start-up, initialization, re-initialization, configuration, re-configuration or the like) one of the modes of processing (i.e., logarithmic addition and accumulate operations or multiply and accumulate operations).

Notably, where the processing circuitry include both logarithmic addition-accumulator circuitry and multiplier-accumulator circuitry, such circuitry may share one or more circuits and, as such, the circuitry of each may not be entirely separate and distinct. For example, the data path of the logarithmic addition-accumulator circuitry and the data path of the multiplier-accumulator circuitry may share the circuitry associated with the filter weights or coefficients and the circuitry that performs the aforementioned accumulate operations. Moreover, where a plurality of each circuitry is implemented in a plurality of execution or processing pipelines, having logarithmic addition-accumulator circuitry, that processes data having on a logarithmic data format, and multiplier-accumulator circuitry that processes data having on floating point or fixed point formats, the data paths may share most of the circuitry of the integrated circuit—except, for example, the data format conversion circuitry (i.e., circuitry to convert data to/from logarithmic data format), the logarithmic addition circuitry of the logarithmic addition-accumulator circuitry and the multiplication circuitry of the multiplier-accumulator circuitry. In this embodiment, such execution or processing pipelines may incorporate the logarithmic addition-accumulator circuitry or multiplier-accumulator circuitry to process image data, for example, in connection with inferencing operations.

The circuitry of the present inventions may be disposed on or in integrated circuit(s), for example, (i) a processor, controller, state machine, gate array, system-on-chip ("SOC"), programmable gate array ("PGA") and/or field programmable gate array ("FPGA"), and/or (ii) a processor, controller, state machine and SOC including an embedded FPGA, and/or (iii) an integrated circuit (e.g., processor, controller, state machine and SoC)—including an embedded processor, controller, state machine, and/or PGA. Indeed, the circuitry of the present inventions may be disposed on or in integrated circuit(s) dedicated exclusively to such circuitry.

BRIEF DESCRIPTION OF THE DRAWINGS

The present inventions may be implemented in connection with embodiments illustrated in the drawings hereof. These drawings show different aspects of the present inventions and, where appropriate, reference numerals, nomenclature, or names illustrating like circuits, architectures, structures, components, materials and/or circuits in different figures are labeled similarly. It is understood that various combinations of the structures, components, materials and/or circuits, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

Notably, the configurations, block/data width, data path width, bandwidths, data lengths, values, processes, pseudo-code, operations, and/or algorithms described herein and/or illustrated in the FIGURES, and text associated therewith, are exemplary. Indeed, the inventions are not limited to any particular or exemplary circuit, logical, block, functional and/or physical diagrams, number of multiplier-accumulator circuits employed in an execution pipeline, number of execution pipelines employed in a particular processing configuration, organization/allocation of memory, block/data width, data path width, bandwidths, values, processes, pseudo-code, operations, and/or algorithms illustrated and/or described in accordance with, for example, the exemplary circuit, logical, block, functional and/or physical diagrams. Indeed, although several of the exemplary embodiments and features of the inventions are illustrated in the context of floating point data format (e.g., FP16 or FP24) and logarithmic data format (e.g., LL8 or LL16), the embodiments and inventions are applicable of other precisions (e.g., FPxx where: 8≤xx≤39), and LLxx where: 8≤xx≤24). For the sake of brevity, precisions other than those illustrated and/or described herein are intended to fall within the scope of the present inventions and will be quite clear to one skilled in the art based on, for example, this application Moreover, although the illustrative/exemplary embodiments include a plurality of memories (e.g., L3 memory, L2 memory, L1 memory, L0 memory) which are assigned, allocated and/or used to store certain data and/or in certain organizations, one or more of memories may be added, and/or one or more memories may be omitted and/or combined/consolidated—for example, the L3 memory or L2 memory, and/or the organizations may be changed, supplemented and/or modified. The inventions are not limited to the illustrative/exemplary embodiments of the memory organization and/or allocation set forth in the application. Again, the inventions are not limited to the illustrative/exemplary embodiments set forth herein.

Figure 1A:
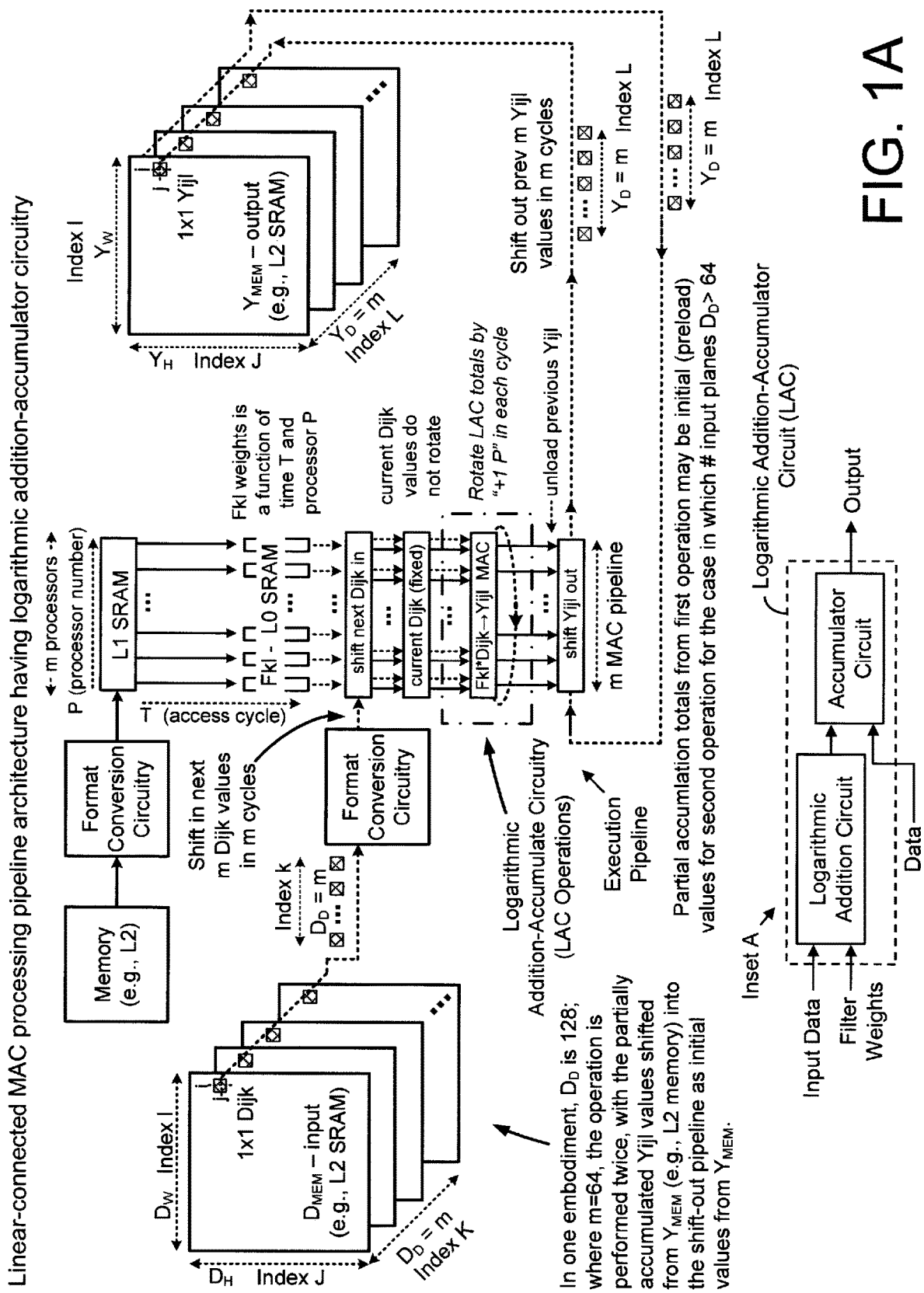
Figure 1B:
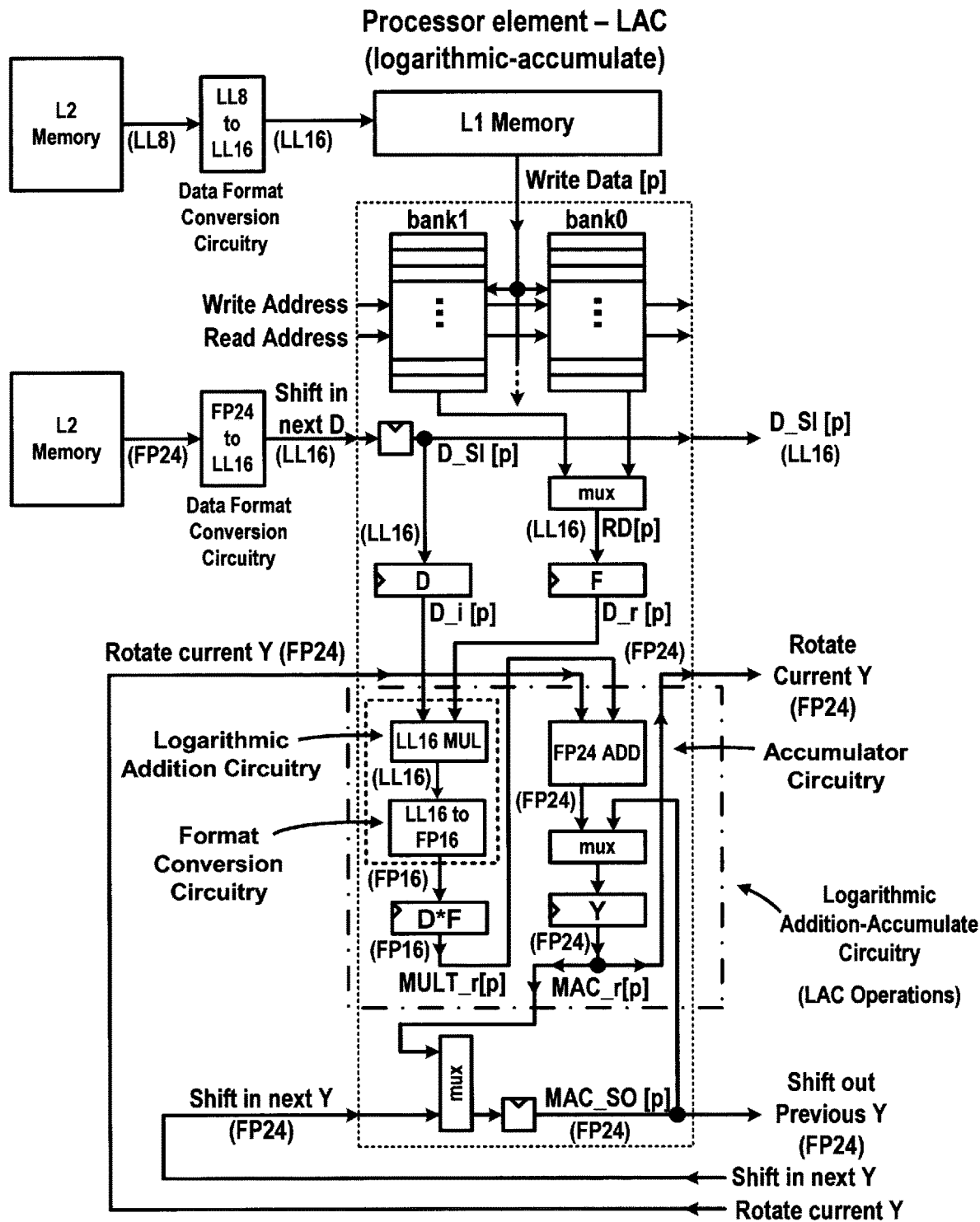
Figure 1D:
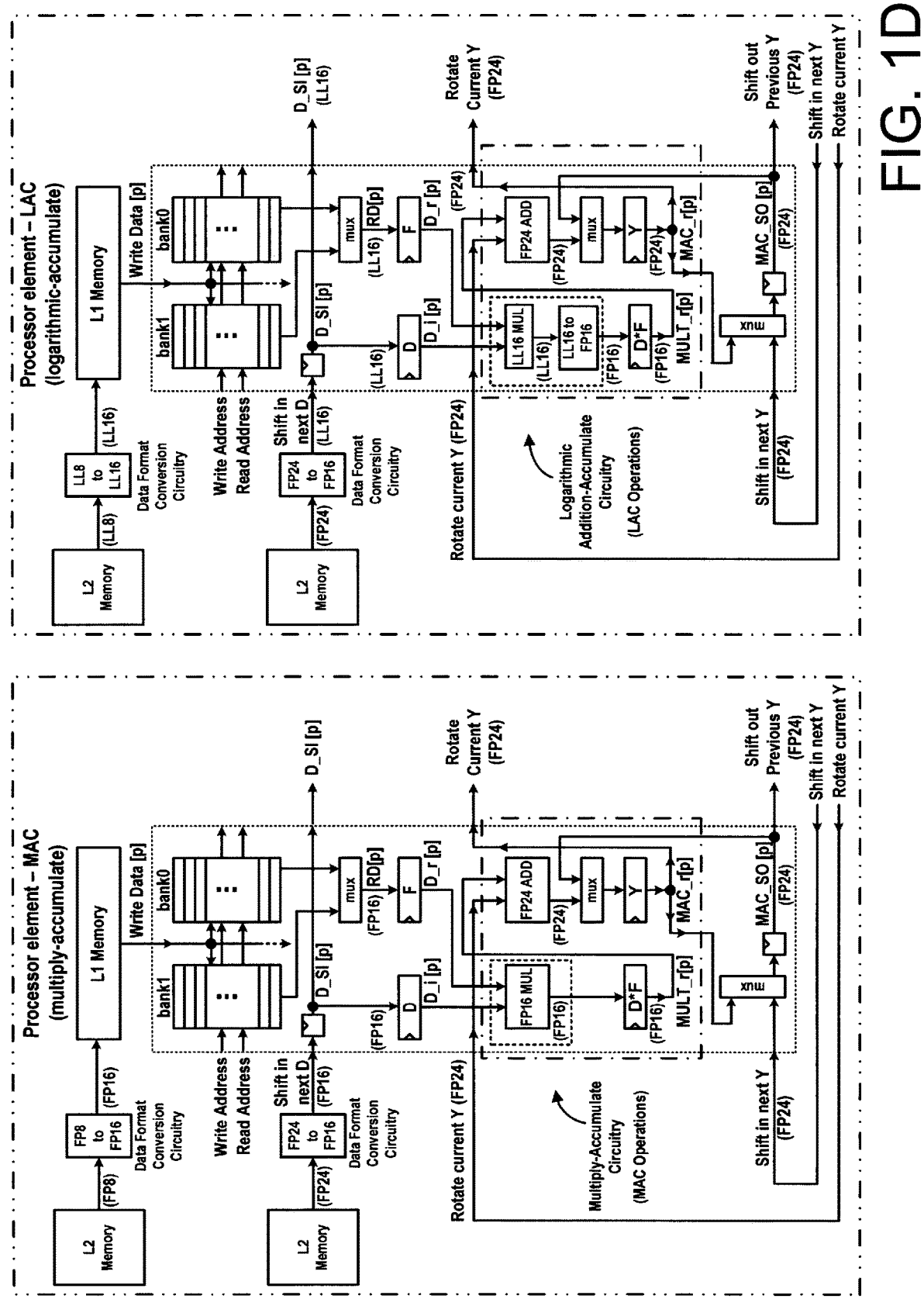
Figure 1E:
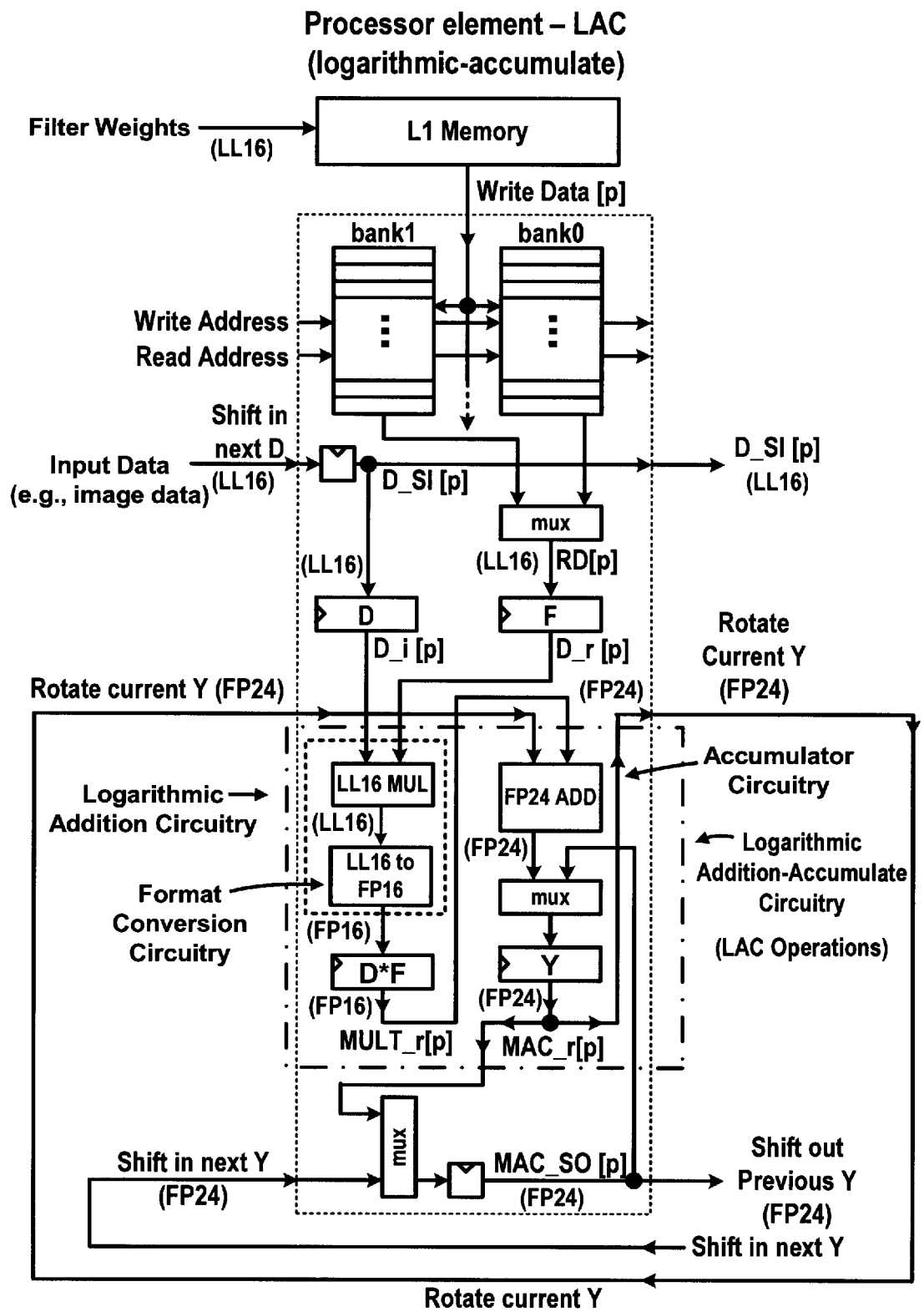
Figure 1F:
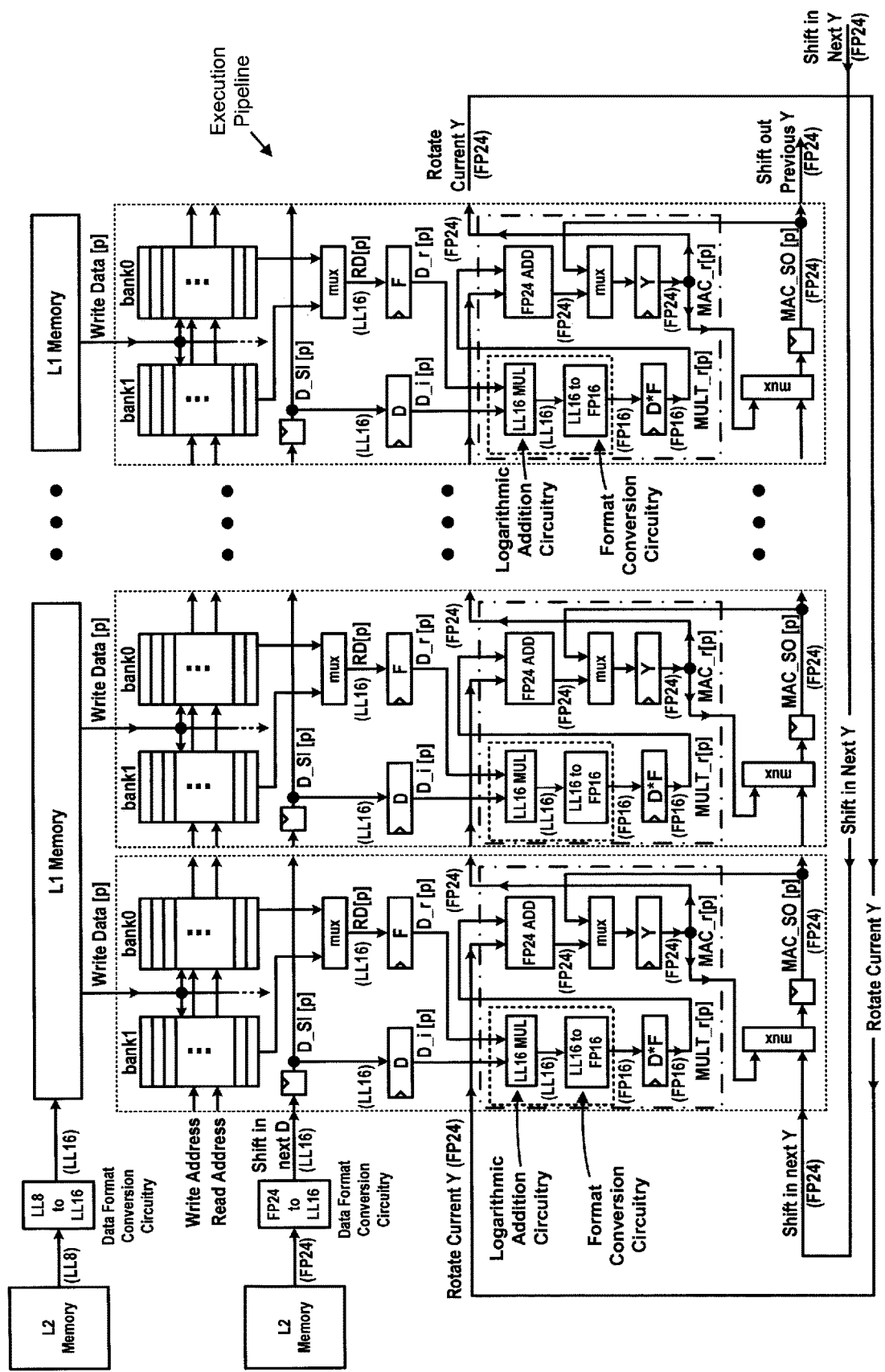
Figure 1G:
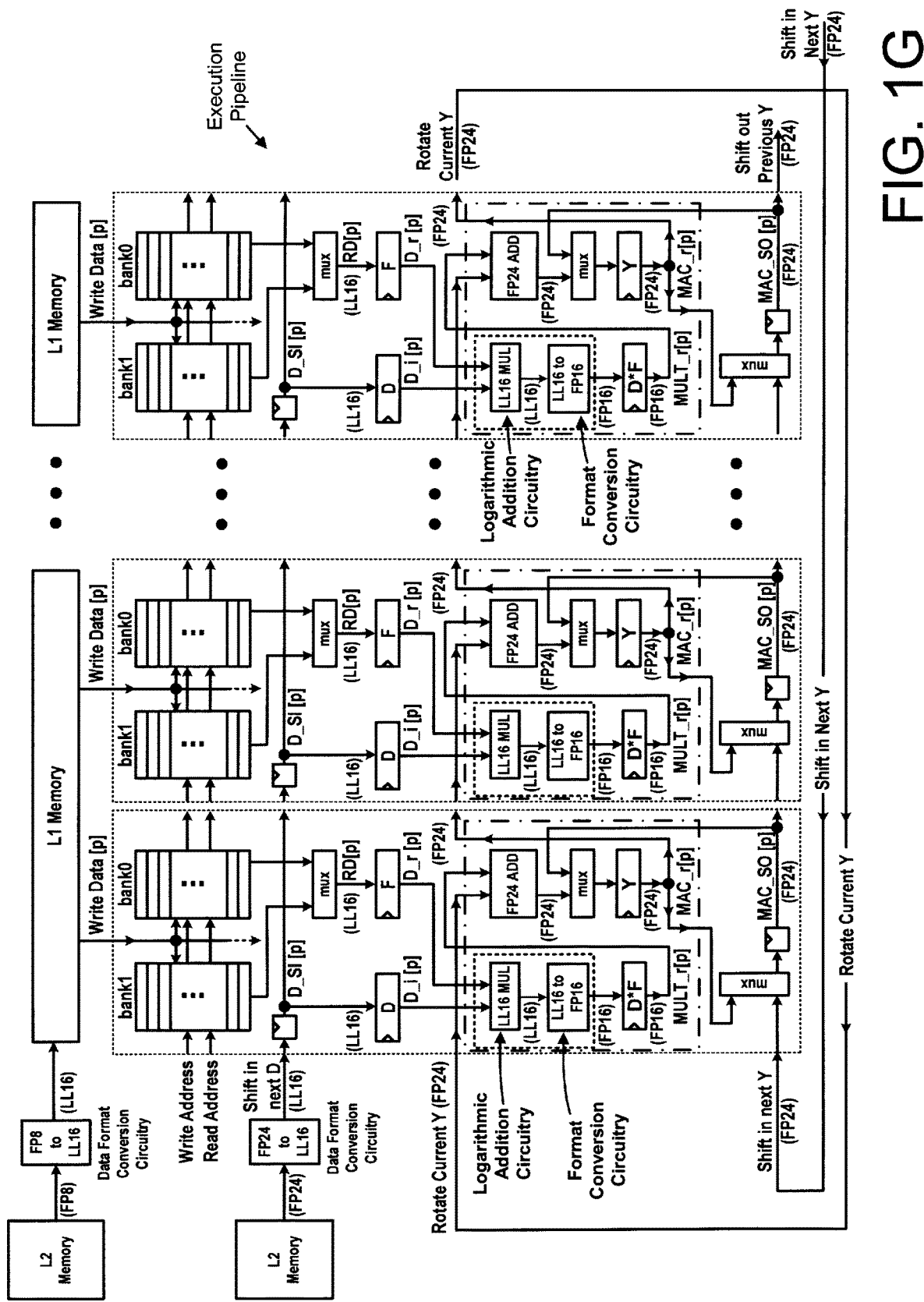
Figure 1H:
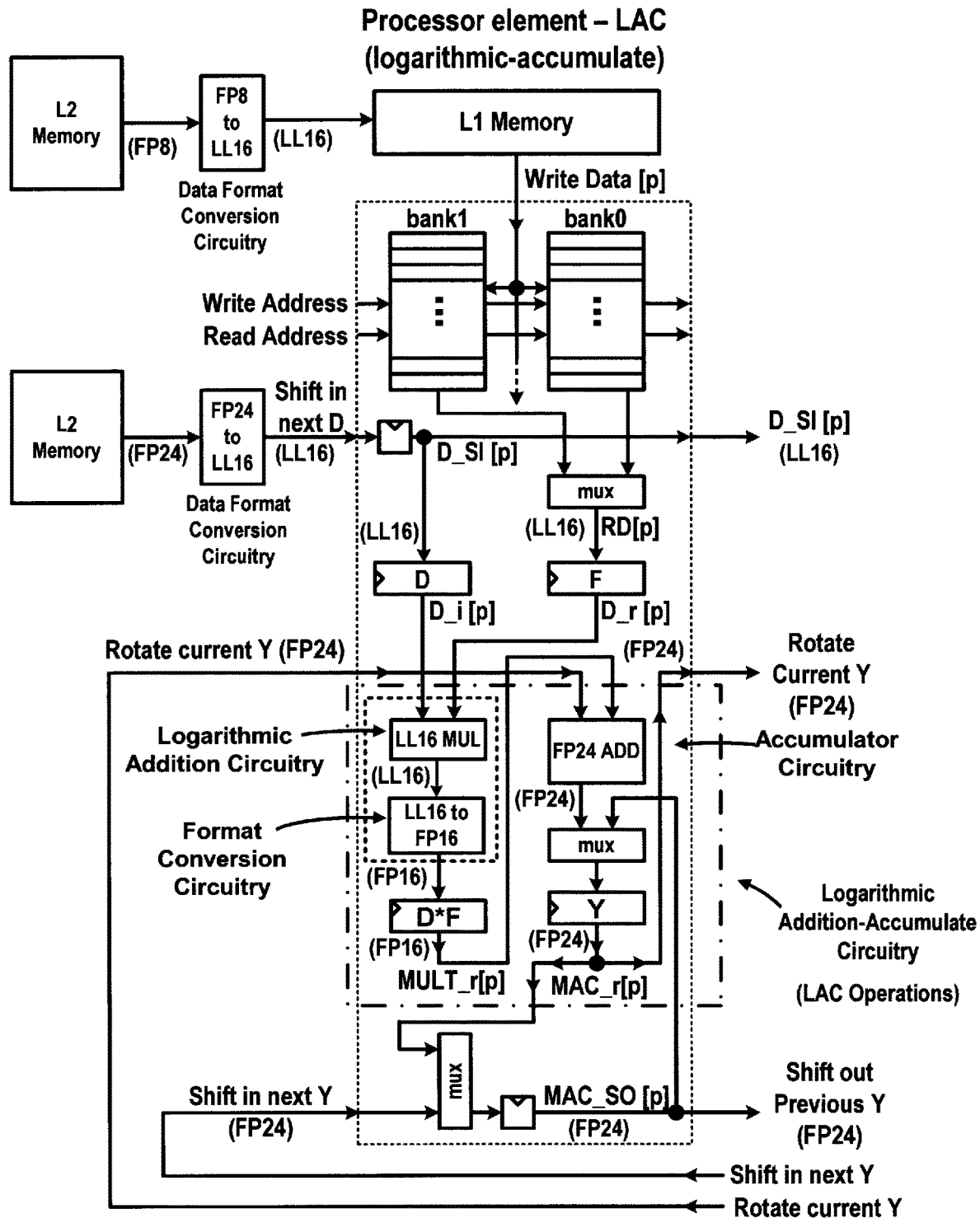
Figure 3B:
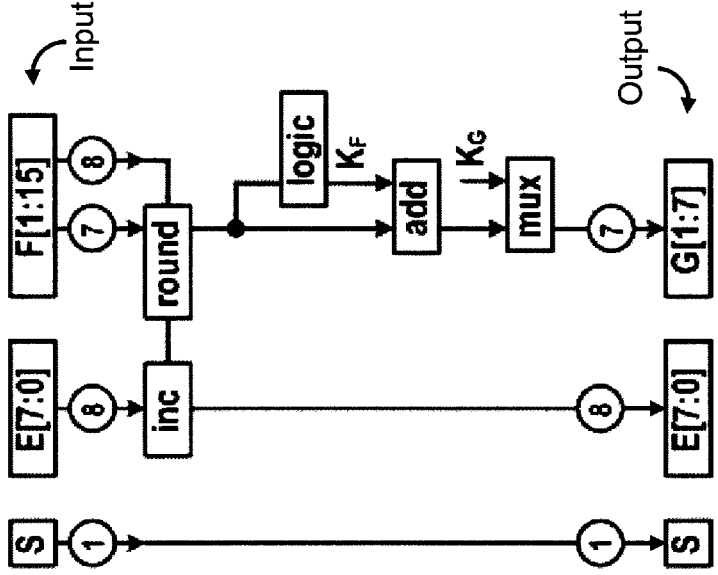
Figure 3A:
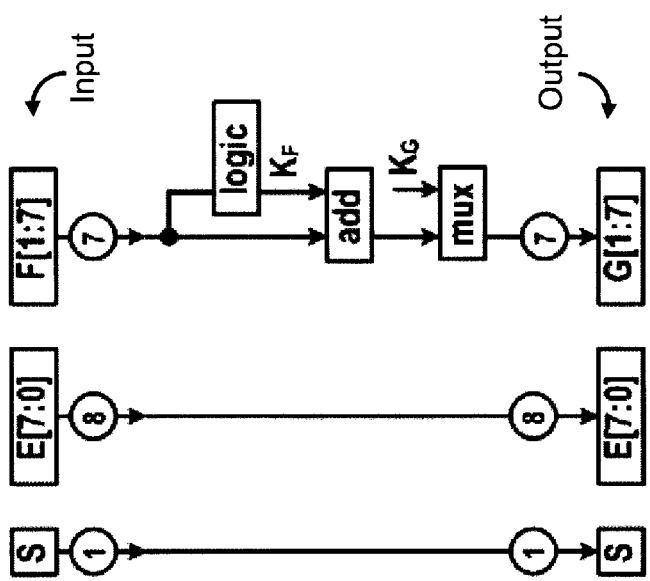
Figure 3C:
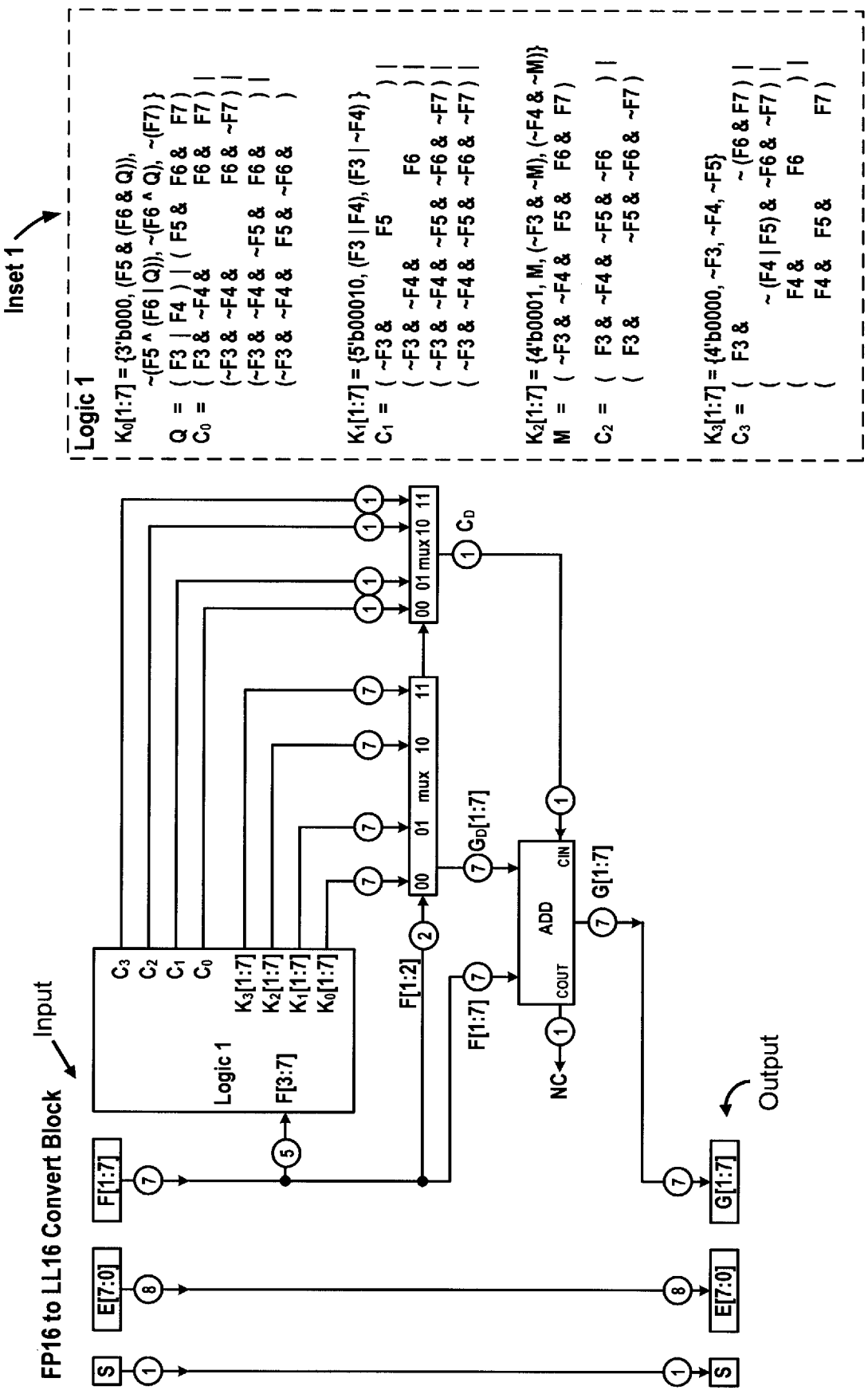
Figure 3D:
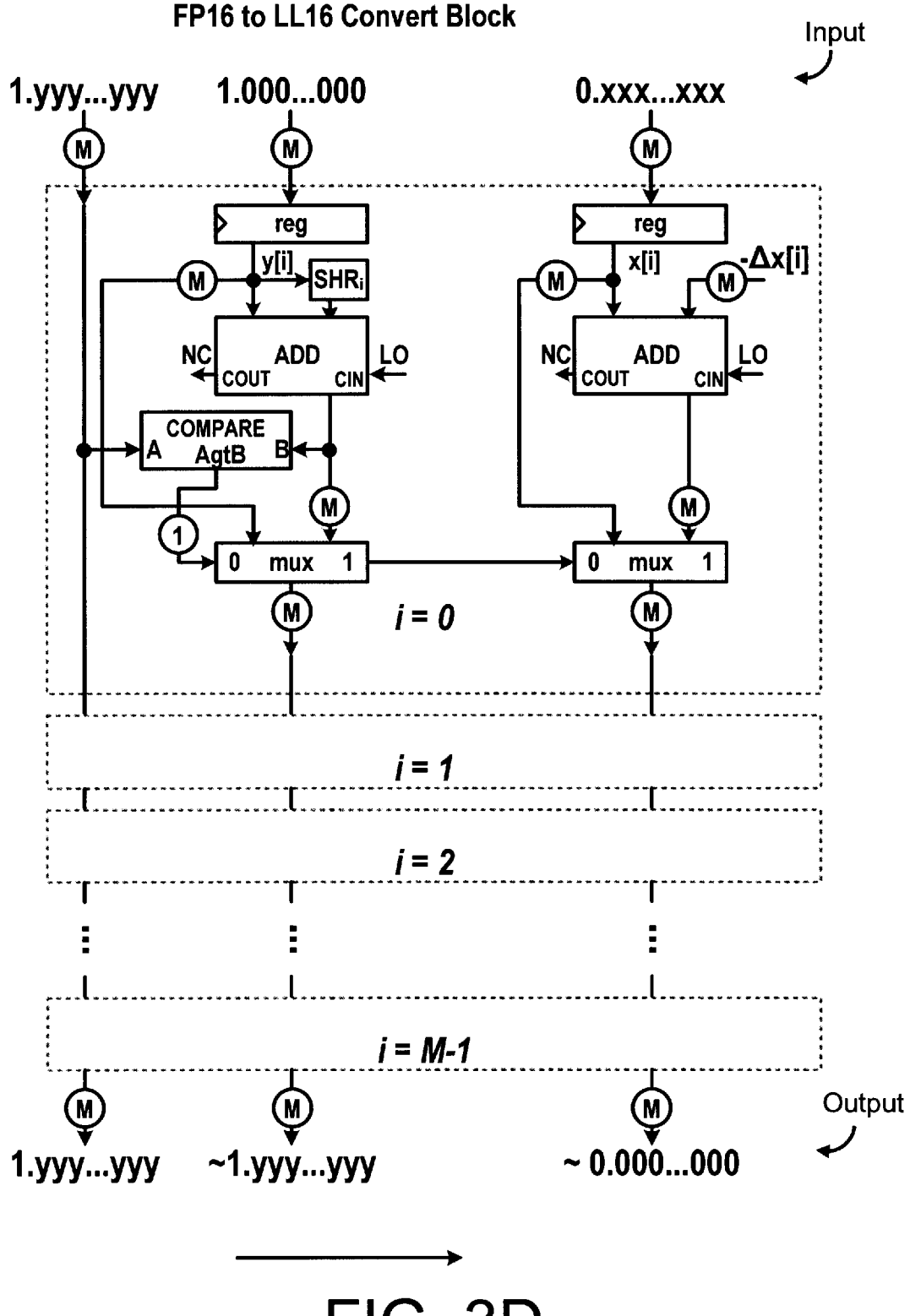
Figure 4A:
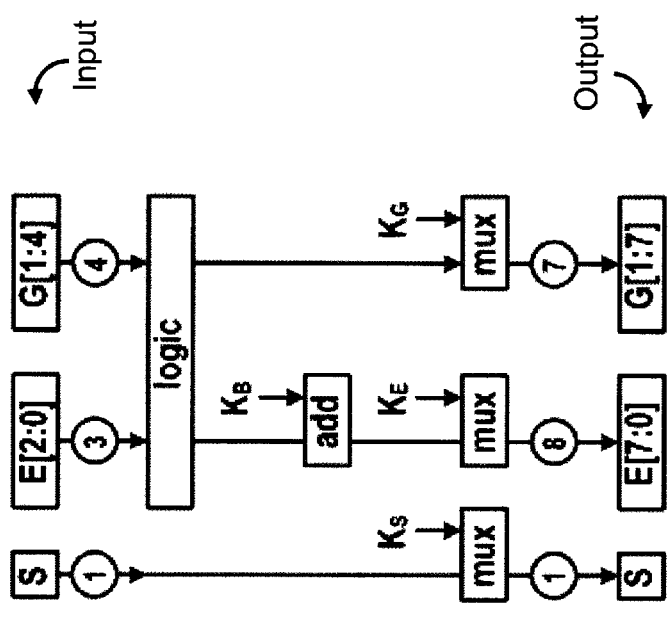
Figure 4B:
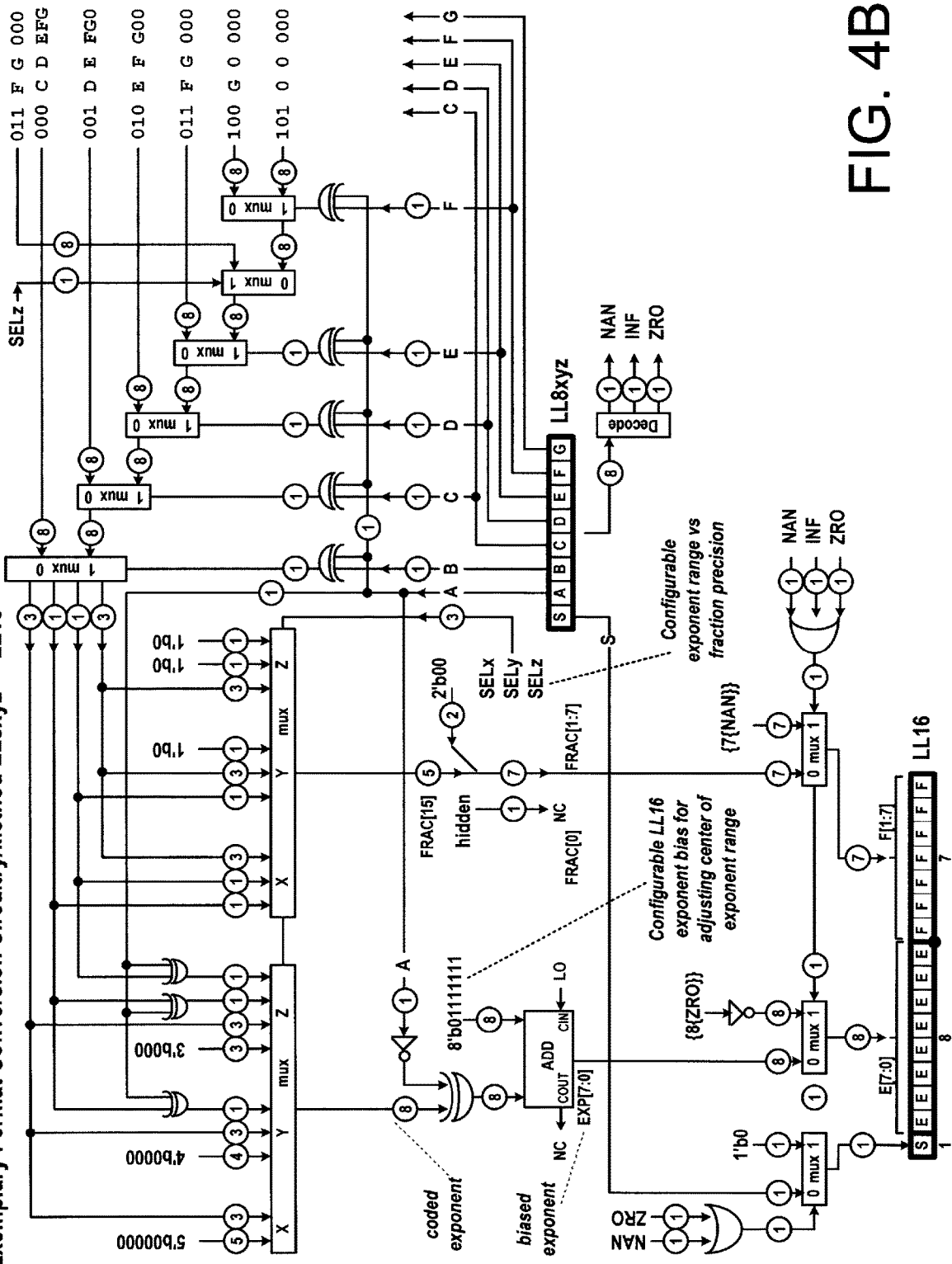
Figure 5A:
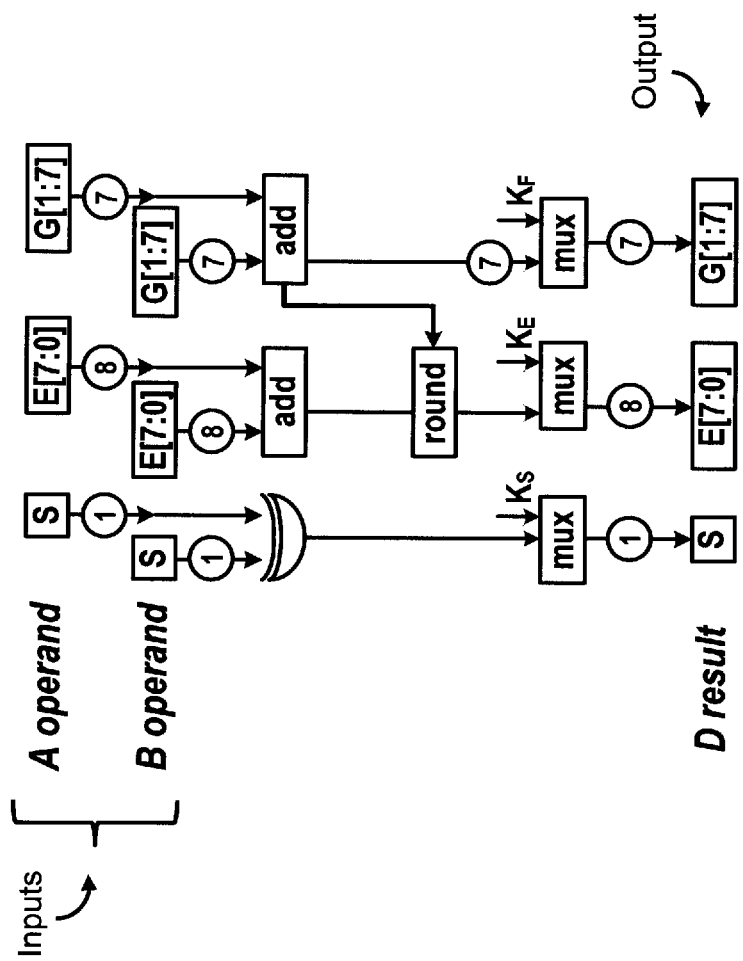
Figure 5B:
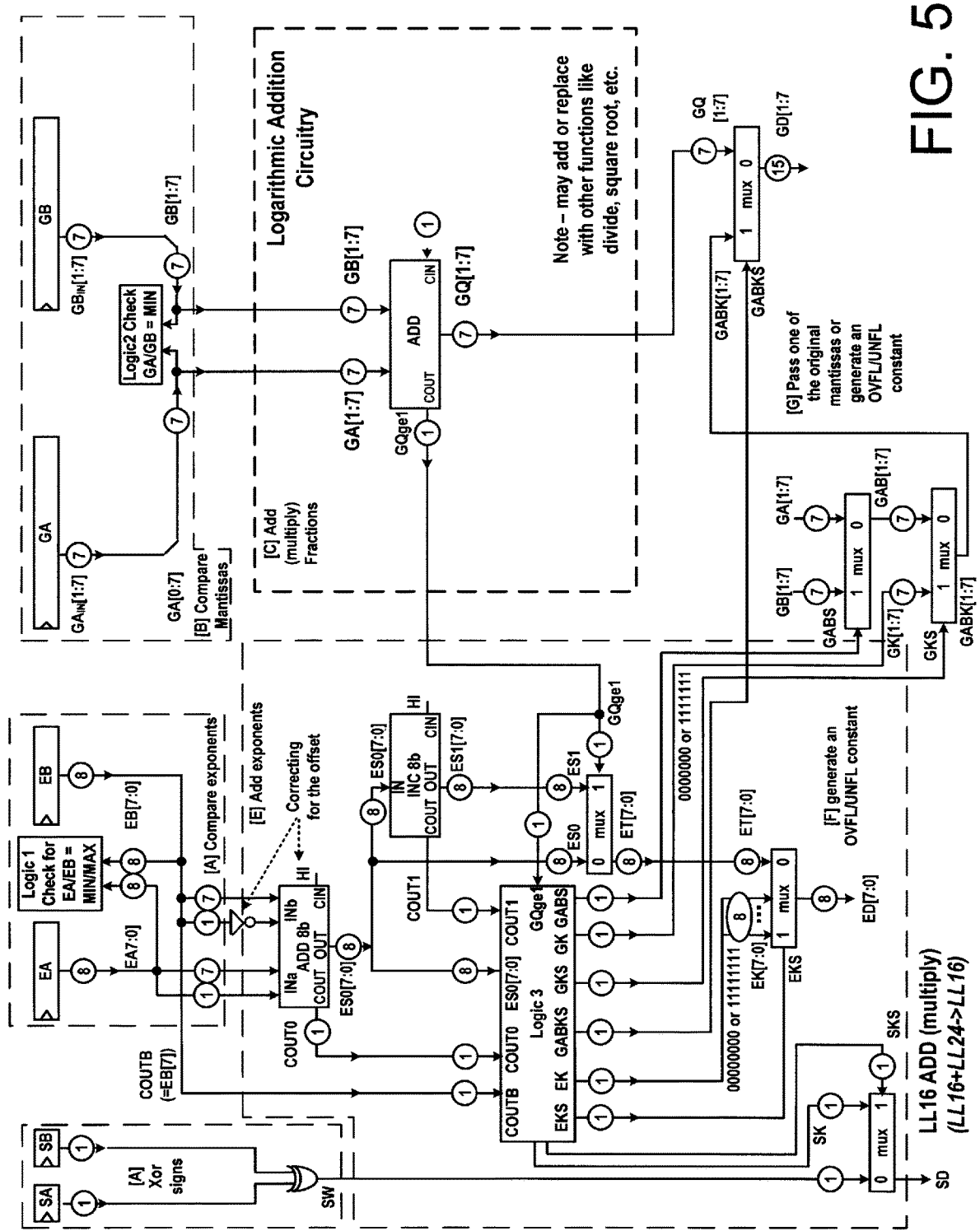
Figure 6B:
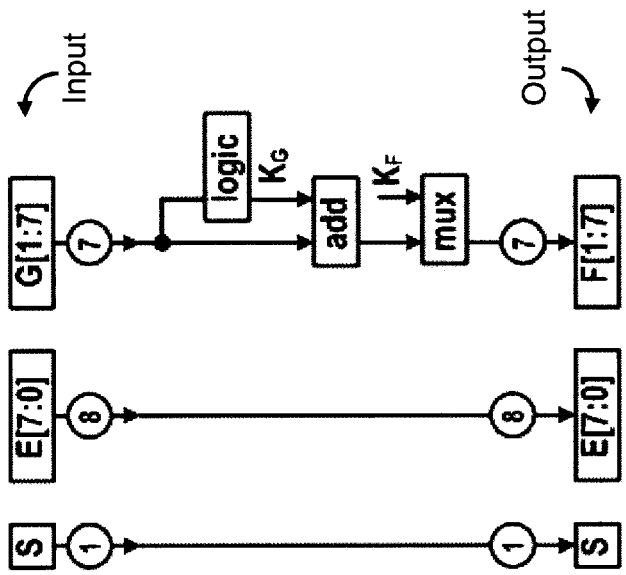
Figure 6A:
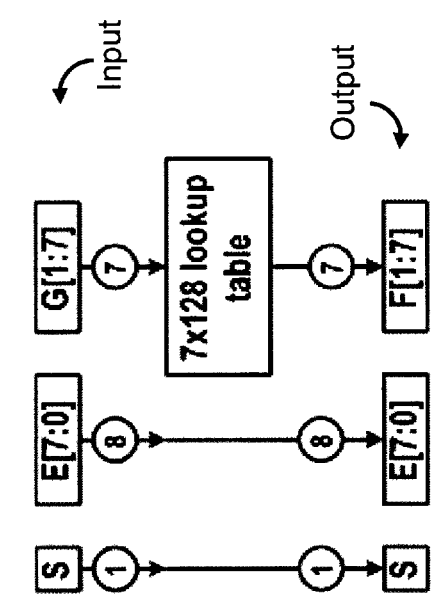
Figure 6C:
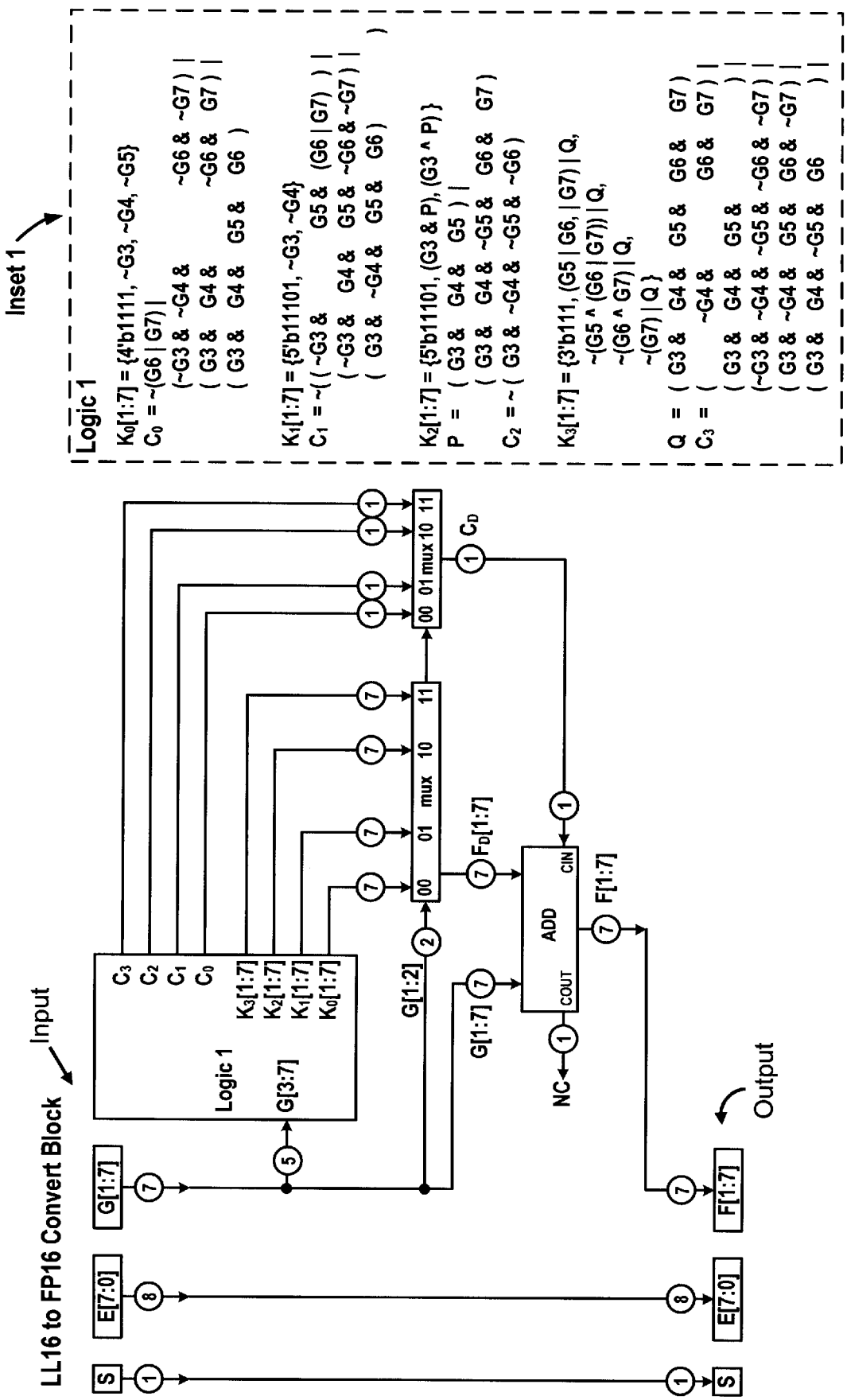
Figure 6D:
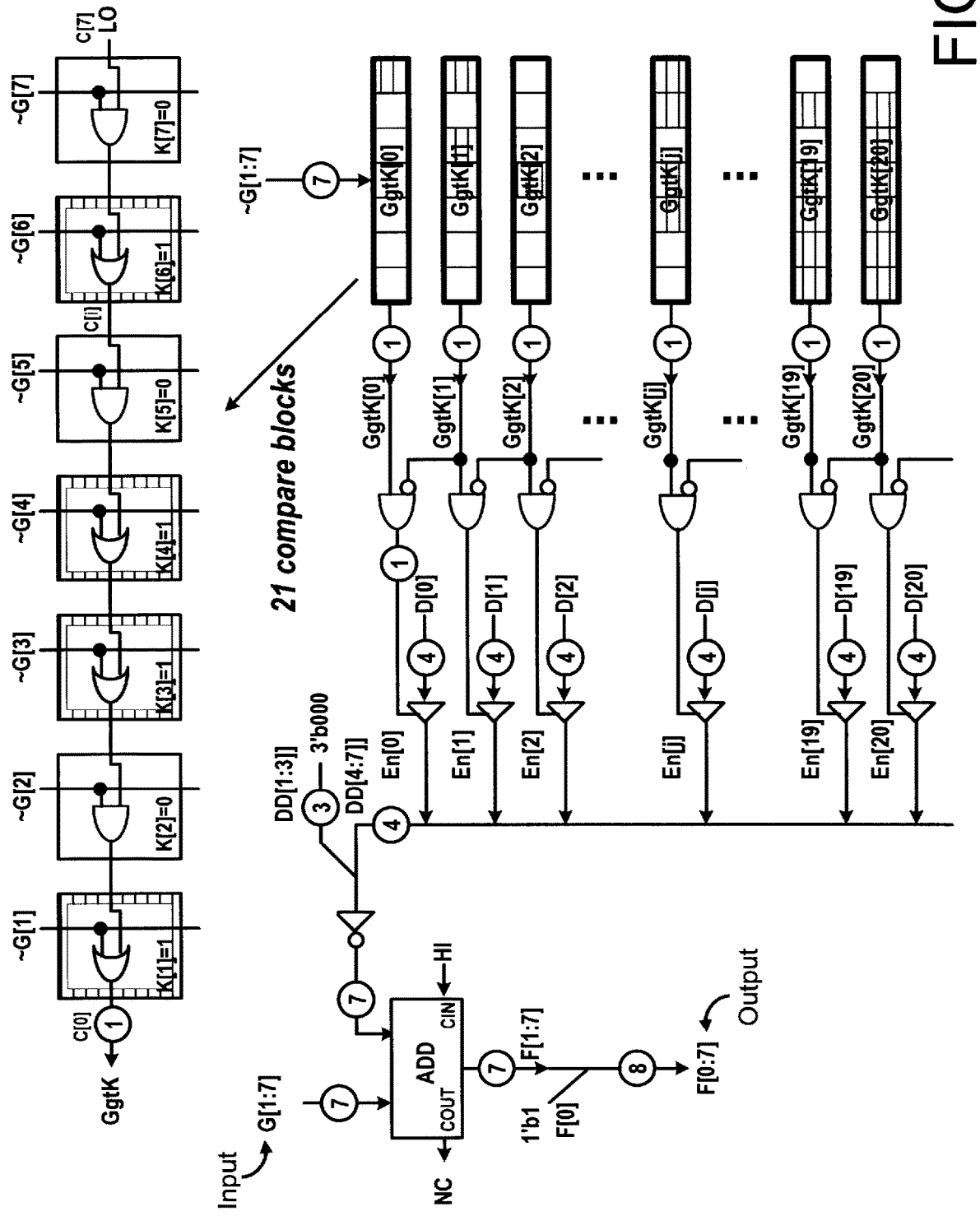
Figure 6E:
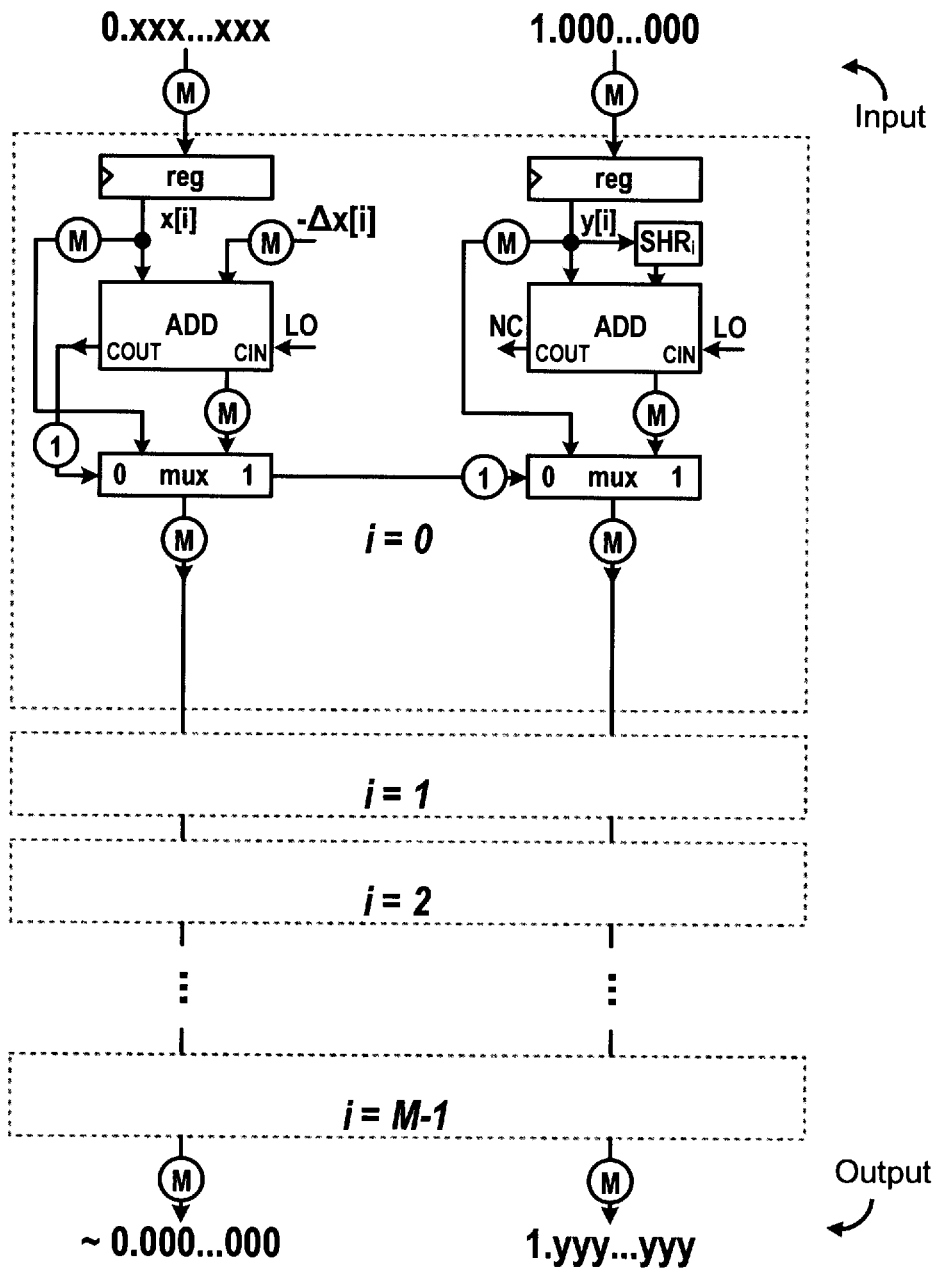
Figure 7:
Figure 10A:
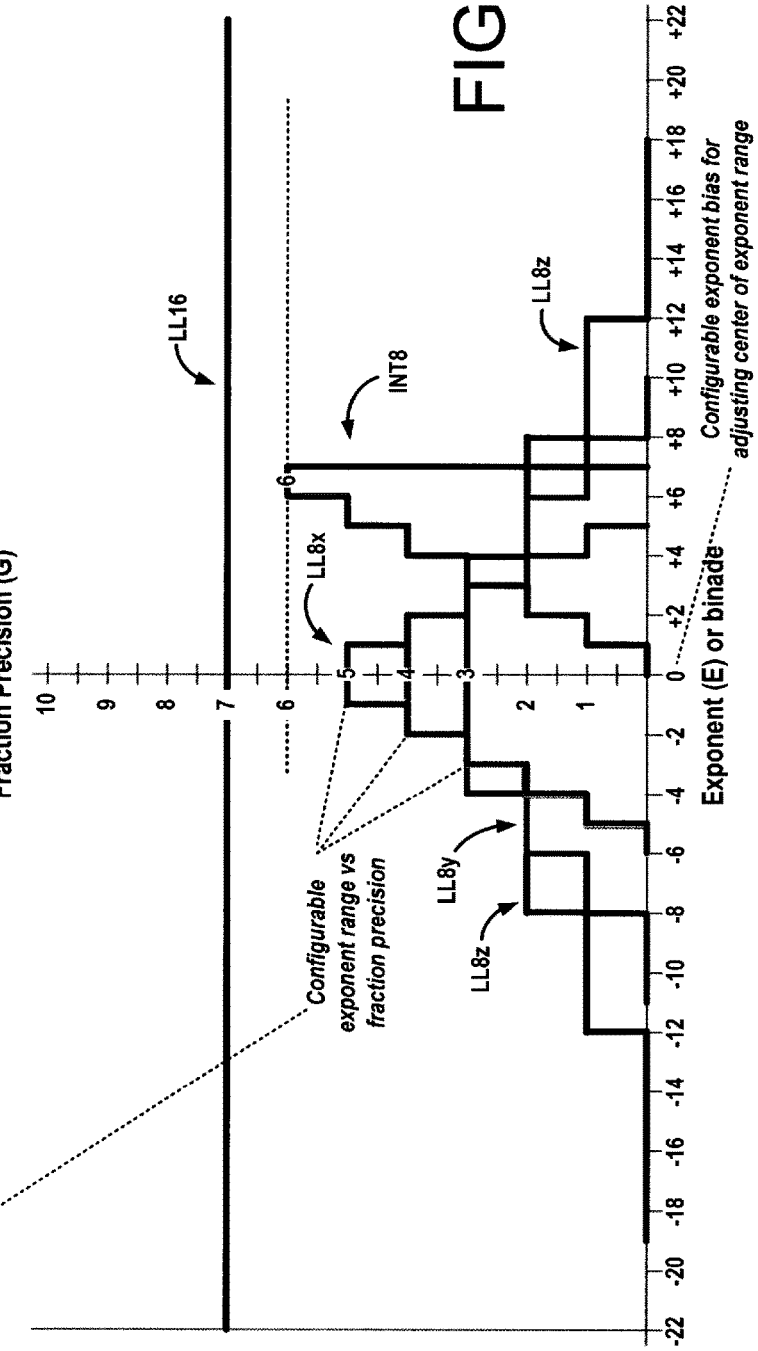
Figure 10C:
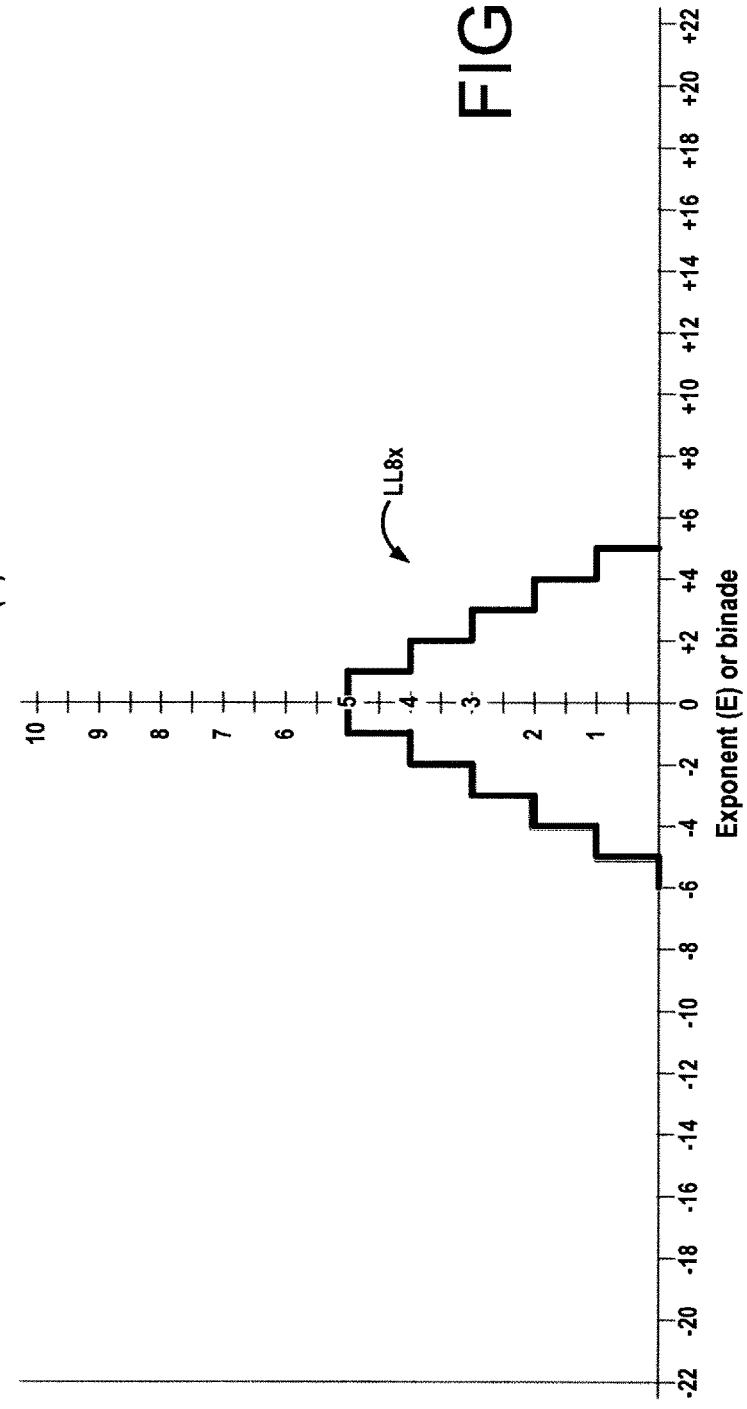
Figure 11:
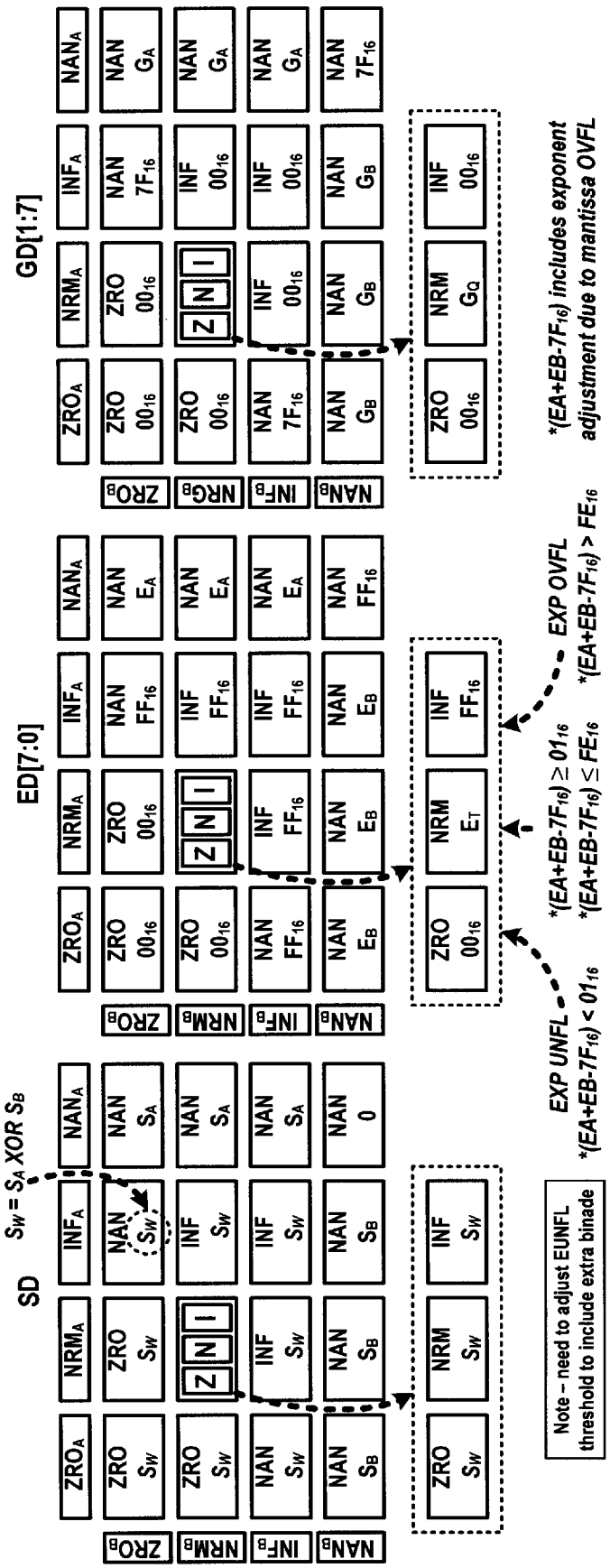
Figure 12A:
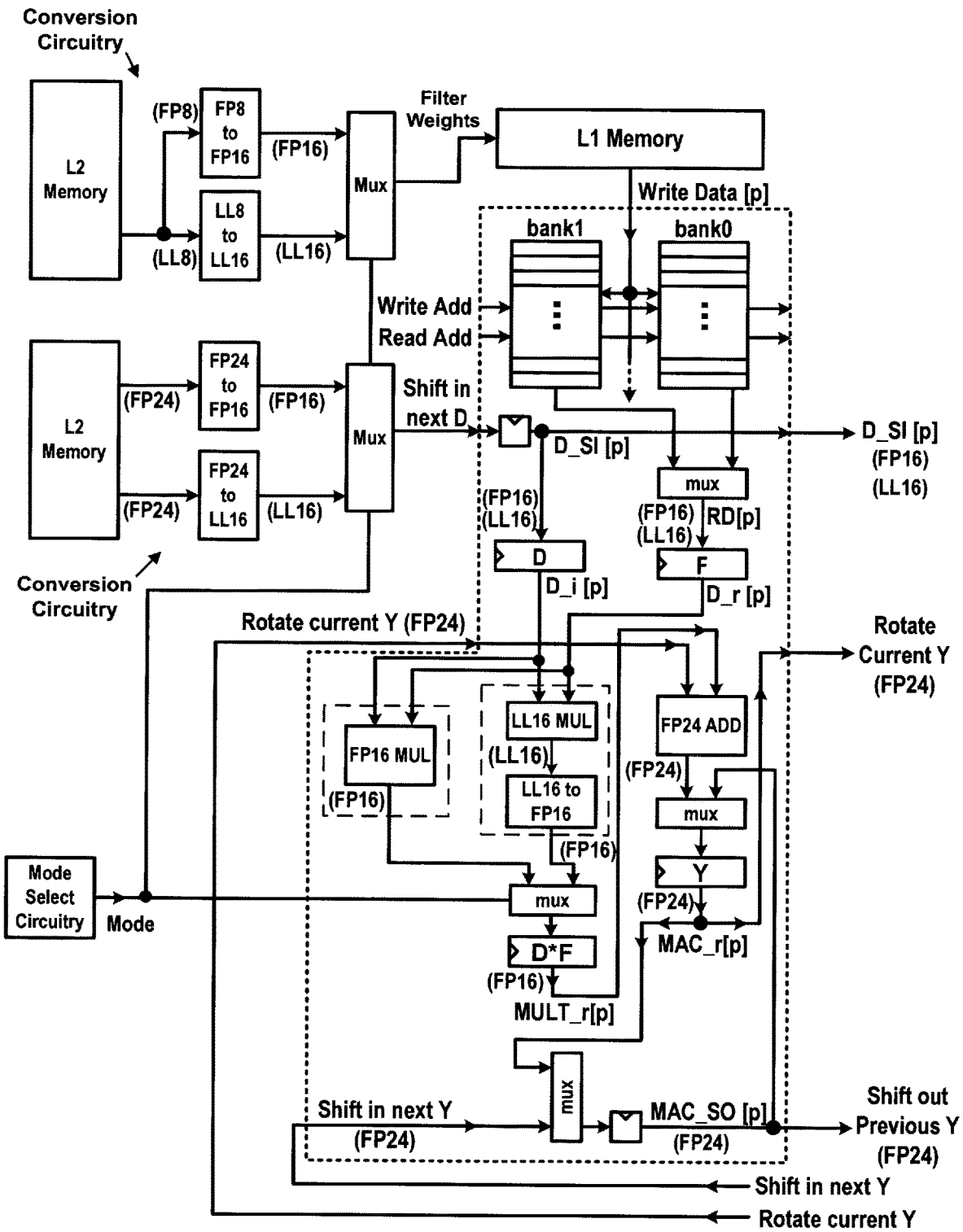
Figure 12B:
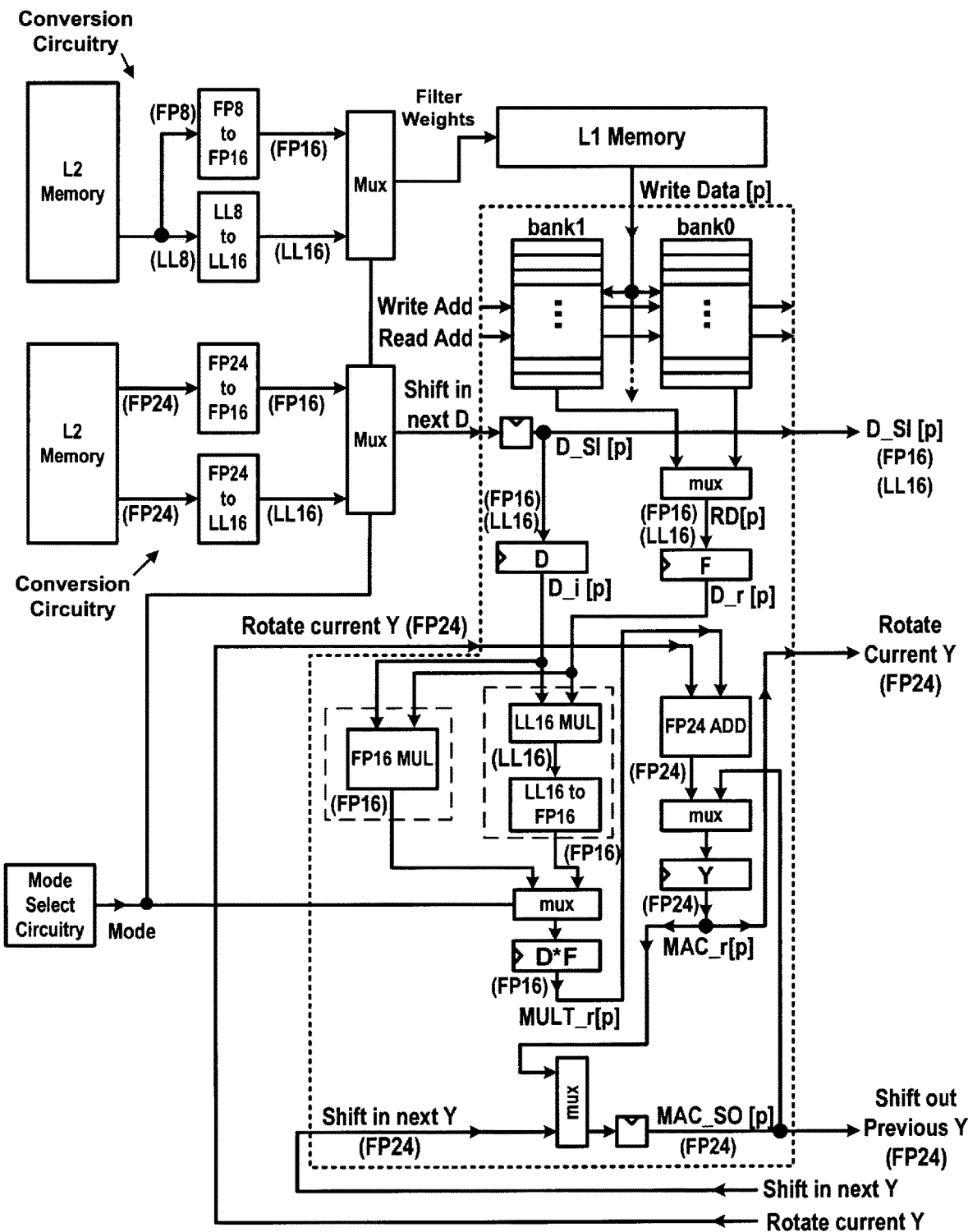

FIG. 1A illustrates a schematic block diagram of a logical overview of an exemplary logarithmic addition-accumulator execution pipeline, connected in a linear pipeline configuration, according to one or more aspects of the present inventions, wherein the logarithmic addition-accumulate processing or execution pipeline ("LAC pipeline") includes logarithmic addition-accumulator circuitry, which is illustrated in block diagram form; notably, the logarithmic addition-accumulator circuitry includes one or more of the logarithmic addition-accumulator circuits ("LACs" (or singly/individually "LAC")—an exemplary logarithmic addition-accumulator circuit (also referred to, at times, as "logarithmic addition-accumulate circuit") is illustrated in schematic block diagram form in Inset A); in this exemplary embodiment, "m" (e.g., 64 in the illustrative embodiment) logarithmic addition-accumulator circuits are connected in a linear execution pipeline to operate concurrently whereby the processing circuits perform m x m (e.g., 64×64) logarithmic addition and accumulate operations in each m (e.g., 64) cycle interval (here, a cycle may be nominally 1 ns); notably, each m (e.g., 64) cycle interval processes a Dd/Yd (depth) column of input and output pixels/data at a particular (i,j) location (the indexes for the width Dw/Yw and height Dh/Yh dimensions of this exemplary embodiment—Dw=512, Dh=256, and Dd=128, and the Yw=512, Yh=256, and Yd=64) wherein the m (e.g., 64) cycle execution interval is repeated for each of the Dw*Dh depth columns for this stage; in addition, in one embodiment, the filter weights or weight data, in logarithmic data format, are loaded into memory (e.g., L1/L0—such as SRAM memory(ies)) before the logarithmic addition-accumulator circuitry starts processing (see, e.g., the '345 application which, as stated above, is incorporated herein by reference); in addition, in this embodiment, format conversion circuitry is employed to convert the data format of the input data ($D_D$) and the filter weights (Fkl) from a first data format (e.g., floating point data format or fixed point data format (e.g., integer or block scaled-fraction data format) into a logarithmic data format to facilitate processing in the LAC of the execution pipeline;

FIG. 1B illustrates in illustrates a schematic block diagram of an exemplary logical overview of an exemplary logarithmic addition-accumulator circuitry (also referred to, at times, as "logarithmic addition-accumulate circuitry") including logarithmic addition circuitry ("MUL") performing logarithmic addition operation of the input data and filter weights, both in a logarithmic data format, and accumulator circuitry ("ADD") performing accumulate/add operations in a floating point data format, according to one embodiment of the present inventions; in this embodiment, data format conversion circuitry are employed to convert the input data/values to a logarithmic data format (FPxx to LLxx (e.g., FP24 to LL16); moreover, data format conversion circuitry is employed to convert the output of the logarithmic addition circuitry from a logarithmic data format to a floating point data format to facilitate the additional data processing of the exemplary logarithmic addition-accumulator circuit; here, the output data/values of the logarithmic addition circuitry (sum data), which are in the logarithmic data format, are converted or transformed to a different data format (e.g., the initial data format, for example, a floating point format, or a fixed point format—albeit in certain embodiment, the bit length may change) for subsequent processing; notably, although this illustrative schematic block diagram provides bit precision of the data and operations, such bit precisions are exemplary and the inventions are not limited to (i) a particular bit precision of the logarithmic data format (LLxx where: xx is an integer), floating point format (FPxx where: xx is an integer), fixed point format (e.g., block scaled fraction data format "BSF"), block/data width, data path width, bandwidths and/or values, (ii) the exemplary logical or physical overview configurations of the particular circuitry and/or overall pipeline, and/or (iii) exemplary module/circuitry configuration and/or pipeline architecture; indeed, in one embodiment, the exemplary logarithmic addition-accumulator circuit may include two dedicated memory banks (i.e., bank 0 and bank 1) to store at least two different sets of filter weights—each set of filter weights associated with and used in processing a set of data) wherein each memory bank may be alternately read for use in processing a given set of associated data and alternately written after processing the given set of associated data and in preparation for subsequent processing, for example, the next set of associated data;

FIG. 1C is a high-level block diagram layout of an integrated circuit or a portion of an integrated circuit (which may be referred to, at times, as an "X1 component") including a plurality of multi-bit LAC execution pipelines having a plurality of logarithmic addition-accumulator circuits each of which implement logarithmic addition and accumulate operations, according to certain aspects of the present inventions; the multi-bit LAC execution pipelines and/or the plurality of logarithmic addition-accumulator circuits may be configured to implement one or more processing architectures or techniques (singly/individually or in combination with one or more X1 components); in this illustrative embodiment, the multi-bit LAC execution pipelines are organized into clusters (in this illustrative embodiment, four clusters wherein each cluster includes a plurality of multi-bit LAC execution pipelines (in this illustrative embodiment each cluster includes 16, 64-LAC execution pipelines (which may also be individually referred to below as LAC processors)); in one embodiment, the plurality of logarithmic addition-accumulator circuitry are configurable or programmable (one-time or multiple times, e.g., at start-up and/or in situ) to implement one or more pipelining processing architectures or techniques (see, e.g., the expanded view of a portion of the high-level block diagram of FIG. 1C in the lower right is a single LAC execution pipeline (in the illustrative embodiment, including, e.g., 64 logarithmic addition-accumulator circuits ("LAC")—which may also be referred as LAC processors) which correlates to the schematic block diagram of a logical overview of an exemplary logarithmic addition-accumulator circuitry arranged in a linear execution pipeline configuration—see FIG. 1A); the processing component in this illustrative embodiment includes memory (e.g., L2 memory, L1 memory and L0 memory (e.g., SRAM)), a bus interfaces (e.g., a PHY and/or GPIO) to facilitate communication with circuitry external to the component and memory (e.g., SRAM and DRAM) for storage and use by the circuitry of the component, and a plurality of switches/multiplexers which are electrically interconnected to form a switch interconnect network "Network-on-Chip" ("NOC") to facilitate interconnecting the clusters of logarithmic addition-accumulator circuits of the LAC execution pipelines; in one embodiment, the NOC includes a switch interconnect network (e.g., a mixed-mode interconnect network (i.e., a hierarchical switch matrix interconnect network and a mesh, torus or the like interconnect network (hereinafter collectively "mesh network" or "mesh interconnect network")), associated data storage circuits, input pins and/or look-up tables (LUTs) that, when programmed, determine the operation of the switches/multiplexers; in one embodiment, one or more (or all) of the clusters includes one or more computing circuits (e.g., a plurality of logarithmic addition-accumulator circuitry—labeled as "NMAX Rows"—see, e.g., the '345 application wherein, aside from the data format circuitry, the logarithmic addition circuitry is a substitute for the multiplier circuitry); notably, in one embodiment, each LAC execution pipeline (which, in one embodiment, consists of a plurality of serially interconnected logarithmic addition-accumulator circuits) is connected to an associated L0 memory (e.g., SRAM memory) that is dedicated to that processing pipeline; the associated L0 memory stores filter weights used by the logarithmic addition circuitry of each logarithmic addition-accumulator circuit of that particular LAC processing pipeline in performance of the logarithmic addition operations, wherein each LAC processing pipeline of a given cluster is connected to an associated L0 memory (which, in one embodiment, is dedicated to the logarithmic addition-accumulator circuits of that LAC processing pipeline—in this illustrative embodiment, 64 LACs in the LAC processing pipeline); a plurality (e.g., 16) LAC execution pipelines of a LAC cluster (and, in particular, the L0 memory of each LAC execution pipeline of the cluster) is coupled to an associated L1 memory (e.g., SRAM memory); here, the associated L1 memory is connected to and shared by each of the LAC execution pipelines of the cluster to receive filter weights to be stored in the L0 memory associated with each LAC execution pipeline of the cluster; in one embodiment, the associated L1 memory is assigned and dedicated to the plurality of pipelines of the LAC cluster; notably, the shift-in and shift-out paths of each 64-LAC execution pipeline is coupled to L2 memory (e.g., SRAM memory) wherein the L2 memory also couples to the L1 memory and L0 memory; the NOC couples the L2 memory to the PHY (physical interface) which may connect to L3 memory (e.g., external DRAM); the NOC also couples to a PCIe or PHY which, in turn, may provide interconnection to or communication with circuitry external to the X1 processing component (e.g., an external processor, such as a processor in a host computer); the NOC, in one embodiment, may also connect a plurality of X1 components (e.g., via GPIO input/output PHYs) which allow multiple X1 components to process related data (e.g., image data), as discussed herein, in accordance with one or more aspects of the present inventions;

FIG. 1D illustrates exemplary schematic block diagrams of exemplary logical overviews of an exemplary multiplier-accumulator circuit and an exemplary logarithmic addition-accumulate circuitry (referred to, at times, as "logarithmic addition-accumulator circuitry");

FIG. 1E illustrates a schematic block diagram of an exemplary logical overview of an exemplary logarithmic addition-accumulate execution or processing circuit, according to one embodiment of the present inventions, including logarithmic addition circuitry (MUL) performing operation in a 16 bit logarithmic data format (LL16 MUL), format conversion circuitry to convert or transform the (sum data), which is in the logarithmic data format, to, for example, a floating point data format, and the accumulator circuitry (ADD) performing accumulate/add operations, in one embodiment, in a 24 bit floating point format (FP24 ADD); notably, the bit width of the processing circuitry and operations are exemplary—that is, in this illustrative embodiment, the data and filter weights are in a 16 bit logarithmic data format (LL16) wherein, the conversion circuitry may change or modify (e.g., increases or decreases) the bit width of the input data and filter weights; as indicated above, the logarithmic addition circuitry and the floating point accumulator perform operations in a 16 bit (LL16) and a 24 bit floating point data format (FP24), respectively; other floating point formats or width precisions are applicable (e.g., 8, 16 and 32 bits); as noted above, in one embodiment, the precision/format employed by the logarithmic addition circuitry and/or the floating point accumulator may depend upon the memory bandwidth available/allocated, wiring bandwidth available/allocated, and/or the amount of area available/allocated to the floating point circuitry of the processing circuitry to store, transfer/read and/or process data (e.g., data partially processed and to be processed) within, for example, an integrated circuit; notably, the present inventions may be implemented via floating point execution circuitry that maybe configured with the same precision width or different precision widths/formats;

FIGS. 1F and 1G illustrate schematic block diagrams of exemplary logical overviews of an exemplary logarithmic addition-accumulator execution or processing pipeline (see FIGS. 1A and 1C) wherein each logarithmic addition-accumulator circuit includes a logarithmic addition circuitry performing operations in a logarithmic data format and/or accumulator circuitry performing operations in a floating point format, according to certain embodiment of the present inventions; in one embodiment, data format conversion circuitry are employed to convert the input data to a logarithmic data format (FPxx to LLxx (e.g., FP24 to LL16) in FIG. 1F; in another embodiment, data format conversion circuitry are employed to convert the input data and the filter weights to a logarithmic data format (FPxx to LLxx (e.g., FP24 to LL16, and FP8 to LL16)) in FIG. 1G; in these exemplary embodiments, the logarithmic addition-accumulator circuit may include a plurality of memory banks (e.g., SRAM memory banks) that are dedicated to the logarithmic addition-accumulator circuit to store filter weights used by the logarithmic addition circuitry of the associated logarithmic addition-accumulator circuit; in one illustrative embodiment, the LAC execution or processing pipeline includes 64 logarithmic addition-accumulator circuits (see FIGS. 1A and 1C); notably, in the logical overview of a linear pipeline configuration of this exemplary logarithmic addition-accumulator execution or processing pipeline, a plurality of processing (LAC) circuits ("p") are connected in the execution pipeline and operate concurrently; for example, in one exemplary embodiment where p=64, the logarithmic addition-accumulator processing circuits perform 64×64 logarithmic addition-accumulate operations in each 64 cycle interval; thereafter, next 64 input pixels/data are shifted-in and the previous output pixels/data are shifted-out during the same 64 cycle intervals; notably, in one embodiment, each logarithmic addition-accumulator circuit may include two dedicated memory banks to store at least two different sets of filter weights—each set of filter weights associated with and used in processing a set of data) wherein each memory bank may be alternately read for use in processing a given set of associated data and alternately written after processing the given set of associated data; the filter weights or weight data are loaded into memory (e.g., the L1/L0 SRAM memories) from, for example, an external memory or processor before the stage processing started (see, e.g., the '345 application); notably, the logarithmic addition-accumulator circuits and circuitry of the present inventions may be interconnected or implemented in one or more logarithmic addition-accumulator execution or processing pipelines including, for example, execution or processing pipelines as described and/or illustrated in U.S. Provisional Patent Application No. 63/012,111 in connection with MAC processing pipelines; the '111 application is incorporated by reference herein in its entirety; as noted above, the LAC and LAC pipeline substitutes for the MAC and MAC pipeline in the exemplary processing pipelines as described and/or illustrated in the '111 application;

FIG. 1H illustrates in illustrates a schematic block diagram of an exemplary logical overview of an exemplary logarithmic addition-accumulator circuit including logarithmic addition circuitry ("MUL") performing logarithmic addition operation of the input data and filter weights, both in a logarithmic data format, and accumulator circuitry ("ADD") performing accumulate/add operations, for example, in this embodiment, in a floating point data format, according to one embodiment of the present inventions; in this embodiment, data format conversion circuitry are employed to convert the input data and the filter weights to a logarithmic data format (FPxx to LLxx (e.g., FP24 to LL16, and FP8 to LL16)); moreover, format conversion circuitry is employed to convert the output of the logarithmic addition circuitry from a logarithmic data format to a floating point data format to facilitate the additional data processing of the exemplary logarithmic addition-accumulator circuit; here, the output data/values of the logarithmic addition circuitry (sum data), which are in the logarithmic data format, are converted or transformed to a different data format (e.g., the initial data format, for example, a floating point format, or a fixed point format—albeit in certain embodiment, the bit length may change) for subsequent processing; notably, although this illustrative schematic block diagram provides bit precision of the data and operations, such bit precisions are exemplary and the inventions are not limited to (i) a particular bit precision of the logarithmic data format (LLxx where: xx is an integer), floating point format (FPxx where: xx is an integer), fixed point format (e.g., block scaled fraction data format "BSF"), block/data width, data path width, bandwidths and/or values, (ii) the exemplary logical or physical overview configurations of the particular circuitry and/or overall pipeline, and/or (iii) exemplary module/circuitry configuration and/or pipeline architecture;

FIG. 2A illustrates a schematic/flow block diagram of exemplary data format conversion circuitry having a look-up table, storing pre-computed and/or encoded values that equate the data/value (in this exemplary embodiment, in a floating point data format) to an "equivalent" value in a logarithmic data format, according to certain aspects of the present inventions; here, for each data/value, a proper output value is precomputed (and encoded) and compiled in a format conversion look-up table (using a y=LOG 2(x) computing technique) and thereafter stored in memory (e.g., non-volatile, read-only memory such as ROM or flash); in this illustrative embodiment, the look-up table contains a correlation between floating point data format (specifically FP16) and a logarithmic data format (specifically LL16); the contents of the table may be precomputed using any circuitry and/or technique now known or later developed; notably, the exponent field "E" of the LL16 and FP16 formats is similar—it is a biased value representing the integral value of the exponent base of the number (i.e. "2^(E-Ebias)") wherein the "E-Ebias" value is the integral base-2 logarithm of the number; moreover, the standard floating point format mixes this integral logarithm in the E field with a binary fraction in the F field (also called the mantissa or significand) to (approximately) represent a real number, and the logarithmic floating point format mixes the integral logarithm in the E field with a fraction logarithm in the G field to (approximately) represent a real number;

FIG. 2B illustrates a schematic/flow block diagram of another exemplary data format conversion circuitry to convert data/values from a floating point data format to a logarithmic data format wherein the conversion circuitry includes a look-up table, storing pre-computed and/or encoded values that equate the data/value (in this exemplary embodiment, having a floating point data format) to "equivalent" data value having a logarithmic data format (using a y=LOG 2(x) computing technique), according to certain aspects of the present inventions; in this exemplary embodiment, for each data/value, an "equivalent" value is precomputed (and encoded) and stored in a format conversion look-up table form in memory (e.g., non-volatile, read-only memory such as ROM or flash); in this illustrative embodiment, the look-up table contains a correlation between floating point data format (specifically FP24) and a logarithmic data format (specifically LL16); the contents of the table may be precomputed using any circuitry and/or technique now known or later developed; in this embodiment, the fraction field (F) is rounded (here, from a 15 bit value to a 7 bit value), via rounding logic; notably, the exponent field "E" of the LL16 and FP16 formats is similar—it is a biased value representing the integral value of the exponent base of the number (i.e. "2^(E-Ebias)") wherein the "E-Ebias" value is the integral base-2 logarithm of the number; moreover, the standard floating point format mixes this integral logarithm in the exponent field with a binary fraction in the fraction field "F" (also called the mantissa or significand) to represent or approximately represent a real number, and the logarithmic floating point data format mixes the integral logarithm in the exponent field with a fraction field logarithm in the log value field "G" to (approximately) represent a real number;

FIGS. 3A, 3C and 3D illustrate a schematic/flow block diagram and corresponding circuit block diagrams, respectively, of exemplary data format conversion circuitry wherein logic circuitry converts or transforms data/values (Input), having a floating point data format, to data/values having a logarithmic floating point data format (Output) using a y=LOG 2(x) computing technique, according to certain aspects of the present inventions; in this embodiment, the fraction field (F) of the data/value is adjusted with logic gates and a multiplexer (mux block); in the FP16 to LL16 conversion circuitry, the conversion of the fraction field employs approximately 30 logic gates (logic block in FIG. 3A and Logic 1 in FIG. 3C) to convert the value of the field to logarithmic floating point data format, the x-bit adder (add or ADD block) and x-bit multiplexer (e.g., x=7, see FIG. 3C); notably, the embodiment of the data format conversion circuitry illustrated in FIG. 3C is a circuit block diagram implementation of the data format conversion block diagram illustrated in FIG. 3A—implementing a y=LOG 2(x) method of computing to providing a floating point data format to a logarithmic floating point data format data conversion having a moderate level of precision; similarly the embodiment of the data format conversion circuitry illustrated in FIG. 3D is a circuit block diagram implementation of the data format conversion block diagram illustrated in FIG. 3A—implementing a y=LOG 2(x) method of computing to provide a floating point data format to a logarithmic floating point data format data conversion having a high level of precision (i.e., greater level of precision relative to the embodiment illustrated in FIG. 3C); in one embodiment, the level of precision of FIG. 3D is 32 or 64 bit precision from floating point data format to logarithmic data format; the result is the conversion value may be correctly rounded to the destination format;

FIG. 3B illustrates a schematic/flow block diagram of exemplary data format conversion circuitry wherein logic circuitry converts or transforms data/values (Input), having a floating point data format, to data/values having a logarithmic floating point data format (Output) using a y=LOG 2(x) computing technique, according to certain aspects of the present inventions; in this embodiment, the fraction field (F) of the data/value rounded (here, from a 15 bit value to a 7 bit value), via rounding logic, and adjusted with logic gates and a multiplexer (mux block); in the FP24 to LL16 conversion circuitry, the conversion of the fraction field employs logic to convert the value of the field to logarithmic floating point data format; notably, in addition to the computing techniques of FIGS. 3A-3D, or in lieu thereof, the present inventions may also employ an extrapolation technique to convert the data format from a floating point data format to a logarithmic floating point data format;

FIGS. 4A and 4B illustrate a schematic/flow block diagram and a corresponding circuit block diagram, respectively, of exemplary data format conversion circuitry wherein logic circuitry converts or transforms data/values (Input), having a logarithmic data format and a first bit length, to data/values having a logarithmic floating point data format and a second bit length (Output), according to certain aspects of the present inventions; in one embodiment, the conversion circuitry illustrated here may be employed to convert filter weights or coefficients in a logarithmic data format (e.g., LL8—logarithmic data format having 8 bits for sign (1 bit), exponent (3 bits), and fraction (4 bits)) to filter weights or coefficients in a logarithmic data format having greater dynamic range and precision (e.g., e.g., LL8—logarithmic data format having 16 bits for sign (1 bit), exponent (8 bits), and fraction (7 bits)); the conversion technique approximately doubles the number of bits in the exponent and fraction fields of the LL8 input format, via logic circuitry, an y-bit adder, and one or more multiplexers (see FIG. 4B); notably, the three result fields may also need a special value, operand or character substituted using the row of multiplexers); moreover, the multiplexers select between three (3) alternative conversions designated "x" logarithmic data format (LL8x), "y" logarithmic data format (LL8y), and "z" logarithmic data format (LL8z);

FIGS. 5A-5C illustrate a schematic/flow block diagram and a corresponding circuit block diagrams, respectively, of exemplary logarithmic addition/adder circuitry wherein circuitry receives two operand/values (Inputs—in this illustrative example, image/input data and the filter weights/coefficients), each having a logarithmic data format, and adds the operand/values to generate a sum or result (Output), according to certain aspects of the present inventions; the sign fields of the inputs, in this embodiment, are XOR-ed, the values of the exponent fields are added (and incremented if rounding results in a fraction overflow), and the two fraction fields (in logarithmic form) are added together (via 2's complement)—in this embodiment, using a 7 bit fixed point adder; notably, FIG. 5B illustrates a detailed exemplary circuit block diagram of the logarithmic addition circuitry illustrated in FIG. 5A wherein FIG. 5C provides details of certain logic blocks illustrated in FIG. 5B (see "Logic 1", "Logic 2" and "Logic 3"); the logarithmic addition circuitry (GA+GB) illustrated in FIG. 5B may be replaced or supplemented by circuitry implementing other functions such as reciprocation, square root, power functions wherein, after the operands are in logarithmic data format, other operations or functions may be implemented (e.g., division A/B can be performed by performing GA−GB (along with subtraction of the exponent EA−EB instead of addition EA+EB as with multiplication);

FIG. 6A illustrates a schematic/flow block diagram of exemplary data format conversion circuitry having a look-up table, storing pre-computed and/or encoded values that equate the data/value in a logarithmic data format to an "equivalent" value in another data format (in this exemplary embodiment, in a floating point data format), according to certain aspects of the present inventions; here, for each data/value, a proper output value is precomputed (and encoded) and compiled in a format conversion look-up table (using a y=$2^x$ computing technique) and thereafter stored in memory (e.g., non-volatile, read-only memory such as ROM or flash); in this illustrative embodiment, the look-up table contains a correlation between a logarithmic data format (specifically LL16) and floating point data format (specifically FP16); the contents of the table may be precomputed using any circuitry and/or technique now known or later developed;

FIG. 6B illustrates a schematic/flow block diagram of exemplary data format conversion circuitry wherein logic circuitry converts or transforms data/values (Input), having a logarithmic data format, to data/values having a floating point data format (Output) using a y=$2^x$ computing technique, according to certain aspects of the present inventions; in this embodiment, the fraction field (G) of the data/value is adjusted with logic gates, an adder (add block) and a multiplexer (mux block);

FIGS. 6C-6E illustrate circuit block diagrams of the schematic/flow block diagram of exemplary data format conversion circuitry of FIG. 6B wherein each circuit block diagram provides different levels of precision; in one embodiment (FIG. 6C), the LL16 to FP16 conversion circuitry, having moderate precision, may implement the conversion of the fraction field using, for example, approximately 30 logic gates, the x-bit adder and x-bit multiplexer (e.g., x=7); in another embodiment (FIG. 6D), the LL16 to FP16 conversion circuitry, having greater precision than the embodiment of FIG. 6C, may implement the conversion circuitry using a y=$2^x$ computing technique; in one embodiment (FIG. 6E), the level of precision of the conversion from LL16 to FP16 via the conversion circuitry is greater than the embodiments of FIGS. 6C and 6D, wherein the logarithmic data format to floating point format conversion circuitry providing a level of precision of the data conversion (here, computing y=$2^x$)—for example, 32 or 64 bit precision from logarithmic data format to floating point data format; as noted above, the present inventions may employ any data format conversion circuitry or method to convert, modify, expand/contract and/or adjust the data format of the image/input data into logarithmic data format now known or later developed—all of which are intended to fall within the scope of the present inventions;

FIG. 7 illustrates exemplary floating point data formats having different widths or lengths, including respective ranges, and exemplary logarithmic data formats having different widths or lengths, including respective ranges, wherein the logarithmic data formats may be "equivalent" to the floating point data formats; notably, the three logarithmic data formats utilize a signed-magnitude numeric format for the sign field S and fraction field G wherein the fraction field G has a most-significant weight of 0.5, and no hidden (implicit) bit, so it includes unnormalized values; the exponent field is a two's complement numeric format to which a bias of 127 is added; the minimum and maximum exponent values are reserved for special operands or characters (NAN, INF, DNRM, ZERO);

FIG. 8 illustrates an exemplary number space for the logarithmic data format (LL16) wherein the minimum and maximum exponent E[7:0] are reserved for special operands (NAN, INF, ZRO); a NAN value is generated when an undefined operation takes place (0*∞ or ∞-∞); ±INF values are the saturation value for exponent overflow; ±ZRO values are the saturation value for exponent underflow. EXP[7:0] =8'b00000000) shows the binade corresponding to DNRM values for a floating point data format (FP16) wherein it responds like the other binades, except that G[1:7] =7'b0000000 is reserved for ZRO;

Figures 9A, 9B, 9C:
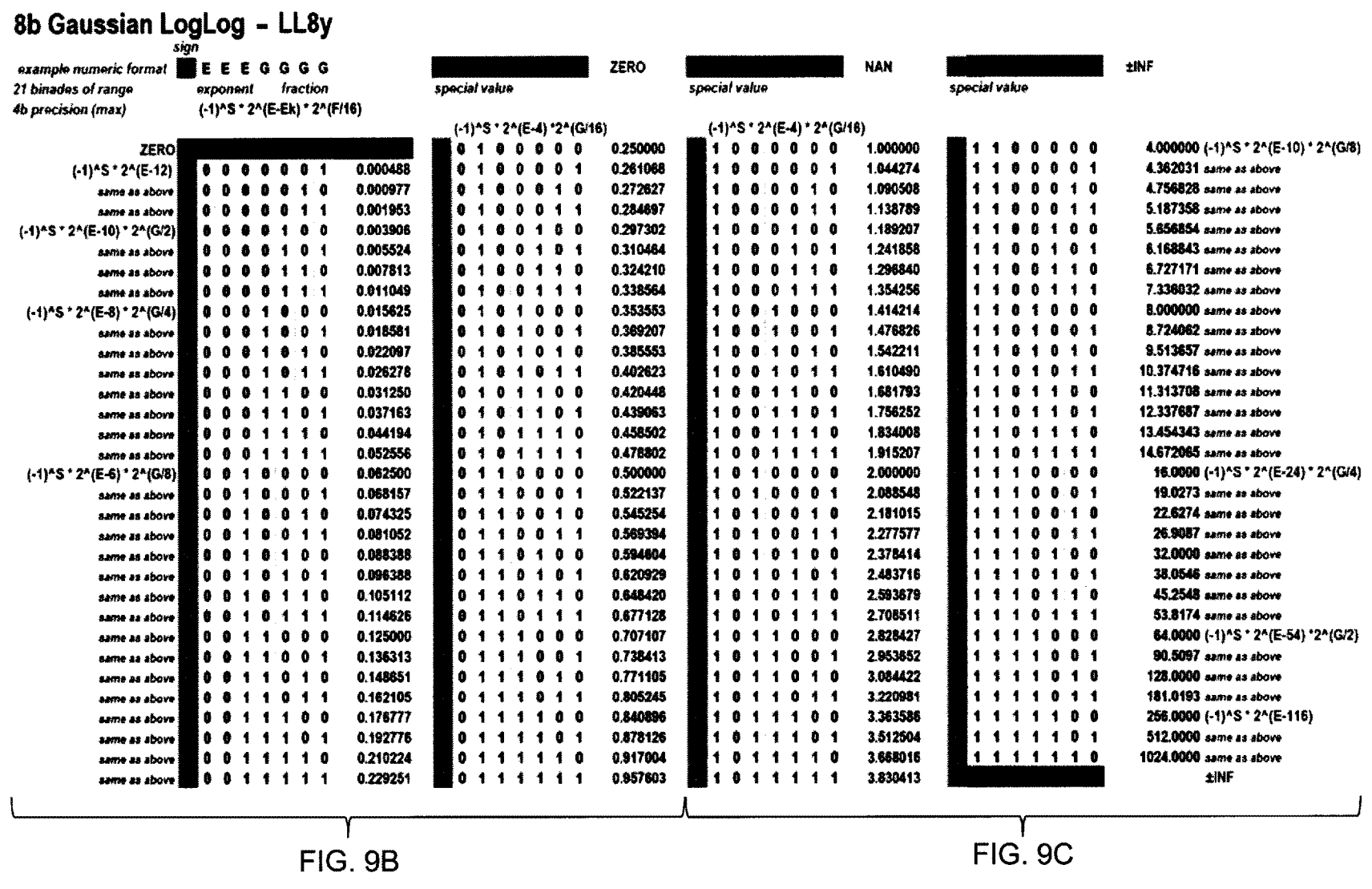

FIG. 9A illustrates an exemplary encoding technique for logarithmic data format (LL8y) having a 1 bit sign field (S), a 3 bit exponent field (E), and a four bit fraction field (F), as implemented in connection with certain data (e.g., filter weights/coefficients), according to certain embodiments of the present inventions—for example, in relation to implementation of conversion circuitry employing a look-up table; notably, similar or corresponding look-up tables may be employed, provided and/or generated in relation to other logarithmic data formats (e.g., LL8x and LL8z));

FIGS. 9B and 9C each illustrate selected portions, as identified in FIG. 9A, of the encoding technique for logarithmic data format (LL8y), in accordance with an embodiment of certain aspects of the present inventions;

FIG. 10A illustrates exemplary encoding technique for logarithmic data format (LL8y) having a 1 bit sign field (S), a 3 bit exponent field (E), and a four bit fraction field (F), as implemented in connection with certain data (e.g., filter weights/coefficients) of certain embodiments of the present inventions—for example, in relation to a data format conversion circuitry implementing a look-up table; in this graphical illustration, an exemplary floating point format (LL8y) includes a range and a precision which are configurable (e.g., dynamically), according to one embodiment of the present inventions; notably, the "allowable" number space, below the horizontal line depicts the logarithmic data format LL16 as graphically represented in relation to the logarithmic data formats of LL8x, LL8y and LL8z; the range and precision of the LL8y includes a center four binades (−2 to +2) it has the same precision (4 bits) as the FP8 format— however unlike the FP8, the precision of the LL8y format falls off symmetrically; there are zero bits of precision (a single value) in the three binades from −11 to −8 and in the two binades from +8 to +10; the symmetrical falloff of LL8y is similar to the falloff seen in the distribution of data weight values for image filtering applications; the INT8 format, in contrast, has a falloff with the binades in the negative direction but a hard edge in the width of the binades in the positive direction; the LL8x format is depicted wherein in the center two binades (−1 to +1) it has one more bit of precision (5 bits) than the LL8y format; like LL8y, the precision of the LL8x format falls off symmetrically. There are zero bits of precision (a single value) in the binade from −5 to −6 and at the binade at +5; in addition, the LL8z format is also depicted wherein in the center eight binades (−4 to +4) it has one less bit of precision (3 bits) than the LL8y format discussed earlier; like LL8y format, the precision of the LL8x format falls off symmetrically; in addition, there are zero bits of precision (a single value) in the binades from −19 to −12 and in the binades from +12 to +18; notably, the a primary benefit of the set of three floating point formats (LL8x, LL8y, LL8z) is that they provide a plurality of alternative implementations/embodiments that offer variations in range and precision; this may reduce rounding error and saturation error when the data values are used;

FIG. 10B illustrates the "allowable" number space, below the horizontal line depicts the logarithmic data format LL16, as illustrated in FIG. 10A, and the INT8 format which includes a falloff with the binades in the negative direction but a hard edge in the width of the binades in the positive direction, as illustrated in FIG. 10A;

FIGS. 10C-10E illustrate a graphical representations of the logarithmic data formats LL8x, LL8y, LL8z as illustrated in FIG. 10A; notably, FIG. 10C isolates (relative to FIG. 10A), to provide greater clarity, the encoding techniques for logarithmic data format LL8x, FIG. 10D isolates (relative to FIG. 10A), to provide greater clarity, the encoding techniques for logarithmic data format LL8y, and FIG. 10E isolates (relative to FIG. 10A), to provide greater clarity, the encoding techniques for logarithmic data format LL8z;

FIG. 11 illustrates the special operands or characters SD/ED/GD fields of the logarithmic addition circuitry, according to aspects of the present inventions; notably, details for SD/ED/GD fields for interaction cases are set forth in three 4×4 tables wherein each table includes four cases {ZRO, NRM, INF, NAN)} for each operand, with the A operand along the horizontal axis and the B operand along the vertical axis; here, the three tables include, from left to right, the sign SD, the exponent ED[7:0], and the fraction GD[0:7] of the result/output of the logarithmic addition circuitry for these different A and B operand values;

FIG. 12A illustrates a schematic block diagram of an exemplary logical overview of an exemplary processing circuit include both logarithmic addition-accumulator circuitry and multiplier-accumulator circuitry, according to one embodiment of the present inventions, wherein the exemplary processing circuitry is configurable to implement logarithmic addition and accumulate (LAC) operations as well as multiply and accumulate (MAC) operations; notably, mode selection circuitry may generate and issue a mode or modal control signal "MODE" to select or enable which processing format option is employed in the filtering operation/application wherein when the LAC is enabled/selected, the logarithmic addition-accumulator circuitry and data path performs or implements logarithmic addition and accumulate operations and when the MAC is enabled/selected the multiplier-accumulator circuitry and data path performs or implements multiply and accumulate operations; the mode select circuitry may responsively control (i.e., enable and/or disable) the operability of the logarithmic addition-accumulator circuitry and the multiplier-accumulator circuitry to select the circuitry employed to processes the image data, for example, in connection with inferencing operations by controlling, determining or enabling a data path of the processing to include logarithmic addition-accumulator circuitry or the multiplier-accumulator circuitry; and FIG. 12B illustrates a schematic block diagram of another exemplary logical overview of an exemplary processing circuit include both logarithmic addition-accumulator circuitry and multiplier-accumulator circuitry, according to one embodiment of the present inventions, wherein the exemplary processing circuitry is configurable to implement logarithmic addition and accumulate (LAC) operations as well as multiply and accumulate (MAC) operations and includes conversion circuitry to convert the data format of the input data/values and the filter weights from a floating point data format to a logarithmic data format; notably, mode selection circuitry may generate and issue a mode or modal control signal "MODE" to select or enable which processing format option is employed in the filtering operation/application wherein when the LAC is enabled/selected, the data format conversion circuitry are employed to convert the input data and the filter weights to a logarithmic data format (FPxx to LLxx (e.g., FP24 to LL16, and FP8 to LL16)) and the logarithmic addition-accumulator circuitry and data path performs or implements logarithmic addition and accumulate operations; and wherein when the MAC is enabled/selected, via the mode select signal, the multiplier-accumulator circuitry and data path performs or implements multiply and accumulate operations and the data format conversion circuitry are not employed; the mode select circuitry may responsively control (i.e., enable and/or disable) the operability of the logarithmic addition-accumulator circuitry and the multiplier-accumulator circuitry to select the circuitry employed to processes the input data/values (e.g., image data), for example, in connection with inferencing operations by controlling, determining or enabling a data path of the processing to include logarithmic addition-accumulator circuitry or the multiplier-accumulator circuitry; notably, in addition, that circuitry (e.g., LAC or MAC) which is not selected or not enabled may also be electrically disabled to, for example, reduce and/or minimize power consumption and spurious or unnecessary noise.

Again, there are many inventions described and illustrated herein. The present inventions are not limited to illustrative exemplary embodiment including with respect to: (i) particular floating point data format(s), particular fixed point data format(s), particular logarithmic data format, block/data width or length, data path width, bandwidths, values, processes and/or algorithms illustrated, or (ii) the exemplary logical or physical overview configurations, exemplary circuitry configuration and/or exemplary Verilog code. Indeed, although several of the exemplary embodiments and features of the inventions are illustrated in the context of floating point data format (e.g., FP16 or FP24) and logarithmic data format (e.g., LL8 or LL16), the embodiments and inventions are applicable of other precisions (e.g., FPxx where: 8≤xx≤39), and LLxx where: 8≤xx≤24). For the avoidance of doubt, the precisions of the data formats need not be equal. Moreover, for the sake of brevity, precisions other than those illustrated and/or described herein are intended to fall within the scope of the present inventions and will be quite clear to one skilled in the art based on, for example, this application.

The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed or illustrated separately herein.

DETAILED DESCRIPTION

In a first aspect, the present inventions are directed to one or more integrated having logarithmic addition-accumulator circuitry (and methods of operating such circuitry) wherein input data (e.g., image data) is processed, at least partially, based a logarithmic data format, for example, in connection with inferencing operations. In one embodiment, the present inventions include a plurality of logarithmic addition-accumulator circuits (also referred to, at times, as "logarithmic addition-accumulate circuits") interconnected, for example, in series, to pipeline logarithmic addition and accumulate operations. Data format conversion circuitry may be employed to convert or transform the input data, having a first or initial data format, for example, a floating point data format or a fixed point data format, to logarithmic data format (e.g., having a base 2)—in the event the data is not in the logarithmic data format. After the input data are processed, logarithmic addition, in connection with filter weights, in one embodiment, the data format conversion circuitry converts or transforms the sum data to a different data format (e.g., the initial data format, for example, a floating point format) for subsequent processing. The data format conversion circuitry, in one embodiment, changes, transforms and/or converts the data format of the input data/values by remapping the value of the fraction field of each input data/value from floating point data format into the logarithm of the value of the faction field and, after logarithmic addition operation, remapping the value of the fraction field of each sum data from logarithmic data format into a floating point data format.

For example, in operation, the image data, in the logarithmic data format, is added to the image filter weights or coefficients, which are also in a logarithmic data format (e.g., having a base 2). The filter weights or coefficients, employed in the image data processing, may be stored in memory in a logarithmic data format or a format that is different from the logarithmic data format and converted or transformed to a logarithmic data format before processing (e.g., immediately before processing). After logarithmic addition, the processed image data may be converted or transformed to another/different data format (e.g., a floating point format or fixed point format—for example, back to the data format of the input data—however, the length of the value may be the same or different) for additional/subsequent processing.

In another aspect, the present inventions are directed to one or more integrated circuits (and methods of operating such circuits) including a plurality of execution or processing pipelines, having logarithmic addition-accumulator circuitry, that process data, based on a logarithmic data format to, for example, generate processed image data. For example, each execution or processing pipeline includes a plurality of logarithmic addition-accumulator circuits to process data, for example, as discussed above. In one embodiment, in operation, the image data (which may be in a floating point data format) is provided to plurality of execution or processing pipelines, each pipeline including a plurality of logarithmic addition-accumulator circuits. Here, the data (e.g., image data having a floating point or fixed point data format) are initially converted or transformed to a logarithmic data format (via format conversion circuitry), and thereafter the data are added to associated image filter weights or coefficients (which are in or have been transformed/converted into a logarithmic data format) via logarithmic addition/adder circuitry of plurality of logarithmic addition-accumulator circuitry. In one embodiment, the output of the logarithmic addition/adder circuitry (i.e., sum data) are applied or provided to format conversion circuitry to convert or transform the logarithmic data format of the sum/output from the logarithmic addition/adder circuitry to a different data format—for example, a data format that facilitates or is consistent with subsequent processing (e.g., floating point data format) of the processing circuitry. In this regard, the sum/output of the logarithmic addition-accumulator circuitry, in, for example, a floating point data format, may thereafter be further processed, via accumulator circuitry of plurality of logarithmic addition-accumulator circuitry, to implement accumulation operations of the processing circuitry. The accumulator circuitry accumulates a plurality of associated partially processed image data, for example, in connection with inferencing operations. Notably, plurality of execution or processing pipelines may function or operate concurrently.

In yet another aspect, the present inventions are directed to one or more integrated circuits having circuitry to implement logarithmic addition and accumulate operations as well as multiply and accumulate operations. Here, the one or more integrated circuits include logarithmic addition-accumulator circuitry to perform logarithmic addition and accumulate operations (e.g., as discussed herein) and multiplier-accumulator circuitry to perform multiply and accumulate operations (e.g., as discussed in detail below). One or more of the integrated circuits may include mode select circuitry to control (i.e., enable and/or disable) the operability and/or operation of the logarithmic addition-accumulator circuitry and the multiplier-accumulator circuitry to select the circuitry employed to processes the image data, for example, in connection with inferencing operations. In this regard, the mode select circuitry controls or determines the data processing, and circuitry employed therein, including logarithmic addition-accumulator circuitry or the multiplier-accumulator circuitry.

In one embodiment, mode select circuitry may be one-time programmable; in another embodiment, the mode select circuitry is a more than one-time programmable (i.e., multiple times). The mode select circuitry may be programmed, for example, in situ (i.e., during operation of the integrated circuit), at manufacture, and/or at or during power-up, start-up, initialization, re-initialization, configuration, re-configuration or the like. For example, the mode select circuitry may receive mode select signals from internal or external circuitry (i.e., external to the one or more integrated circuits—for example, a host computer/processor) including one or more data storage circuits (e.g., one or more memory cells, register, flip-flop, latch, block/array of memory), one or more input pins/conductors, a look-up table LUT (of any kind), a processor or controller and/or discrete control logic. The mode select circuitry, in response thereto, may employ such signal(s) to enable or disable selected processing circuitry (as the case may be) and thereby implement (e.g., in situ and/or at or during power-up, start-up, initialization, re-initialization, configuration, re-configuration or the like) one of the modes of processing (i.e., logarithmic addition and accumulate operations or multiply and accumulate operations).

As noted above, in one aspect, the present inventions are directed to one or more integrated circuits having logarithmic addition-accumulator circuitry (and methods of operating such circuitry) including, in one embodiment, a plurality of execution or processing pipelines, each having a plurality of logarithmic addition-accumulator circuitry. For example, with reference to FIGS. 1A-1C, in one embodiment of the present inventions, the logarithmic addition-accumulator circuitry ("LAC") is implemented in an execution pipeline. In one exemplary embodiment, "m" (e.g., 64 processing circuits in the illustrative embodiment) LAC processing circuits in the execution pipeline perform logarithmic addition and accumulate operations whereby the processing circuits perform m×m (e.g., 64×64) logarithmic addition-accumulate operations in each r (e.g., 64) cycle interval (here, a cycle may be nominally 1 ns). In operation, input pixel/data (Do—e.g., 64) are output from memory (illustrated, in this embodiment, as L2 SRAM) into format conversion circuitry which converts or translates the data format of the input pixel/data (Do) into a logarithmic data format (e.g., having a base 2) and thereafter outputs the input pixel/data (Do) into the circuitry of the execution pipeline. In addition, filter weights or coefficients are output from memory (illustrated, in this embodiment, as L2) into format conversion circuitry, which converts or translates the data format of the filter weights into a logarithmic data format (e.g., having a base 2) and thereafter outputs the filter weights, having a logarithmic data format, into memory (illustrated, in this embodiment, as L1 SRAM) for access by the execution pipeline during performance of the logarithmic addition and accumulate operations. In one embodiment, the data format conversion circuitry may in addition to converting the data format of the filter weights to a logarithmic data format, or in lieu thereof (e.g., where the filter weights already are in a logarithmic data format), adjusts the length of the filter weights from 8 bit to 16 bit.

In this exemplary embodiment, the execution or processing pipelines shift-in new input pixels/data (e.g., 64) and shift-out previous output pixels/data ($Y_D$) during the same m (e.g., 64) cycle interval. Notably, each m (e.g., 64) cycle interval processes a Dd/Yd (depth) column of input and output pixels/data at a particular (i,j) location (the indexes for the width Dw/Yw and height Dh/Yh dimensions). The m (e.g., 64) cycle execution interval is repeated for each of the Dw*Dh depth columns for this stage.

In this exemplary embodiment, the filter weights or coefficients, after conversion into the logarithmic data format via the format conversion circuitry, are stored in or loaded into memory (e.g., the L1/L0 SRAM memories) before the LAC circuit initiates processing of the input data/values. In this particular example, the input stage has Dw=512, Dh=256, and Dd=128, and the output stage has Yw=512, Yh=256, and Yd=64. Note that only 64 of the 128 Dd input planes are processed in each 64×64 LAC execution step. Notably, the present inventions may employ or implement aspects of the circuitry, architectures and integrated circuits that facilitate pipelining of the multiply and accumulate operations, as described and/or illustrated in U.S. patent application Ser. No. 16/545,345, filed on Aug. 20, 2019. Although the '345 application describes and illustrates multiplier-accumulator circuitry, the circuitry and operation thereof may, in lieu of the multiplication circuitry, or in addition thereto, substitute/implement logarithmic addition circuitry to facilitate concatenating the logarithmic addition and accumulate operations consistent with the present inventions. The '345 application is hereby incorporated by reference in its entirety.

With continued reference to FIG. 1A, the data processing flow illustrated may accommodate arbitrary image/data plane dimensions (Dw/Yw and Dh/Yh) by simply adjusting the number of iterations of the basic 64×64 LAC accumulation operation that are performed. The loop indices "I" and "j" are adjusted by control and sequencing logic circuitry to implement the dimensions of the image/data plane. Moreover, the data processing flow or method may also be adjusted and/or extended to handle a Yd column depth larger than the number of LAC processing circuits (e.g., 64 in this illustrative example) in the execution pipeline. In one embodiment, this may be implemented by dividing the depth column of output pixels into blocks of 64, and repeating the 64×64 LAC accumulation of FIG. 1A for each of these blocks.

Indeed, the data processing flow or method illustrated in FIG. 1A may be further extended to handle a Dd column depth larger than the number of LAC processing circuits (64 in this illustrative example) in the execution pipeline. This may be implemented, in one embodiment, by initially performing a partial accumulation of a first block of 64 of the input pixels Dijk into each output pixel Yijl. Then, on a second operation step, these partial accumulation values Yijl are read back into the execution pipeline as initial values for a continuing accumulation of the next block of 64 input pixels Dijk into each output pixel Yijl. The memory which stores or holds the continuing accumulation values (e.g., L2 memory) may be organized, partitioned and/or sized to accommodate any extra read/write bandwidth to support the operation.

These techniques, which generalize the applicability of the 64×64 MAC execution pipeline, may also be utilized or extend the generality of the additional methods that will be described in later sections of this application.

Notably, FIG. 1A illustrates an exemplary embodiment of logarithmic addition and accumulate operations in connection with one or more additional 64-LAC execution pipelines according to certain aspects of the present inventions. In this embodiment, the 64×64 Fkl filter weights are distributed across the 64 L0 SRAMs (there is one L0 SRAM in each of the 64 processing circuits). In each execution cycle, 64 Fkl values (green) will be read and passed to the LAC circuits. The Dijk data values are held in one processing circuit during the 64 execution cycles after being loaded from the Dijk shifting chain (orange). In this illustrative embodiment, the data formats of the filter weights and the input/pixel data are converted, via format conversion circuitry, to a logarithmic data format, before input into the pipelines.

The Yijl LAC values will be rotated through all 64 processing circuits during the 64 execution cycles after being loaded from the Yijl shifting chain and will be unloaded with the same shifting chain. Here, FIG. 1A illustrates the looping performed by the control and sequencing logic associated with the LAC execution pipeline. This looping shows the accumulation of the products of Dijk input data/pixels and Fkl filter values into partial sums Yijl. In this embodiment, the partial sums Yijl are then accumulated into the final output pixel values Yijl.

Notably, with reference to FIG. 1A, in one embodiment, the processing stage may utilize additional 64-LAC execution pipelines in parallel to operate concurrently on other pixels/data (i,j) of the input frame or data layers. In this embodiment additional L2 memory ports may be employed (e.g., by dividing, segmenting or splitting the L2 memory across multiple physical SRAM blocks). Here, the concurrent LAC execution pipeline operation duplicates the weight data (labeled as Fkl) across the memory (e.g., L0 memory) in the parallel execution pipelines. Notably, in the exemplary embodiment illustrated in FIG. 1A, the input stage has Dw=512, Dh=256, and Dd=128, and the output stage has Yw=512, Yh=256, and Yd=64.

The present inventions may employ and/or implement the architectures of the execution or processing pipelines (and methods of operating such circuitry) to process data, concurrently or in parallel, to increase throughput of the pipeline—for example, as described and/or illustrated in U.S. patent application Ser. No. 16/816,164 and U.S. Provisional Patent Application No. 62/831,413; the '164 and '413 applications are hereby incorporated by reference in its entirety. Here, a plurality of processing or execution pipelines, each including a plurality of LAC circuits, may concurrently process data to increase throughput of the data processing and overall pipeline.

FIG. 1B illustrates an exemplary embodiment of the circuitry, in block diagram form, of a LAC execution pipeline of FIG. 1A, according to certain aspects of the present inventions, wherein a "logarithmic" floating point format is employed such that the logarithmic addition circuitry logarithmically adds the input data/values, in logarithmic data format (e.g., base 2), to the filter weights or coefficients (in a logarithmic data format (e.g., base 2)) during the execution process. The conversion circuitry remaps the binary value in the fraction field of the input data/values from a standard floating point format into the logarithm of that binary value.

Briefly, the input image/pixel data (D) are read from memory (e.g., L2 memory bank—SRAM). In one embodiment, the input image/pixel data is in a floating point data format (e.g., FP24-24 bits for sign, exponent, fraction). Here, the input image/pixel data was acquired (raw image data) or may have been earlier generated via a filtering operation and thereafter stored in memory.

In one embodiment, the input image/pixel data are read from memory to format conversion circuitry and thereby converted "on-the-fly" into a logarithmic data format (e.g., LL16 format—a 16 bit value which may have the same number of bits as the FP16 format (but will be interpreted differently)). Thus, the input image/pixel data, in logarithmic data format, is output by the data format conversion circuitry and input/shifted into the processing circuitry of the LAC using the loading register "D_SI". The input data/values, in logarithmic data format, may also be parallel-loaded into the same data register "D" for the execution process.

With reference to FIGS. 1A, 1B and 1F, in one embodiment, the filter weights or coefficients were previously converted to a logarithmic data format (e.g., LL8—logarithmic data format having 8 bits for sign, exponent, fraction) and stored in memory (L2 in this illustrative embodiment, which may be SRAM). For example, the filter weights or coefficients, in one embodiment, may be read from memory (L2) and converted, transformed and/or modified "on-the-fly", via the format conversion circuitry, to an appropriate logarithmic data format (e.g., LL8 format into LL16 format) for storage in memory (here, the L1 memory level—e.g., SRAM). Thereafter, the filter weights or coefficients may be accessed by processing circuitry in connection with the logarithmic addition and accumulation operations.

In another embodiment, the filter weights or coefficients are stored in memory (L2) in a floating point or fixed point data format and thereafter converted or transformed to a logarithmic data format via data format conversion circuitry. For example, with reference to FIG. 1G, in one embodiment, the filter weights or coefficients are read from memory (L2) to format conversion circuitry and converted or transformed from a floating point data format to a logarithmic data format (e.g., FP8 to LL16 format in the illustrative embodiment). Indeed, the filter weights or coefficients, in an integer data format (INT) or a block scaled-fraction data format (BSF), may be read from memory (L2), and thereafter converted or transformed to logarithmic data format (e.g., from INT8 to LL16; or, e.g., BSF8 to LL16).

With reference to FIGS. 1A, 1B, 1E, 1F, 1G and 1H, in operation, the filter weights are read from memory (L1 memory) and stored in a memory (L0—e.g., SRAM) which is local/dedicated to the particular LAC processing circuit prior to initiation of processing of the input data/values (having a logarithmic data format). Thereafter, circuitry of the processing pipeline reads the filter weights or coefficients (having a logarithmic data format) from L0 memory and implements the logarithmic addition operations. In one embodiment, the filter weights or coefficients are read and loaded into the filter weight register "F" for the processing via the logarithmic addition-accumulate circuitry. Here, the execution process takes data from the "D" and "F" registers (in this illustrative embodiment, both data/values in LL16) and sums/adds the image data and filter weights, via logarithmic addition circuitry (see circuit block "LL16 MUL" in the exemplary circuitry block diagram of FIGS. 1B and 1H). In this embodiment, the logarithmic addition circuitry employs fixed-point addition.

Thereafter, the sum data (LL16) is output to format conversion circuitry to convert the data/values from a logarithmic data format into a data format that facilitates or is consistent with further processing (e.g., floating point or fixed point data formats). (See, FIGS. 1A, 1B, 1E, 1F, 1G and 1H). In one embodiment, the partially processed image/input data (in this particular embodiment, sum/output data having a LL16 format) is converted, via data format conversion circuitry, into a floating point data format (e.g., FP16 format) to facilitate additional/subsequent processing via accumulate circuitry. With continued reference to FIGS. 1A, 1B, 1E, 1F, 1G and 1H, in one embodiment, the partially processed data (in a FP16 data format) is provided to the accumulation stage, via the "D*F" register, and a plurality of partially processed image data are accumulated (for example, with FP24 precision), via accumulate circuitry, and output to memory (here, the "Y" register). In one embodiment, after each result "Y" has accumulated 64 sums/products, the accumulation totals are parallel-loaded into the "MAC-SO" registers. Such data may be serially output (e.g., shifted out) during the next execution sequence. Here, the temporary sums Yijlk LAC values will be rotated through the processing circuits (in this illustrative embodiment, 64) during the execution cycles after being loaded from the Yijk shifting chain, will be unloaded with the same shifting chain, and then accumulated into the final output pixel/data values Yijl. (See, e.g., FIG. 1A).

Notably, in one embodiment, the input data/values (e.g., image data) are stored in memory (e.g., L2) in a logarithmic data format such that the format conversion circuitry disposed in the data path thereof is unnecessary. In another embodiment, in addition thereto, or in lieu thereof, the filter weights or coefficients are stored in memory (e.g., L2) in logarithmic data format having an appropriate bit length such that the format conversion circuitry disposed in the data path thereof is unnecessary.

Moreover, in one embodiment, the format conversion circuitry associated with the filter weights or coefficients is disposed in the data path between memory L1 and memory L0. Alternatively, the format conversion circuitry associated with the filter weights or coefficients is disposed in the data path between memory L0 and the logarithmic addition-accumulate circuitry.

With reference to FIG. 1C, in this illustrative embodiment, each 64-LAC execution pipeline has its own L0 memory (e.g., SRAM), and each 16×64-LAC cluster includes a shared L1 memory (e.g., SRAM). The shift-in and shift-out data paths of the 64-LAC execution pipeline are coupled to memory (in this embodiment, the L2 memory (e.g., SRAM)), which also couples to one or more additional/other memory (in this embodiment, L1/L0 memories). A network-on-chip (NOC) couples the L2 memory to the PHY (physical interface) for the L3 memory (in this embodiment, external memory (e.g., DRAM)). The NOC also couples to a PCIe PHY which, in turn, may couple to an external host computer/processor. Notably, in one embodiment, the NOC also couples to GPIO input/output PHYs, which allow multiple X1 components to be operated—for example, in one embodiment, concurrently.

FIG. 1C illustrates an exemplary embodiment of the circuitry of a logic tile, including a plurality of execution pipelines and resources, according to certain aspects of the present inventions wherein the circuitry of the pipelines implement LAC execution pipelines; notably, in the illustrative embodiment, the logic tile includes four clusters, each consisting of 16 64-LAC execution pipelines wherein an exemplary 64-LAC execution pipeline is illustrated in block diagram form for reference. Where the integrated circuit includes a plurality of such logic tiles, the logic tiles may be interconnected. As noted above, the present inventions may employ or implement aspects of the circuitry, architectures and integrated circuits as described and/or illustrated in U.S. patent application Ser. No. 16/545,345, filed on Aug. 20, 2019. Although the '345 application describes and illustrates multiplier-accumulator circuitry, the circuitry and operation thereof may, in lieu of the multiplication circuitry, or in addition thereto, substitute/implement logarithmic addition circuitry and conversion circuitry to facilitate concatenating the logarithmic addition and accumulate operations consistent with the present inventions. The other features described and illustrated in the '345 application, including, for example, the architectures, circuitry of the interconnect network, and NLINX interface connector, may also be employed in conjunction with the inventions described and illustrated herein. Again, the '345 application is hereby incorporated by reference in its entirety.

The logarithmic addition-accumulator circuits may be interconnected into execution or processing pipelines and architectures as described and/or illustrated in U.S. Provisional Patent Application No. 63/012,111 (which refers to MACs); the 63/012,111 application is incorporated by reference herein in its entirety. In one embodiment, the circuitry configures and controls a plurality of separate logarithmic addition-accumulator circuits (rather than MAC circuits referred to therein) or rows/banks of interconnected (in series) logarithmic addition-accumulator circuits (referred to, at times, as "clusters") to pipeline logarithmic addition and accumulate operations. In one embodiment, the interconnection of the pipeline or pipelines are configurable or programmable to provide different forms of pipelining—as set forth in the '111 application. Here, the pipelining architecture provided by the interconnection of the plurality of logarithmic addition-accumulator circuits may be controllable or programmable. In this way, a plurality of logarithmic addition-accumulator circuits may be configured and/or re-configured to form or provide the desired processing pipeline(s) to process data (e.g., image data) as described in the '111 application in the context of MACs.

For example, with reference to the '111 application, in one embodiment, control/configure circuitry may configure or determine the logarithmic addition-accumulator circuits described herein, or rows/banks of interconnected logarithmic addition-accumulator circuits are interconnected (in series) to perform the logarithmic addition and accumulate operations and/or the pipelining architecture or configuration implemented via connection of logarithmic addition-accumulator circuits (or rows/banks of interconnected logarithmic addition-accumulator circuits). Thus, in one embodiment, the control/configure circuitry described and illustrated in the '111 application configures or implements an architecture of the execution or processing pipeline by controlling or providing connection(s) between logarithmic addition-accumulator circuits and/or rows of interconnected logarithmic addition-accumulator circuits employing any of the logarithmic addition-accumulator circuit embodiments described herein.

With reference to FIG. 1C, as noted above, the integrated circuit may include a plurality of multi-bit LAC execution pipelines which are organized as clusters of a component. Here, the component may include "resources" such as a bus interfaces (e.g., a PHY and/or GPIO) to facilitate communication with circuitry external to the component and memory (e.g., SRAM and DRAM) for storage and use by the circuitry of the component. For example, in one embodiment, four clusters are included in the component (which may, at times, be labeled "X1") wherein each cluster includes a plurality of multi-bit MAC execution pipelines (in this illustrative embodiment 16 64-LAC execution pipelines). Notably, a single 64-LAC execution pipeline of FIGS. 1A and 1B is illustrated at the upper right for reference purposes.

With continued reference to FIG. 1C, the memory hierarchy in this exemplary embodiment includes an L0 memory resource that is associated with each 64 LAC execution pipeline. A larger L1 SRAM memory resource is associated with each cluster of 16×64 LAC execution pipelines. These two memories may store, retain and/or hold the filter weight values Fijklm (whether in a logarithmic data format or not (e.g., FP data format)) employed in the logarithmic addition operations.

Notably, the embodiment of FIG. 1C may employ a still larger L2 memory (SRAM) and an even larger external L3 memory (DRAM) that are both shared by all four of clusters of 16×64 LAC execution pipelines. These memories store or hold the input image pixels Dijk and the output image pixels Yijl, as well as filter weight values Fijklm.

As mentioned above, in the illustrative embodiments set forth herein (text and drawings), the logarithmic addition-accumulator circuitry is, at times, labeled "LAC" or "LAC pipeline".

As noted above, the circuitry of the execution pipelines may concurrently process data to increase throughput of the pipeline. For example, in one implementation, the present inventions may include a plurality of separate logarithmic addition-accumulator circuits (referred to herein (including the text/figures of the applications incorporated by reference), at times, as "LAC") and a plurality of registers (including, in one embodiment, a plurality of shadow registers—see, for example, the '345 application) that facilitate pipelining of the logarithmic addition and accumulate operations wherein the circuitry of the execution pipelines concurrently process data to increase throughput of the pipeline. Here, the present inventions may implement the concurrent and/or parallel processing techniques of the multiplier-accumulator execution or processing pipelines (and methods of operating such circuitry) which increase throughput of the pipelines, as described and/or illustrated in U.S. patent application Ser. No. 16/816,164 and U.S. Provisional Patent Application No. 62/831,413. In one embodiment, the execution or processing pipelines (including the logarithmic addition-accumulator circuits) of the present inventions may be interconnected in a ring configuration or architecture to concurrently or in parallel process data as described in the '164 and '413 applications. Here, a plurality of LAC execution pipelines of one or more (or all) of the clusters of one or more X1 components (which may be integrated/manufactured on a single die or multiple dice) may be interconnected in a ring configuration or architecture (wherein a bus interconnects the components) to concurrently process related data. Again, although the '164 and '413 applications describe and illustrate multiplier-accumulator circuitry (MAC circuitry), the circuitry and operation thereof may, in lieu of the multiplication circuitry, or in addition thereto, substitute/implement logarithmic addition circuitry to facilitate concatenating the logarithmic addition and accumulate operations consistent with the present inventions.

With reference to FIGURES FIGS. 1A, 1B, 1E, 1F and 1G, the input data/values are input into the logarithmic addition-accumulator circuitry (or pipeline circuitry) and, where the image/input data are in a data format that is different from logarithmic data format, the image/input data is converted into the logarithmic data format via format conversion circuitry. For example, where the input data/values are in a floating point data format, the format conversion circuitry converts the image data from the floating point data format into a logarithmic data format before processing by the logarithmic addition-accumulator circuitry. The present inventions may employ any data format conversion circuitry or method to convert, modify, expand/contract and/or adjust the data format of the image/input data into logarithmic data format now known or later developed—all of which are intended to fall within the scope of the present inventions.

With reference FIG. 1D, in one embodiment, the MAC-based processing circuitry and the LAC-based processing are similar in many respects. For example, each include format conversion circuitry in the data path from memory (e.g., L2 memory) to the processing circuitry of the execution pipeline. In the illustrative embodiment, the filter weights or coefficients include a data format conversion of FP8-to-FP16 (MAC-based processing circuitry) and LL8-to-LL16 (LAC-based processing circuitry), and the image/input data include a data format conversion of FP24-to-FP16 (MAC-based processing circuitry) and FP24-to-LL16 (LAC-based processing circuitry). The MAC-based processing circuitry and the LAC-based processing, differ, however, in that the MAC-based processing circuitry includes multiplication circuitry to multiple the filter weights or coefficients and the image/input data (see FP16 MUL block in MAC-processing circuit portion of FIG. 1D) and the LAC-based processing circuitry includes addition circuitry to sum the filter weights or coefficients and the image/input data the (see LL16 MUL block in LAC-processing circuit portion of FIG. 1D). Notably, in the illustrative embodiment, the LAC-based processing circuitry also data format conversion circuitry (i.e., LL16-to-FP16 conversion block) to convert the partially processed image/input data into a data format that is different from a logarithmic data format to facilitate subsequent data processing.

In one embodiment, the format conversion circuitry employs a look-up table to translate or convert the image/input data into logarithmic data format wherein the logarithmic data format "equivalent" of each input data/value is pre-computed and stored and/or encoded in memory (e.g., a non-volatile memory such as a ROM or flash memory). For example, with reference to FIGS. 2A and 2B, a floating point data format (e.g., FP16 or FP24, respectively) of the value of the fraction field of the input data/value may be converted to logarithmic data format (e.g., to LL16) using the circuitry/method based on a look-up table. Here, the logarithmic data format (LL16 in this illustrative embodiment) equivalent of the value in fraction field of the input data/value in a floating point data format (FP16 in this illustrative embodiment) may be pre-computed and stored and/or encoded in memory. In one embodiment, the FP16/LL16 formats may use a lookup table of approximately 900 bits.

Notably, the sign field and the value in exponent field may be converted or transformed using circuitry. Here, the values of exponent field "E" of the logarithmic data format (LL16) and floating point data format (FP16) are similar in that, in one embodiment, it is a biased value representing the integral value of the exponent base of the number (i.e., $2^{\wedge}(E\text{-Ebias})$). The "E-Ebias" value is the integral base-2 logarithm of the value/number of the exponent field. The standard floating point format mixes this integral logarithm in the exponent field with a binary fraction in the fraction field (also called the mantissa or significand) to (approximately) represent a real number. The logarithmic floating point data format, in this embodiment, mixes the integral logarithm in the exponent field with a fraction logarithm in the fraction field of the logarithmic data format to (approximately) represent a real number.

With continued reference to FIG. 2B, the input/image data having a floating point data format (FP24 data format in this illustrative embodiment) is converted to a logarithmic floating point format (LL16 data format in this illustrative embodiment). However, in this embodiment, rounding logic is employed before the lookup table to round the value of the fraction field of the floating point data format from 15 bits to 7 bits (here, the input is FP24 (eight more fraction bits than the FP16 format for the circuitry/method illustrated in FIG. 2A)). Here, the number of bits of the fraction field of the fraction field in the floating point data format (F) is rounded to correlate or correspond to the number of bits of the resulting faction field in the logarithmic data format (G). The data stored in the memory may also be encoded before storing in the non-volatile memory.

Moreover, in one embodiment, the look-up table includes pre-computed values that correlate the larger fraction field of the floating point data format to the smaller fraction field of the fraction field of an "equivalent" logarithmic data format. In this embodiment, the rounding logic is omitted or rounds fewer bit. For example, conversion circuitry that converts the image/input data from a floating point data format (e.g., FP24) to a logarithmic data format (e.g., LL24) "equivalent" of each input data/value is pre-computed and stored and/or encoded in memory.

In another embodiment, the data format conversion circuitry includes logic circuitry to convert the fraction field of the input/image data having a floating point data format to an equivalent logarithmic data format. For example, with reference to FIGS. 3A and 3B, the fraction field of the input/image value is adjusted with logic gates and a multiplexer stage. The conversion circuitry (FP16-to-LL16 in this illustrative embodiment) may implement the conversion of the fraction field using, for example, approximately 30 logic gates, the x-bit adder and x-bit multiplexer (e.g., x=7). (See, FIG. 3C). Notably, the embodiment of the data format conversion circuitry illustrated in FIG. 3C is a detailed implementation of the data format conversion block diagram illustrated in FIG. 3A—implementing the same method of computing y=LOG 2(x) providing a moderate level of precision of the data conversion; see FIG. 3D for a high level of precision of the data conversion (for example, 32 or 64 bit precision) from floating point data format to logarithmic data format. The result is the conversion value, correctly rounded to the destination format.

With reference to FIG. 3B, the conversion circuitry circuitry/method may also employ rounding logic (similar to the approach of FIG. 2B) to convert or transform the input data/value from a floating point data format to a logarithmic data format (FP24-to-LL16 in this illustrative embodiment). Here, the number of bits of the fraction field of the fraction field in the floating point data format (F) is rounded to correlate or correspond to the number of bits of the resulting faction field in the logarithmic data format (G). Thereafter, the logic of the conversion circuitry may convert the value of the fraction field using, for example, approximately 30 logic gates, the x-bit adder and x-bit multiplexer (e.g., x=7) (see, FIGS. 3C) and implements the technique of computing y=LOG 2(x) providing a moderate level of precision of the data conversion. FIG. 3D implements a technique for a high level of precision of the data conversion (for example, 32 or 64 bit precision) from floating point data format to logarithmic data format. The result is the conversion value, suitably rounded to the destination format to a predetermined number of bits of the fraction field ("G"—seven in this illustrative embodiment).

Moreover, the present inventions may also employ an extrapolation technique to convert the data format of the input data/values to a logarithmic floating point format.

As noted above, in one embodiment, the filter weights are converted, modified, expanded or adjusted, via format conversion circuitry, to an appropriate logarithmic data format. For example, with reference to FIGS. 1A, 1B and 1D-1F, where the filter weights or coefficients were previously converted to a logarithmic data format (e.g., LL8—logarithmic data format having 8 bits for sign, exponent, fraction) and stored in memory (L2 in this illustrative embodiment, which may be SRAM)—the filter weights or coefficients, in one embodiment, may be read from memory (L2) and converted, transformed and/or modified "on-the-fly", via the format conversion circuitry, to an appropriate logarithmic data format (e.g., LL8 format into LL16 format) and thereafter, stored in a more memory more local to one or more of the processing pipelines (here, the L1 memory level—e.g., SRAM). Thereafter, the filter weights or coefficients may be accessed by processing circuitry in connection with the logarithmic addition and accumulation operations.

With reference to FIGS. 1B, 1D, 1F, 4A and 4B, in one exemplary embodiment, the filter weights or coefficients are previously converted to a logarithmic data format (e.g., LL8—logarithmic data format having 8 bits for sign, exponent, fraction) and stored in memory (L2 in this illustrative embodiment, which may be SRAM). Notably, the conversion logic illustrated in FIG. 4A is similar to format conversion circuitry employed to convert the filter weights as described and/or illustrated in U.S. Provisional Application No. 62/961,627, filed Jan. 15, 2020, which is hereby incorporated by reference herein. In one embodiment, a format conversion block approximately doubles the number of bits in the exponent and fraction fields of the LL8 input format. In short, the technique implements this approach largely with logic gates, an y-bit adder (e.g., 8), and one or more multiplexers. (See, for example, FIG. 4B (which illustrates the conversion or modification of the filter weights/coefficients in more detail relative to the block diagram of FIG. 4A)—notably, the three result fields may also need a special value, operand or character substituted using the row of multiplexers). The circuit block diagram of FIG. 4B provides additional details of the filter weight/coefficient conversion or modification embodiment of FIG. 4A; however, the filter weight/coefficient conversion or modification technique implemented in FIG. 4B is the same as that of the block diagram of FIG. 4A.

Notably, in another embodiment, the filter weights or coefficients are stored in memory (L2) in a floating point or fixed point data format. Here, the filter weights or coefficients are read from memory (L2) to format conversion circuitry and converted or transformed from a floating point data format (e.g., FP8) or fixed point data format (e.g., INT8 or BSF8) to a logarithmic data format (e.g., LL16 data format in the illustrative embodiment). The circuitry/techniques illustrated in FIGS. 2 and 3, as described herein, may be employed in a manner similar to convert or transform the filter weights from a floating point or fixed point data format to a logarithmic data format (e.g., LL16 data format).

With reference to FIGS. 1A, 1B and 1E-1G the logarithmic addition circuitry sums the input data/values and the filter weights/coefficients—both of which are in a logarithmic data format. An exemplary embodiment of the logarithmic addition circuitry is illustrated in FIG. 5A wherein the circuitry of this illustrative embodiment employs LL16 (in this illustrative embodiment) for the two input operands (i.e., input data/values and filter weights/coefficients) and the outputs a sum ("D result") having a sign field, exponent field and fraction field. The sign fields, in this embodiment, are XOR-ed and the exponent fields are added (and incremented if rounding results in a fraction overflow. Here, the two fraction fields (in logarithmic form) are added together (via 2's complement) with an adder (7 bit fixed point adder in the illustrative embodiment).

Notably, FIG. 5B illustrates a more detailed exemplary circuit block diagram of the logarithmic addition circuitry illustrated in FIG. 5A. Additional details of certain exemplary logic blocks illustrated in FIG. 5B (see "Logic 1", "Logic 2" and "Logic 3") are provided in FIG. 5C.

With continued reference to FIG. 5B, in other embodiment, the operation performed by the logarithmic addition circuitry (fraction field GA+fraction field GB; and exponent field EA+exponent field EB) may be replaced or accompanied by circuitry implementing other functions such as reciprocation, square root, power functions. Here, after the operands are in logarithmic data format other functions may be quite readily implemented (e.g., division A operand divided by B operation may be implemented by performing by subtraction (fraction field GA−fraction field GB), together with subtraction of the exponent field EA minus exponent field EB instead of addition EA+EB as is the case with multiplication).

After logarithmic addition, the processed data/values may be converted or transformed to another/different data format (e.g., from a logarithmic data format to a floating point format or fixed point format—for example, back to the data format of the input data—however, the bit length of the value in the fraction field may be the different) for additional and/or subsequent processing. For example, the processed data, in the logarithmic data format, may be converted or transformed to a floating point data format (i.e., a data format that is the same as the data format of the input data). The format conversion circuitry, disposed on the output of the logarithmic addition circuitry (see, e.g., FIGS. 1A, 1B and 1E-1G), may implement the inverse of the circuitry employed to convert the input data/values from a floating point data format to a logarithmic data format. Here, partially processed image data, in a data format different from logarithmic data format, may be provided to accumulator circuitry to implement accumulate operations (see FIGS. 1A, 1B and 1E-1G), for example, of image data processing in connection with inferencing operations.

Exemplary embodiments of format conversion circuitry, disposed at the output of the logarithmic addition circuitry, which convert the data format of the sum from logarithmic data format to floating point data format are illustrated in FIGS. 6A and 6B (LL16 to FP16). The conversion circuitry of this exemplary embodiment may implement the conversion of the fraction field using, for example, approximately 30 logic gates, the x-bit adder and x-bit multiplexer (e.g., x=7). (See, FIG. 6C for a format conversion circuitry/technique having moderate precision).

The embodiment of the data format conversion circuitry illustrated in FIG. 6C is a detailed implementation of the format conversion block diagram illustrated in FIG. 6B. Moreover, FIG. 6D illustrates yet another detailed embodiment of the data conversion format circuitry computing $y=2^x$ with moderate precision. FIG. 6E illustrates logarithmic data format to floating point format conversion circuitry providing a high level of precision of the data conversion (here, computing $y=2^x$)—for example, 32 or 64 bit precision). As mentioned above, the present inventions may employ any data format conversion circuitry or method, now known or later developed, to convert, modify, expand/contract and/or adjust the data format of data/values (i) from a first data format into logarithmic data format and/or (ii) from a logarithmic data format to a first data format or a second data format—all of which are intended to fall within the scope of the present inventions. Notably, the conversion format circuitry/methods of the present inventions convert or modify the data formats of the data (e.g., input data/values (in certain embodiments), filter weights/coefficients (in certain embodiments), sum/result data output of the logarithmic addition circuitry.

With reference to FIG. 7 (which illustrates examples of several floating point formats and "equivalent" logarithmic data formats), three logarithmic data formats utilize a signed-magnitude numeric format for the sign field S and fraction field G. The fraction field G has a most-significant weight of 0.5, and no hidden (implicit) bit, so it includes unnormalized values. The exponent field is a two's complement numeric format to which a bias of 127 is added. The minimum and maximum exponent values are reserved for special operands or characters (NAN, INF, DNRM, ZERO).

In one embodiment, the memory allocation corresponding to the logarithmic data formats (e.g., LL16) includes the special operands or characters. For example, with reference to FIG. 8 (which illustrates an exemplary number space for the LL16 data format), the minimum and maximum exponent E[7:0] are reserved for special operands (NAN, INF, ZRO). A NAN value is generated when an undefined operation takes place (0*∞ or ∞-∞). The ±INF values are the saturation value for exponent overflow. The ±ZRO values are the saturation value for exponent underflow. The range (EXP[7:0]=8'b00000000) shows the binade corresponding to DNRM values for a floating point data format (FP16)—it "behaves" like the other binades, except that G[1:7] =7'b0000000 is reserved for ZRO.

FIGS. 9A-9C illustrates an exemplary encoding technique for logarithmic data format (LL8y) having a 1 bit sign field (S), a 3 bit exponent field (E), and a four bit fraction field (F), as implemented in connection with certain data (e.g., filter weights/coefficients) of certain embodiments of the present inventions—for example, in relation to a look-up table. Notably, similar or corresponding look-up tables may be employed, provided and/or generated in relation to other logarithmic data formats (e.g., LL8x and LL8z)).

With continued reference to FIGS. 9A-9C, the field sizes for the binades with maximum precision. The other binades increase the number of bits in the exponent field (E) and will reduce the number of bits of the fraction field (G). This will reduce the precision of these other binades. The total number of bits of the GFP8y value (8 bits) will remain constant across the range.

The LL8y binades with maximum precision are in the two center columns of FIG. 9A (the left most columns in FIG. 9B and the right most columns in FIG. 9C), the 3 bit exponent field (E) is equal to {010, 011, 100, and 101}. The value of these LL8y encodings is $(-1)^S*2^{(E-Ek)}*(G/16)$, where S is the sign bit, E is the three bit field, and G is the four bit fraction field. Note that there is a hidden/implicit bit with a value of one that is always added to the fraction field.

The exponent bias value Ek is equal to four in this range. The four exponent field values {010, 011, 100, and 101} will create scaling values of $\{2^{(-2)}, 2(-1), 2^{(0)}, 2^{(+1)}\}$. This exponent bias value is configurable. Changing it will change the center-point of the LL8y range of binade values. The exponent bias values for all the binades must be changed together so that no gap regions or overlap regions are introduced between the binade ranges.

The column on the upper right of FIG. 9A illustrates the next two larger binades (with lower precisions). The 4 bit exponent field (E) is equal to {1100, 1101}. The value of these LL8y encodings is $(-1)^S*2^{(E-Ek)}*(G/8)$, where S is the sign bit, E is the four bit field, and G is the three bit fraction field. The exponent bias value Ek is equal to 10 in this range.

The next two larger binades (with lower precisions) have a 5 bit exponent field (E) equal to {11100, 11101}. The value of these LL8y encodings is $(-1)^S*2^{(E-Ek)}*(G/4)$, where S is the sign bit, E is the five bit field, and G is the two bit fraction field. The exponent bias value Ek is equal to 24 in this range.

The next two larger binades (with lower precisions) have a 6 bit exponent field (E) equal to {111100, 111101}. The value of these LL8y encodings is $(-1)^S*2^{(E-Ek)}*(G/2)$, where S is the sign bit, E is the six bit field, and F is the one bit fraction field. The exponent bias value Ek is equal to 54 in this range.

The next three larger binades (with lower precisions) have a seven bit exponent field (E) is equal to {1111100, 1111101, 1111110}. The value of these LL8y encodings is $(-1)^S*2^{(E-Ek)}*(1)$, where S is the sign bit, E is the seven bit field, and G is the zero bit fraction field. The exponent bias value Ek is equal to 116 in this range.

The column on the lower left of FIG. 9A illustrates the next two smaller binades (with lower precisions). The 4 bit exponent field (E) is equal to {0010, 0011}. The value of these LL8y encodings is $(-1)^S*2^{(E-Ek)}*(G/8)$, where S is the sign bit, E is the four bit field, and G is the three bit fraction field. The exponent bias value Ek is equal to 6 in this range.

The next two smaller binades (with lower precisions) have a 5 bit exponent field (E) equal to {00010,00011}. The value of these LL8y encodings is $(-1)^S*2^{(E-Ek)}*(G/4)$, where S is the sign bit, E is the five bit field, and G is the two bit fraction field. The exponent bias value Ek is equal to 8 in this range.

The next two smaller binades (with lower precisions) have a 6 bit exponent field (E) equal to {000010, 000011}. The value of these LL8y encodings is $(-1)^S*2^{(E-Ek)}*(G/2)$, where S is the sign bit, E is the six bit field, and G is the one bit fraction field. Here, the exponent bias value Ek is equal to 10 in this range.

The next three smaller binades (with lower precisions) have a seven bit exponent field (E) is equal to {0000001, 0000010,0000011}. The value of these LL8y encodings is $(-1)^S*2^{(E-Ek)}*(1)$, where S is the sign bit, E is the seven bit field, and G is the zero bit fraction field. The exponent bias value Ek is equal to 12 in this range. This completes the summary of the 252 encodings used for numeric values.

There are four additional encodings (out of a total of 256) that are allocated to special values. First, the value 8'b00000000 represents zero (ZRO). This is the saturation value for positive or negative results that have exponent underflow (EUNFL). The value 8'b10000000 represents "not-a-number" (NAN). This is the result for an undefined operation. The value 8'b01111111 represents positive infinity (+INF). This is the saturation value for positive results that have exponent overflow (EOVFL). The value 8'b11111111 represents negative infinity (-INF). This is the saturation value for negative results that have exponent overflow (EOVFL).

FIG. 10A illustrates another exemplary encoding technique for logarithmic data format (LL8y) having a 1 bit sign field (S), a 3 bit exponent field (E), and a four bit fraction field (F), as implemented in connection with certain data (e.g., filter weights/coefficients) of certain embodiments of the present inventions—for example, in relation to a look-up table. In this regard, FIG. 10A illustrates an example of an alternative floating point format (LL8y) wherein the range and precision may be configured dynamically, according to one embodiment of the present inventions; this embodiment may provide a better fit to the set of data values that it is representing.

With reference to FIG. 10A (and FIGS. 10B-10E for the particular formats), the "allowable" number space, below the horizontal line depicting the logarithmic data format LL16 is graphically represented in relation to the logarithmic data formats of LL8x, LL8y and LL8z. (See also, FIG. 10B). The range and precision of the LL8y format is illustrated in FIGS. 10A and 10D. In the center four binades (-2 to +2) it has the same precision (4 bits) as the FP8 format discussed earlier. Unlike the FP8, the precision of the LL8y format falls off symmetrically.

There are zero bits of precision (a single value) in the three binades from -11 to -8 and in the two binades from +8 to +10.

This symmetrical falloff of LL8y is similar to the falloff seen in the distribution of data weight values for image filtering applications. This means that most of the data values for a data set will fall in the binades with the most bits of precision.

With reference to FIGS. 10A and 10B, the INT8 format, in contrast, has a falloff with the binades in the negative direction but a hard edge in the width of the binades in the positive direction. Thus, smaller data values (in the negative direction) will see a "soft" saturation if they get too close to the edge of the range.

This may present difficulty with employing integer formats (e.g., INT8) with respect to scaling of the data set. For example, if the distribution of data/values is located or moved too "close" to the hard edge of the width of the binades in the positive direction to take advantage more bits of precision, some of the larger values of the data will suffer "hard" saturation. Notably, the LL8y format provides "soft" saturation at both edges of the range.

In one embodiment, the conversion circuitry may be dynamically configurable between format (e.g., LL8x, LL8y and LL8z), for example, in situ. In this regard, the circuitry (hardware logic) that converts data values between LL8y format and LL16 format (or any larger LL format) may be dynamically configured to support a range of LL formats. This allows range and precision to be adjusted to match the distribution characteristics of the data set. Two other formats (LL8x and LL8z) are also described herein and may be used to describe dynamic configurability of the conversion circuitry.

The LL8x format is illustrated in FIGS. 10A and 10C. In the center two binades (−1 to +1) it has one more bit of precision (5 bits) than the LL8y format discussed earlier. Like LL8y, the precision of the LL8x format falls off symmetrically. There are zero bits of precision (a single value) in the binade from −5 to −6 and at the binade at +5.

The LL8z format is illustrated in FIGS. 10A and 10E. In the center eight binades (−4 to +4) it has one less bit of precision (3 bits) than the LL8y format discussed earlier. Like LL8y, the precision of the LL8x format falls off symmetrically. There are zero bits of precision (a single value) in the binades from −19 to −12 and in the binades from +12 to +18.

A key benefit of the set of three logarithmic data formats (LL8x, LL8y, LL8z) is that they provide multiple format alternatives for that offer different ranges and/or precisions. This reduces rounding error and saturation error when the data values are used.

If the exponent bias values (Ek) are adjusted for a particular format, the precision distribution can be shifted to the left or right to match the data set distribution (although this is not illustrated in FIG. 10A, in one embodiment, it may be incorporated, implemented or employed).

Also, two of the formats may be combined, so that the precision distribution is asymmetric about the center point (although this is not illustrated in FIG. 10A, in one embodiment, it may be incorporated, implemented or employed).

The encoding methods used by these three logarithmic data formats, in one embodiment, is extended to floating point data formats with more bits, for example a (LL16x/LL16Py/LLP16z). Notably, although this is not illustrated in FIG. 10A, in one embodiment, it may be incorporated, implemented or employed.

In certain situations, the output of the logarithmic addition circuitry may be interpreted to address the special operands or characters. With reference to FIG. 11, details for SD/ED/GD fields for interaction cases are set forth in three 4×4 tables wherein each table includes four cases {ZRO, NRM, INF, NAN} for each operand, with the A operand along the horizontal axis and the B operand along the vertical axis. The three tables include, from left to right, the sign SD, the exponent ED[7:0], and the fraction GD[0:7] of the result for these different A and B operand values.

The default sign of the result is Sw=Sa XOR Sb. This will not be the case if either operand is a NAN; in these cases, the sign of the result is the sign of the NAN operand. In the case in which both operands are a NAN, the sign of the result is 1'b0.

When the A and B operands are NRM values, the default exponent of the result is (Ea[7:0]+Eb[7:0]-8'h7F+INC); this is the sum of the operand exponents, with the exponent offset subtracted, and with INC=1 added if the product fraction≥2.0. This default case occurs when 8'h01≤(Ea[7:0]+Eb[7:0]-8'h7F+Mov)≤8'hFE, shown in the center box labeled "N" for NRM.

The default fraction/mantissa is the sum Gq[0:7], rounded to the appropriate number of bits for the output format. If 8'h00≥(Ea[7:0]+Eb[7:0]-8'h7F+Mov) then EUNFL has occurred and the result is ZERO in which the exponent is 8'h00 and the fraction is 23'h000000. If Ea[7:0]+Eb[7:0]-8'h7F+Mov)≥8'hFF then EOVFL has occurred and the result is INF in which the exponent is 8'hFF and the fraction is 23'h000000.

If both the A and B operands are ZERO, or one is ZERO and one is NRM, the result ZERO in which the exponent is 8'h00 and the fraction is 15'h0000. If both the A and B operands are INF, or one is INF and one is NRM, the result is INF in which the exponent is 8'hFF and the fraction is 7'h00. If one of the A and B operands is ZERO and one is INF, the result is a NAN in which the exponent is 8'hFF and the fraction is 7h7F. If one of the A and B operands is NAN, and the other is {ZRO,NRM,INF}, the result is NAN in which the exponent is 8'hFF and the fraction is the same as the NAN operand. If both the A and B operands are NAN, the result is NAN in which the exponent is 8'hFF and the fraction is 7'h7F.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, in one embodiment of the present inventions, the one or more integrated circuits include circuitry to implement logarithmic addition and accumulate (LAC) operations as well as multiply and accumulate (MAC) operations. For example, with reference to FIGS. 12A and 12B, in one embodiment, circuitry for processing/operations in floating point data format and logarithmic data format are included or implemented in a processing circuit/component. A mode or modal control signal "MODE" is output by mode control circuitry to select which format option is employed in the processing or filtering operation/application. Here, the logarithmic addition-accumulator circuitry and data path, when enabled, performs logarithmic addition and accumulate operations (e.g., as discussed herein) and the multiplier-accumulator circuitry and data path, when enabled, performs multiply and accumulate operations. mode select circuitry to control (i.e., enable and/or disable) the operability of the logarithmic addition-accumulator circuitry and the multiplier-accumulator circuitry to select the circuitry employed to processes the image data, for example, in connection with inferencing operations. In this regard, the mode select circuitry controls or determines a data path of the processing to include logarithmic addition-accumulator circuitry or the multiplier-accumulator circuitry.

In one embodiment, mode select circuitry may be one-time programmable; in another embodiment, the mode select circuitry is a more than one-time programmable (i.e., multiple times). The mode select circuitry may be programmed, for example, in situ (i.e., during operation of the integrated circuit), at manufacture, and/or at or during power-up, start-up, initialization, re-initialization, configuration, re-configuration or the like. For example, the mode select circuitry may receive mode select signals from internal or external circuitry (i.e., external to the one or more integrated circuits—for example, a host computer/processor) including one or more data storage circuits (e.g., one or more memory cells, register, flip-flop, latch, block/array of memory), one or more input pins/conductors, a look-up table LUT (of any kind or), a processor or controller and/or discrete control logic. The mode select circuitry, in response thereto, may employ such signal(s) to enable or disable selected processing circuitry (as the case may be) and thereby implement (e.g., in situ and/or at or during power-up, start-up, initialization, re-initialization, configuration, re-configuration or the like) one of the modes of processing (i.e., logarithmic addition and accumulate operations or multiply and accumulate operations).

In addition, the present inventions are not limited to (i) particular logarithmic, fixed point and/or floating point format(s), operations (e.g., addition, subtraction, etc.), block/data width, data path width, bandwidths, values, processes and/or algorithms illustrated, nor (ii) the exemplary logical or physical overview configurations, exemplary module/circuitry configuration and/or exemplary Verilog code. Indeed, the present inventions may employ other mathematical operations (in addition to or in lieu of logarithmic addition) in that logarithmic "multiply" block is extended to perform divide (subtract E/G of two operands) and/or logarithmic "multiply" block is extended to perform square root (shift E/G of operand by one bit right).

Notably, details of, among other things, the circuitry, structures, architectures, function and operation of the multiplier-accumulator execution pipelines are described and/or illustrated in: (1) U.S. Non-Provisional patent application Ser. No. 16/545,345, (2) U.S. Non-Provisional patent application Ser. No. 16/816,164, (3) U.S. Provisional Patent Application No. 62/831,413; (4) U.S. Non-Provisional patent application Ser. No. 16/900,319, (5) U.S. Provisional Patent Application No. 62/865,113, (6) U.S. Non-Provisional patent application Ser. No. 17/019,212, (7) U.S. Provisional Patent Application No. 62/900,044, (8) U.S. Non-Provisional patent application Ser. No. 17/031,631, and (9) U.S. Provisional Patent Application No. 62/909,293. These nine (9) patent applications are incorporated herein by reference in their entirety. Indeed, as mentioned above, the present inventions may employ a plurality of execution or processing pipelines (implementing LAC circuitry in lieu of MAC circuitry) to concurrently process data to increase throughput of the data processing—for example, as described and/or illustrated in U.S. Non-Provisional application Ser. No. 16/816,164.

Moreover, in addition thereto, or in lieu thereof, the present inventions may employ the circuitry, function and operation of enhancing the dynamic range of the filter weights or coefficients as described and/or illustrated in U.S. patent application Ser. No. 17/074,670 and U.S. Provisional Patent Application No. 62/930,601. That is, the present inventions may use the circuitry and techniques to enhance the dynamic range of the filter weights or coefficients of the '670 and '601 applications. The '670 and '601 applications are incorporated by reference in its entirety.

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive. For example, although the data/values of the input data/values, filter weights, and output data/values conversion circuitry, in the illustrative exemplary embodiments, describes a certain bit width, such bit width(s) is/are exemplary. For the sake of brevity, those other precisions will not be illustrated separately but are quite clear to one skilled in the art based on, for example, this application. Thus, the present inventions are not limited to (i) particular fixed point data format(s) (e.g., integer format (INTxx) and block-scaled fraction format (e.g., BSFxx), block/data width (FPxx, LLxx, etc.), data path width, bandwidths, values, processes and/or algorithms illustrated, nor (ii) the exemplary logical or physical overview configurations of the particular circuitry and/or overall pipeline, and/or exemplary module/circuitry configuration, and/or overall pipeline. Indeed, the present inventions are not limited to (i) particular floating point format(s), particular fixed point format(s), operations (e.g., addition, subtraction, etc.), block/data width or length, data path width, bandwidths, values, processes and/or algorithms illustrated, nor (ii) the exemplary logical or physical overview configurations, and/or exemplary module/circuitry configuration.

Moreover, although the data format conversion circuitry of certain exemplary embodiments are determines/identifies the largest exponents of the associated filter weights of the group of filter weights, the data format conversion circuitry may compare the exponents of the associated filter weights to determine the smallest exponent. In this alternative embodiment, the shifting of the fraction field of the filter weights may be modified (e.g., shifted left for filter weights having larger exponents) to accommodate the common exponent field being the smallest exponent of the associated filter weights of the group of filter weights.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

The terms "comprises," "comprising," "includes," "including," "have," and "having" or any other variation thereof, are intended to cover a non-exclusive inclusion, such that a process, method, circuit, article, or apparatus that comprises a list of parts or elements does not include only those parts or elements but may include other parts or elements not expressly listed or inherent to such process, method, article, or apparatus. Further, use of the terms "connect", "connected", "connecting" or "connection" herein should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "a" and "an" herein do not denote a limitation of quantity, but rather denote the presence of at least one of the referenced item. Further, the terms "first," "second," and the like, herein do not denote any order, quantity, or importance, but rather are used to distinguish one element/circuit/feature from another.

In addition, the term "integrated circuit" means, among other things, any integrated circuit including, for example, a generic or non-specific integrated circuit, processor, controller, state machine, gate array, SoC, PGA and/or FPGA. The term "integrated circuit" also means any integrated circuit (e.g., processor, controller, state machine and SoC)—including an embedded processor, controller, state machine, PGA and/or FPGA.

Further, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

Notably, the limitations of the claims are not written in means-plus-function format or step-plus-function format. It is applicant's intention that none of the limitations be interpreted pursuant to 35 USC § 112, ¶6 or § 112(f), unless such claim limitations expressly use the phrase "means for" or "step for" followed by a statement of function and is void of any specific structure.

What is claimed is:

1. An integrated circuit comprising:
a plurality of logarithmic addition-accumulator circuits to, in operation, perform iterative logarithmic addition and accumulate operations, wherein each logarithmic addition-accumulator circuit includes:
a logarithmic addition circuit to add a first input data, having a logarithmic data format, and a filter weight data, having the logarithmic data format, and, based thereon, output first sum data, having the logarithmic data format,
first data format conversion circuitry, coupled to the logarithmic addition circuit of the associated logarithmic addition-accumulator circuit, to convert the logarithmic data format of the first sum data, which is received from the logarithmic addition circuit of the associated logarithmic addition-accumulator circuit, to a floating point data format or a fixed point data format, and to output the first sum data, having the floating point data format or a fixed point data format,
an accumulator, coupled to the first data format conversion circuitry of the associated logarithmic addition-accumulator circuit, to add a second input data and the first sum data, output by the first data format conversion circuitry of the associated logarithmic addition-accumulator circuit, to generate first accumulation data, and a data output circuit having a first input to receive the first accumulation data from the accumulator following a final one of the iterative logarithmic and accumulate operations, the data output circuit additionally having a second input and an output; and wherein the plurality of logarithmic addition-accumulator circuits are connected in series via their respective data output circuits, with the output of the data output circuit within each of the logarithmic addition-accumulator circuits coupled to the second input of the data output circuit within a subsequent one of the logarithmic additional-accumulator circuits to form a shift register via which the first accumulation data generated within each of the accumulators of the logarithmic addition-accumulator circuits may be sequentially shifted out.

2. The integrated circuit of claim 1 wherein the accumulator within each of the logarithmic addition-accumulator circuits comprises:

an addition circuit to generate first accumulation data by adding the second input data and the first sum data; and a data register, coupled to an output of the addition circuit to: (i) temporarily store the first accumulation data generated in a first execution cycle and (ii) output the first accumulation data of the first execution cycle to the accumulator of a subsequent logarithmic addition-accumulator circuit of the series connected plurality of logarithmic addition-accumulator circuits in a second execution cycle, wherein the second execution cycle is subsequent to the first execution cycle.

3. The integrated circuit of claim 1 wherein:

the first data format conversion circuitry is configurable to convert the data format of the first sum data to the floating point data format having a first precision, the second input data includes the floating point data format having a second precision, and the accumulator of each logarithmic addition-accumulator circuit of the plurality of logarithmic addition-accumulator circuits adds the second input data, having the floating point data format including the second precision, and the first sum data, having the floating point data format including the first precision, to generate the first accumulation data.

4. The integrated circuit of claim 1 wherein the data output circuit comprises:

a multiplexor having first and second inputs that constitute the first and second inputs of the data output circuit, and an output; and an output data register having an input coupled to the output of the multiplexer, and an output that constitutes the output of the data output circuit.

5. The integrated circuit of claim 1 further including:

second data format conversion circuitry, coupled to an input of each logarithmic addition-accumulator circuit of the plurality of logarithmic addition-accumulator circuits, to convert the first input data to the logarithmic data format.

6. The integrated circuit of claim 5 wherein:

second data format conversion circuitry includes a lookup table to correlate initial first input data, having a first data format, to the first input data, having the logarithmic data format and thereby convert the initial first input data to the first input data, having the logarithmic data format.

7. The integrated circuit of claim 5 wherein:

second data format conversion circuitry includes a logic circuitry to convert initial input data, having a first data format, to the first input data, having the logarithmic data format.

8. The integrated circuit of claim 1 further including:

third data format conversion circuitry, coupled to a first memory, to receive the filter weight data from the first memory and convert the filter weight data to the logarithmic data format; and a second memory, coupled the third data format conversion circuitry, to receive and store the filter weight data, having the logarithmic data format, and responsively output the filter weight data to one or more associated logarithmic addition-accumulator circuits of the plurality of logarithmic addition-accumulator circuits.

9. The integrated circuit of claim 1 further including:

second data format conversion circuitry, coupled between memory and an input of each logarithmic addition-accumulator circuit of the plurality of logarithmic addition-accumulator circuits, to convert a data format of the first input data to a logarithmic data format and input the first input data, having the logarithmic data format, to the logarithmic addition circuit of an associated logarithmic addition-accumulator circuit.

10. The integrated circuit of claim 1 further including:

second data format conversion circuitry, coupled between a first memory and an input of each logarithmic addition-accumulator circuit of the plurality of logarithmic addition-accumulator circuits, to convert a data format of the first input data to the logarithmic data format and input the first input data, having the logarithmic data format, to the logarithmic addition circuit of an associated logarithmic addition-accumulator circuit; and third data format conversion circuitry, coupled between a second memory and an input of each logarithmic addition-accumulator circuit of the plurality of logarithmic addition-accumulator circuits, to convert a data format of the filter weight data to the logarithmic data format.

11. The integrated circuit of claim 1 wherein each of the logarithmic addition-accumulator circuits further includes a first memory to store the filter weight data.

12. The integrated circuit of claim 11 wherein each of the plurality of logarithmic addition-accumulator circuits executes the iterative logarithmic addition and accumulate operations in a first set of execution cycles to generate the first accumulation data and thereafter executes additional iterative logarithmic addition and accumulate operations in a second set of execution cycles to generate second accumulation data.

13. The integrated circuit of claim 12 wherein the shift register sequentially shifts out the first accumulation data, generated within each of the accumulators of the logarithmic addition-accumulator circuits, during the second set of execution cycles.

14. The integrated circuit of claim 1 wherein:

the first input data having the logarithmic data format represents an exponent by which a predetermined base number is raised to yield corresponding first non-logarithmic input data;

the logarithmic filter weight data represents an exponent by which the predetermined base number is raised to yield corresponding non-logarithmic filter weight data; and the first sum data having the floating point data format or the fixed point data format corresponds to a multiplication product of the first non-logarithmic input data and the non-logarithmic filter weight data.

15. The integrated circuit of claim 1 wherein the accumulator within each of the logarithmic addition-accumulator circuits comprises:

an addition circuit to generate first accumulation data by adding the second input data and the first sum data;

a multiplexer circuit having a first input coupled to an output of the addition circuit, a second input coupled to an output of the data output circuit, and an output; and a data register coupled to the output of the multiplexer circuit to iteratively store the first accumulation data as the first accumulation data is updated in each of the iterative logarithmic addition and accumulate operations.

16. A method of performing a plurality of logarithmic addition and accumulate operations, via a logarithmic addition-accumulator circuit of an execution pipeline, wherein the logarithmic addition-accumulator circuit includes a logarithmic addition circuit and an accumulator, the method comprising:

converting, via first format conversion circuitry, a plurality of first input data, having a first data format, to a plurality of first input data having the logarithmic data format, wherein the first data format is different from the logarithmic data format;

logarithmically adding, via the logarithmic addition circuit, each first input data, having the logarithmic data format, to an associated filter weight, having the logarithmic data format, to generate a first sum data, having the logarithmic data format;

converting, via second format conversion circuitry, each first sum data, having the logarithmic data format, to first sum data, having a floating point data format;

adding, via the accumulator, each first sum data, having the floating point data format, to a second input data, having the floating point data format, to generate first accumulation data, having the floating point data format;

after performing a predetermined number of the logarithmic addition and accumulate operations, transferring the first accumulation data to a data output circuit, the data output circuit having a data register that, together with constituent data registers of other data output circuits within other logarithmic addition-accumulator circuits of the execution pipeline, forms a shift register via which the first accumulation data and accumulation data generated within the other logarithmic addition-accumulator circuits is sequentially shifted out.

17. The method of claim 16 wherein:
the first data format is a floating point data format having a first precision; and
the floating point data format of the first accumulation data includes a second precision.

18. The method of claim 16 wherein:
the floating point data format of the first sum data includes a precision that is different from a precision of the floating point data format of the first accumulation data.

19. The method of claim 16 further including:
converting, via third format conversion circuitry, each filter weight of the plurality of filter weights from the logarithmic data format, having a first precision, to the logarithmic data format, having a second precision, prior to logarithmically adding, via the logarithmic addition circuit, each first input data to an associated filter weight.

20. The method of claim 16 further including:
converting, via third format conversion circuitry, each filter weight of the plurality of filter weights to the logarithmic data format prior to logarithmically adding, via the logarithmic addition circuit, each first input data to an associated filter weight.

21. The method of claim 20 wherein:
the first data format is a floating point data format.

* * * * *